United States Patent
Sasai et al.

(10) Patent No.: US 8,687,904 B2
(45) Date of Patent: Apr. 1, 2014

(54) IMAGE CODING METHOD, IMAGE CODING APPARATUS, IMAGE DECODING METHOD, IMAGE DECODING APPARATUS, AND IMAGE CODING AND DECODING APPARATUS WHICH INCLUDE ARITHMETIC CODING OR ARITHMETIC DECODING

(75) Inventors: Hisao Sasai, Osaka (JP); Takahiro Nishi, Nara (JP); Youji Shibahara, Osaka (JP); Toshiyasu Sugio, Osaka (JP)

(73) Assignee: Panasonic Corporation, Osaka (JP)

( * ) Notice: Subject to any disclaimer, the term of this patent is extended or adjusted under 35 U.S.C. 154(b) by 163 days.

(21) Appl. No.: 13/348,075

(22) Filed: Jan. 11, 2012

(65) Prior Publication Data

US 2012/0183235 A1  Jul. 19, 2012

Related U.S. Application Data

(60) Provisional application No. 61/432,724, filed on Jan. 14, 2011.

(51) Int. Cl.
*G06K 9/36* (2006.01)
*G06K 9/46* (2006.01)
*H03M 7/40* (2006.01)
*H04N 7/26* (2006.01)

(52) U.S. Cl.
CPC ....... *H03M 7/4018* (2013.01); *H04N 19/00951* (2013.01)
USPC .......................................... 382/247; 382/232

(58) Field of Classification Search
USPC ................. 382/232–253; 375/240.01–240.29
See application file for complete search history.

(56) References Cited

U.S. PATENT DOCUMENTS

| 6,795,584 B2 | 9/2004 | Karczewicz et al. |
| 7,305,035 B2 | 12/2007 | Kondo et al. |
| 7,742,528 B2 | 6/2010 | Kondo et al. |

(Continued)

FOREIGN PATENT DOCUMENTS

| JP | 2004-7381 | 1/2004 |
| JP | 2004-64725 | 2/2004 |

(Continued)

OTHER PUBLICATIONS

Marpe, D.; Schwarz, H.; Wiegand, T. "Context-based adaptive binary arithmetic coding in the H.264/AVC video compression standard", IEEE Transactions on Circuits and Systems for Video Technology, Jul. 2003, vol. 13, Issue: 7 pp. 620-636.*

(Continued)

*Primary Examiner* — Li Liu
(74) *Attorney, Agent, or Firm* — Wenderoth, Lind & Ponack, L.L.P.

(57) ABSTRACT

An image coding method includes: frequency-transforming image data to generate a unit of processing in a frequency domain; binarizing a coefficient included in the unit of processing, to generate a binary signal; determining, as a context for a binary signal, one or more contexts common to a plurality of the coefficients included in a segment which includes the binarized coefficient, the segment being one of a plurality of segments obtained by dividing the unit of processing; performing binary arithmetic coding on the binary signal according to probability information corresponding to the determined context; and updating, based on the binary signal, the probability information corresponding to the determined context.

9 Claims, 33 Drawing Sheets

(56) References Cited

U.S. PATENT DOCUMENTS

| | | | |
|---|---|---|---|
| 7,970,059 | B2 | 6/2011 | Kondo et al. |
| 8,005,146 | B2 | 8/2011 | Kondo et al. |
| 8,098,736 | B2 | 1/2012 | Kondo et al. |
| 2004/0066974 | A1 | 4/2004 | Karczewicz et al. |
| 2004/0184544 | A1 | 9/2004 | Kondo et al. |
| 2004/0223657 | A1 | 11/2004 | Sugimoto et al. |
| 2004/0240745 | A1 | 12/2004 | Sugimoto et al. |
| 2005/0099522 | A1 | 5/2005 | Kondo et al. |
| 2005/0123207 | A1* | 6/2005 | Marpe et al. ............... 382/239 |
| 2005/0253740 | A1* | 11/2005 | Marpe et al. ............... 341/50 |
| 2008/0056374 | A1 | 3/2008 | Kondo et al. |
| 2008/0056375 | A1 | 3/2008 | Kondo et al. |
| 2008/0063083 | A1 | 3/2008 | Kondo et al. |
| 2008/0111722 | A1 | 5/2008 | Reznik |
| 2008/0219578 | A1* | 9/2008 | Lee ............................. 382/247 |
| 2008/0260037 | A1 | 10/2008 | Kondo et al. |
| 2008/0260038 | A1 | 10/2008 | Kondo et al. |
| 2008/0260039 | A1 | 10/2008 | Kondo et al. |
| 2009/0161974 | A1 | 6/2009 | Bjontegaard et al. |
| 2009/0175332 | A1* | 7/2009 | Karczewicz et al. .... 375/240.03 |
| 2010/0150464 | A1 | 6/2010 | Kondo et al. |
| 2010/0158485 | A1 | 6/2010 | Kondo et al. |
| 2011/0001643 | A1 | 1/2011 | Sze et al. |
| 2011/0243245 | A1 | 10/2011 | Kondo et al. |
| 2012/0082231 | A1* | 4/2012 | Rojals et al. ............ 375/240.18 |
| 2012/0082232 | A1* | 4/2012 | Sole Rojals et al. ..... 375/240.18 |
| 2012/0082235 | A1* | 4/2012 | Lou et al. ................ 375/240.18 |
| 2012/0140814 | A1* | 6/2012 | Sole Rojals et al. ..... 375/240.02 |
| 2012/0163448 | A1* | 6/2012 | Zheng et al. ............ 375/240.02 |
| 2012/0163456 | A1* | 6/2012 | Coban et al. ............ 375/240.13 |
| 2013/0027230 | A1* | 1/2013 | Marpe et al. .................. 341/107 |

FOREIGN PATENT DOCUMENTS

| | | |
|---|---|---|
| JP | 2004-266567 | 9/2004 |
| JP | 2006-19814 | 1/2006 |
| JP | 2006-501740 | 1/2006 |
| WO | 2004/032032 | 4/2004 |
| WO | 2009/082239 | 7/2009 |
| WO | 2011/052234 | 5/2011 |

OTHER PUBLICATIONS

Tung Nguyen; Schwarz, H.; Kirchhoffer, H.; Marpe, D.; Wiegand, T. "Improved context modeling for coding quantized transform coefficients in video compression" Picture Coding Symposium (PCS), 2010, pp. 378-381.*

Marpe, D.; Wiegand, T.; Sullivan, G.J. "The H.264/MPEG4 advanced video coding standard and its applications", Communications Magazine, IEEE, Aug. 2006, vol. 44, Issue: 8 pp. 134-143.*

"ISO/IEC 14496-10 MPEG-4 Part 10: *Advanced Video Coding*", Oct. 1, 2004.

Thomas Wiegand et al., "*Overview of the H.264/AVC Video Coding Standard*", IEEE Transactions on Circuits and Systems for Video Technology, vol. 13, No. 7, Jul. 2003, pp. 1-19.

Jungong Han et al., "*Variable Block-Size Transform and Entropy Coding at the Enhancement Layer of FGS*", 2004 International Conference on Image Processing (ICIP), vol. 1, Oct. 2004, pp. 481-484.

Sakae Okubo et al., "*Kaitei San-pan H.264/AVC Kyokasho* (Third Edition, H.264/AVC Textbook)", Impress R&D, Jan. 1, 2009, pp. 153-157, with its English Translation.

Thomas Wiegand et al., "*Draft ITU-T Recommendation and Final Draft International Standard of Joint Video Specification* (ITU-T Rec. H.264 |ISO/IEC 14496-10 AVC)", Joint Video Team (JVT) of ISO/IEC MPEG & ITU-T VCEG (ISO/IEC JTC1/SC29/WG11 and ITU-T SG16 Q.6), JVT-G050r1, May 27, 2003, pp. 160-161.

Hisao Sasai et al., "*Simplified Context Modeling for Transform Coefficient Coding*", Joint Collaborative Team on Video Coding (JCT-VC) of ITU-T SG16 WP3 and ISO/IEC JTC1/SC29/WG11, JCTVC-D185, 4th Meeting: Daegu, KR, Jan. 20-28, 2011, pp. 1-5.

International Search Report and Written Opinion of the corresponding PCT application No. PCT/JP2012/000158 issued on Feb. 14, 2012.

ISO/IEC 14496-10 MPEG-4 Part 10: "*Advanced Video Coding*", Oct. 1, 2004.

International Search Report and Written Opinion of the corresponding PCT application No. PCT/JP2012/000158 issued on Feb. 4, 2012.

Thomas Wiegand et al., "WD1: Working Draft 1 of High-Efficiency Video Coding", Joint Collaborative Team on Video Coding (JCT-VC) of ITU-T SG16 WP3 and ISO/IEC JTC1/SC29/WG11, JCTVC-C403, Ver. 1, 3rd Meeting: Guangzhou, CN, Oct. 7-15, 2010.

Thomas Wiegand et al., "Overview of the H.264/AVC Video Coding Standard", IEEE Transactions on Circuits and Systems for Video Technology, vol. 13, No. 7, Jul. 2003, pp. 560-576.

International Search Report issued Feb. 14, 2012 in corresponding International Application No. PCT/JP2012/000148.

Written Opinion of the International Searching Authority issued Feb. 14, 2012 in corresponding International Application No. PCT/JP2012/000148.

Mathias Wien, "Variable Block-Size Transforms for H.264/AVC", IEEE Transactions on Circuits and Systems for Video Technology, vol. 13, No. 7, Jul. 2003, pp. 604-613.

* cited by examiner

FIG. 4

| Index ctxIdx | Occurrence probability pStateIdx | Symbol valMPS |
|---|---|---|
| 0 | 12 | 1 |
| 1 | 7 | 0 |
| 2 | 41 | 0 |
| 3 | 22 | 1 |
| 4 | 10 | 1 |
| 5 | 8 | 0 |
| 6 | 50 | 1 |
| ⋮ | ⋮ | ⋮ |

| | First segment | | | Second segment | | | | | |
|---|---|---|---|---|---|---|---|---|---|
| SE | 0 | 1 | 2 | 3 | 4 | 5 | 6 | 7 | ... |
| ctxIdx | 0 | 0 | 0 | 1 | 1 | 1 | 1 | 1 | ... |

(b)

| | Fourth segment | | | | | | | | |
|---|---|---|---|---|---|---|---|---|---|
| SE | 20 | 21 | 22 | 23 | 24 | 25 | 26 | 27 | ... |
| ctxIdx | 3 | 3 | 3 | 3 | 3 | 3 | 3 | 3 | ... |

FIG. 11A

| Magnitude of last position component | Truncated unary (binIdx) | | | | | | Fixed binary |
|---|---|---|---|---|---|---|---|
| | 0 | 1 | 2 | 3 | 4 | 5 | |
| 0 | 0 | | | | | | - |
| 1 | 1 | 0 | | | | | - |
| 2 | 1 | 1 | 0 | | | | - |
| 3 | 1 | 1 | 1 | 0 | | | - |
| 4 | 1 | 1 | 1 | 1 | 0 | | 1 |
| 5 | 1 | 1 | 1 | 1 | 0 | | 0 |
| 6 | 1 | 1 | 1 | 1 | 1 | (0) | 1 |
| 7 | 1 | 1 | 1 | 1 | 1 | (0) | 0 | cntIdx   0   1   2   3

FIG. 11B

| binIdx | 0 | 1 | 2 | 3 | 4 | 5 |
|---|---|---|---|---|---|---|
| ctxIdx | 0 | 1 | 2 | 2 | 3 | 3 |

FIG. 26

| |
|---|
| Video stream (PID=0x1011 Primary video) |
| Audio stream (PID=0x1100) |
| Audio stream (PID=0x1101) |
| Presentation graphics stream (PID=0x1200) |
| Presentation graphics stream (PID=0x1201) |
| Interactive graphics stream (PID=0x1400) |
| Video stream (PID=0x1B00 Secondary video) |
| Video stream (PID=0x1B01 Secondary video) |

FIG. 37
| Corresponding standard | Driving frequency |
|---|---|
| MPEG4. AVC | 500MHz |
| MPEG2 | 350MHz |
| ⋮ | ⋮ |
FIG. 38A
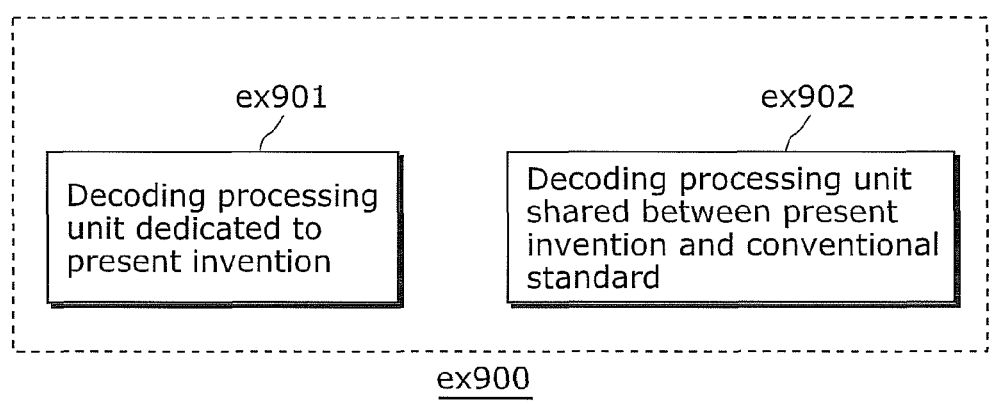
FIG. 38B
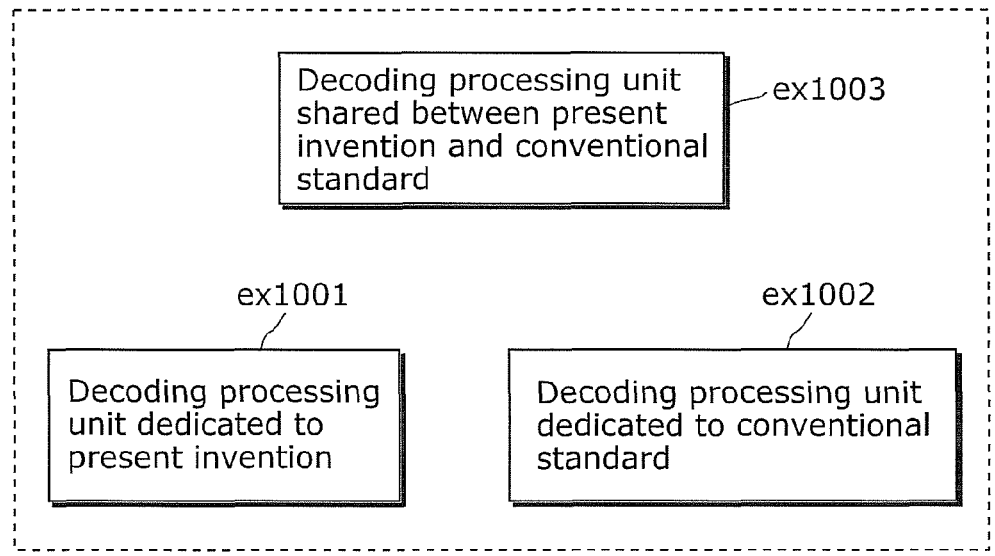

IMAGE CODING METHOD, IMAGE CODING APPARATUS, IMAGE DECODING METHOD, IMAGE DECODING APPARATUS, AND IMAGE CODING AND DECODING APPARATUS WHICH INCLUDE ARITHMETIC CODING OR ARITHMETIC DECODING

CROSS REFERENCE TO RELATED APPLICATION

The present application claims the benefit of U.S. Provisional Patent Application No. 61/432,724 filed on Jan. 14, 2011. The entire disclosure of the above-identified application, including the specification, drawings and claims are incorporated herein by reference in its entirety.

BACKGROUND OF THE INVENTION (1) Field of the Invention

The present invention relates to image coding methods, image coding apparatuses, image decoding methods, image decoding apparatuses, and image coding and decoding apparatuses, and particularly relates to an image coding method, an image coding apparatus, an image decoding method, an image decoding apparatus, and an image coding and decoding apparatus which include arithmetic coding or arithmetic decoding.

(2) Description of the Related Art

In recent years, there have been an increasing number of applications for video-on-demand type services, for example, including video conferences, digital video broadcasting, and streaming of video content via the Internet, and these applications depend on transmission of video information. At the time of transmission or recording of video data, a considerable amount of data is transmitted through a conventional transmission path of a limited bandwidth or is stored in a conventional recording medium with limited data capacity. In order to transmit video information through a conventional transmission channel and store video information in a conventional recording medium, it is essential to compress or reduce the amount of digital data.

Thus, a plurality of video coding standards has been developed for compressing video data. Such video coding standards include, for example, the ITU-T standards denoted as H. 26x, produced by the telecommunication standardization sector of the international telecommunication union, and the ISO/IEC standards denoted as MPEG-x. The most up-to-date and advanced video coding standard is currently the standard denoted as H. 264/AVC or MPEG-4 AVC (see Non-Patent Literature 1: ISO/IEC 14496-10 "MPEG-4 Part10 Advanced Video Coding" and Non-Patent Literature 2: Thomas Wiegand et al, "Overveiw of the H. 264/AVC Video Coding Standard", IEEE TRANSACTIONS ON CIRCUITS AND SYSTEMS FOR VIDEO TECHNOLOGY, JULY 2003, PP.1-19).

In the H. 264/AVC standard, the coding process roughly includes prediction, transform, quantization, and entropy coding. Through the entropy coding of this processing, redundant information is cut from information which is used in the prediction, quantized information, and the like. The known examples of the entropy coding include variable-length coding, adaptive coding, and fixed-length coding. The variable-length coding includes Huffman coding, run-length coding, and arithmetic coding.

Of these, the arithmetic coding is a method in which the probability of occurrence of a symbol is calculated to determine an output code. Specifically, in the arithmetic coding, image data is coded in a manner that symbol occurrence probability in a context corresponding to characteristics of image data is predicted while the symbol occurrence probability is updated for each context. Thus, since a code is determined according to characteristics of image data, the arithmetic coding is known for higher coding efficiency than Huffman coding or the like which uses a fixed coding table.

SUMMARY OF THE INVENTION

However, in the arithmetic coding, it is difficult to appropriately determine a context for characteristics of image data. For example, when a range of characteristics of image data which corresponds to one context is too small (that is, in the case of contexts classified in detail), the frequency of updating the symbol occurrence probability is low, which causes a decrease in accuracy of predicting the symbol occurrence probability. As a result, adaptive coding according to the characteristics of the image data becomes difficult, which poses a problem of deterioration in coding efficiency.

Thus, the present invention has been devised to solve the above conventional problems and has an object to provide an image coding method and an image decoding method which can increase the accuracy of predicting probability information such as the symbol occurrence probability and can improve the image coding efficiency.

In order to solve the above conventional problems, an image coding method according to an aspect of the present invention is an image coding method of coding image data, comprising: frequency-transforming the image data to generate a unit of processing in a frequency domain; binarizing a coefficient included in the unit of processing, to generate a binary signal; determining, as a context for the binary signal, one or more contexts common to a plurality of coefficients included in a segment which includes the binarized coefficient, the segment being one of a plurality of segments obtained by dividing the unit of processing; performing binary arithmetic coding on the binary signal according to probability information corresponding to the determined context; and updating, based on the binary signal, the probability information corresponding to the determined context.

Furthermore, an image coding apparatus according to an aspect of the present invention is an image coding apparatus which codes image data, comprising: a transform unit configured to frequency-transform the image data to generate a unit of processing in a frequency domain; a binarization unit configured to binarize a coefficient included in the unit of processing, to generate a binary signal; a context control unit configured to determine a context for the binary signal; and a binary arithmetic coding unit configured to perform binary arithmetic coding on the binary signal according to probability information corresponding to the determined context, wherein the context control unit is configured to (i) determine, as the context for the binary signal, one or more contexts common to a plurality of coefficients included in a segment which includes the binarized coefficient, the segment being one of a plurality of segments obtained by dividing the unit of processing, and (ii) update, based on the binary signal, the probability information corresponding to the determined context.

Furthermore, an image decoding method according to an aspect of the present invention is an image decoding method of decoding coded image data, comprising: obtaining, when a decoding target signal included in the coded image data indicates a coefficient included in a unit of processing in a frequency domain, position information indicating a position of the coefficient within the unit of processing; determining, as a context for the decoding target signal, one or more contexts common to a plurality of coefficients included in a segment which includes the position indicated by the position information, the segment being one of a plurality of segments obtained by dividing the unit of processing; performing binary arithmetic decoding on the decoding target signal according to probability information corresponding to the determined context, to generate a binary signal; and converting the binary signal into multi-values; and updating, based on the binary signal, the probability information corresponding to the determined context.

Furthermore, an image decoding apparatus according to an aspect of the present invention is an image decoding apparatus which decodes coded image data, comprising: a context control unit configured to determine a context for a decoding target signal included in the coded image data; a binary arithmetic decoding unit configured to perform arithmetic decoding on the decoding target signal according to probability information corresponding to the determined context, to generate a binary signal; and converting the binary signal into multi-values, wherein the context control unit is configured to (i) obtain, when the decoding target signal indicates a coefficient included in a unit of processing in a frequency domain, position information indicating a position of the coefficient within the unit of processing, (ii) determine, as a context for the decoding target signal, one or more contexts common to a plurality of coefficients included in a segment which includes the position indicated by the position information, the segment being one of a plurality of segments obtained by dividing the unit of processing, and (iii) update, based on the binary signal, the probability information corresponding to the determined context.

Furthermore, an image coding and decoding apparatus according to an aspect of the present invention is an image coding and decoding apparatus comprising: an image coding apparatus which codes image data to generate the coded image data; and an image decoding apparatus which decodes the coded image data, wherein the image coding apparatus includes: a transform unit configured to frequency-transform the image data to generate a unit of processing in a frequency domain; a binarization unit configured to binarize a coefficient included in the unit of processing, to generate a binary signal; a first context control unit configured to determine a context for the binary signal; and a binary arithmetic coding unit configured to perform binary arithmetic coding on the binary signal according to probability information corresponding to the determined context, the first context control unit is configured to (i) determine, as the context for the binary signal, one or more contexts common to a plurality of coefficients included in a segment which includes the binarized coefficient, the segment being one of a plurality of segments obtained by dividing the unit of processing, and (ii) update, based on the binary signal, the probability information corresponding to the determined context, the image decoding apparatus includes: a second context control unit configured to determine a context for a decoding target signal included in the coded image data; a binary arithmetic decoding unit configured to perform arithmetic decoding on the decoding target signal according to probability information corresponding to the determined context, to generate a binary signal; and converting the binary signal into multi-values, and the second context control unit is configured to (i) obtain, when the decoding target signal indicates a coefficient included in a unit of processing in a frequency domain, position information indicating a position of the coefficient within the unit of processing, (ii) determine, as a context for the decoding target signal, one or more contexts common to a plurality of coefficients included in a segment which includes the position indicated by the position information, the segment being one of a plurality of segments obtained by dividing the unit of processing, and (iii) update, based on the binary signal, the probability information corresponding to the determined context.

According to the present invention, probability information such as the symbol occurrence probability can be predicted with higher accuracy, which allows improvement in the image coding efficiency.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings:

FIG. 4 shows an example of a symbol occurrence probability table according to Embodiment 1 of the present invention;

FIG. 5 shows an example of a context table according to Embodiment 1 of the present invention;

FIG. 11A shows an example of binarization according to a variation of Embodiment 1 of the present invention;

FIG. 11B shows an example of a correspondence relationship between a bit position of a binary symbol included in a binary signal and a context index according to the variation of Embodiment 1;

FIG. 26 illustrates a structure of the multiplexed data;

FIG. 37 shows an example of a look-up table in which standards of video data are associated with the driving frequencies;

FIG. 38A shows an example of a configuration for sharing a module of a signal processing unit; and FIG. 38B shows another example of a configuration for sharing a module of a signal processing unit.

DESCRIPTION OF THE PREFERRED EMBODIMENTS (Passage)

First, with reference to an operation of arithmetic coding for comparison, how the present invention has been obtained is described.

Figure 1:
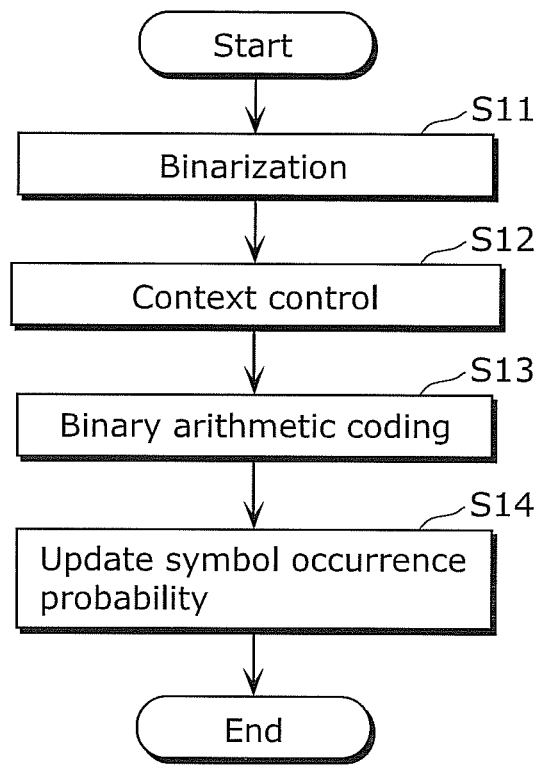
FIG. 1 is a flowchart showing an arithmetic coding method for comparison.

First, with reference to FIG. 1, a flow of the arithmetic coding for comparison is described below.

In the case where a coding target signal is a signal involving a block size such as a quantized coefficient, for example, a block size is specified. After the start of the arithmetic coding, binarization is performed in Step S11 by a predetermined method according to a type of the signal. Next, in Step S12, context control processing according to the type of the signal including information on the block size is performed. In the context control processing, the symbol occurrence probability according to the type of the signal is read from a memory in which a plurality of symbol occurrence probabilities are stored, and the read symbol occurrence probability is output. In Step S13, using the symbol occurrence probability output in Step S12, the arithmetic coding is performed on information to be processed, and a resultant is output as an output signal.

In Step S14, based on binary data obtained by binarizing in Step S11, a value of the corresponding symbol occurrence probability is updated, and the updated value is stored as the symbol occurrence probability. Subsequent to completion of the arithmetic coding on the current signal, the arithmetic coding is performed again on a next signal to be processed.

Figure 2:
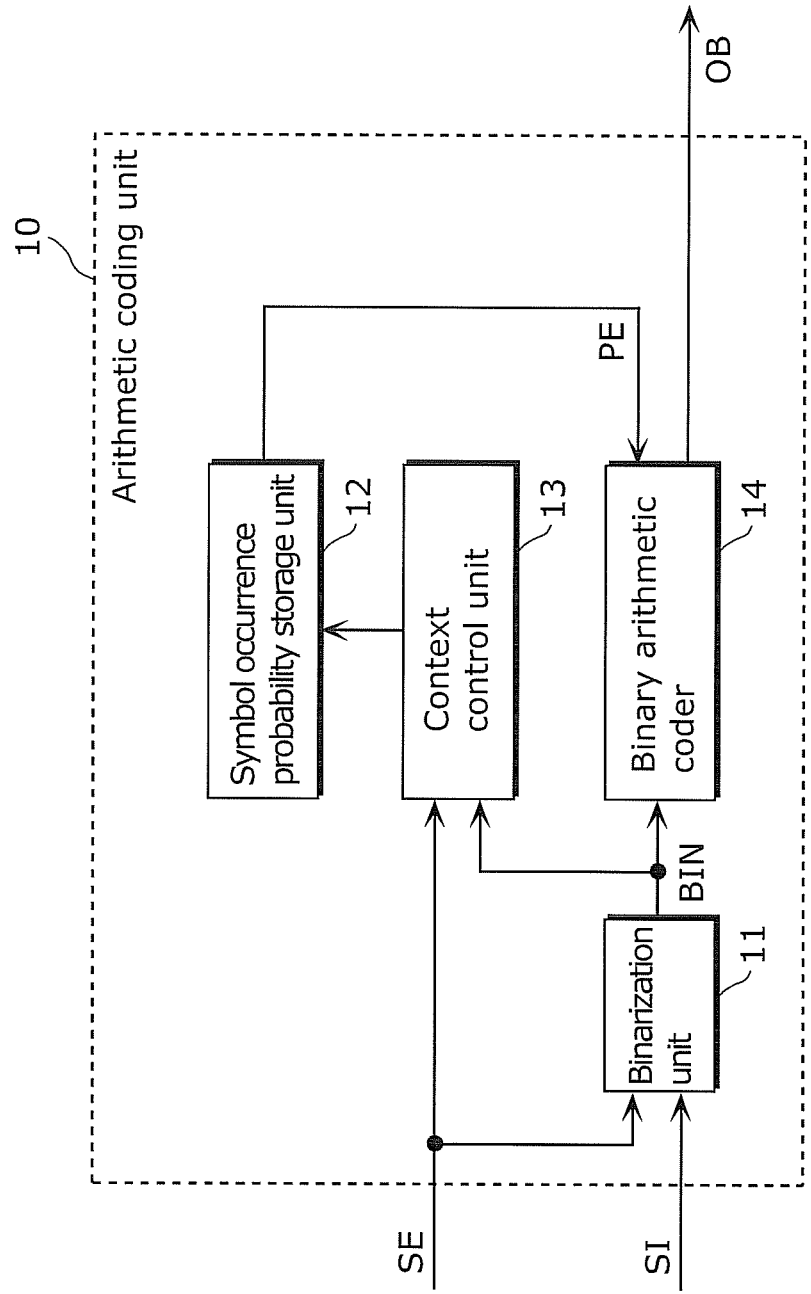
FIG. 2 is a block diagram showing a structure of an arithmetic coding apparatus for comparison.
Figure 22:
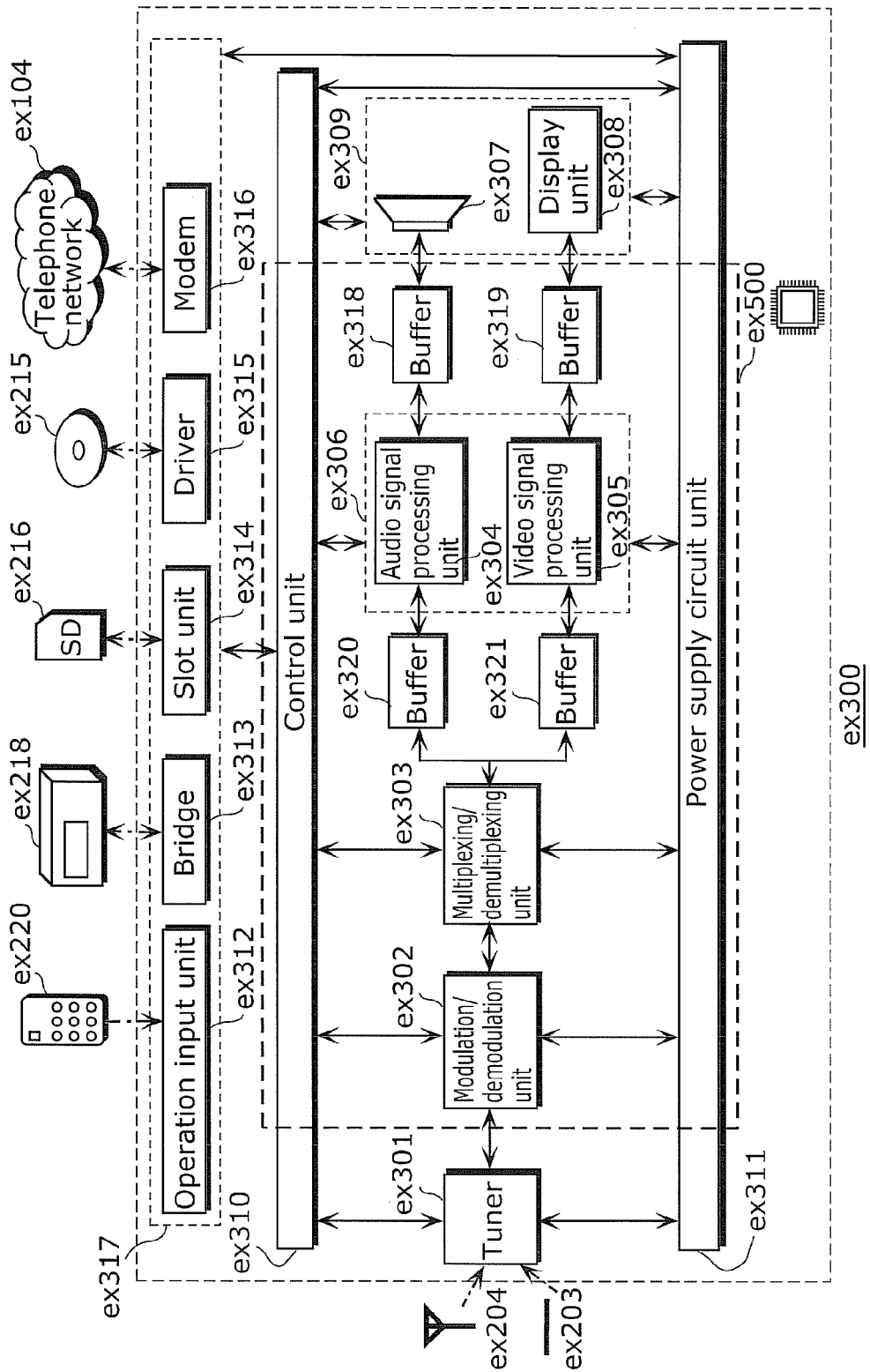
FIG. 22 is a block diagram illustrating an example of a configuration of a television.

FIG. 2 is a block diagram showing a structure of an arithmetic coding unit that represents the processing of conventional H.264/AVC arithmetic coding. As shown in FIG. 22, an arithmetic coding unit 10 includes a binarization unit 11, a symbol occurrence probability storage unit 12, a context control unit 13, and a binary arithmetic coder 14.

The arithmetic coding unit 10 receives an input signal SI that is a coding target signal and signal type information SE that indicates a type of the input signal SI. The binarization unit 11 converts the input signal SI to binary data (symbol) of "0" and "1" based on the signal type information SE, and sends a binary signal BIN to the binary arithmetic coder 14 and the context control unit 13.

The context control unit 13 causes the symbol occurrence probability storage unit 12 to output a symbol occurrence probability PE of a context which corresponds to the signal type information SE. Furthermore, on the basis of the binary signal BIN which corresponds to the input signal SI provided from the binarization unit 11, the context control unit 13 performs update processing on the symbol occurrence probability PE of the context which corresponds to the signal type information SE, and stores a result of the updating in the symbol occurrence probability storage unit 12.

The binary arithmetic coder 14 performs the arithmetic coding process on the binary signal BIN based on the symbol occurrence probability PE to generate output bit data OB, and outputs the generated output bit data OB.

However, in the above arithmetic coding, the context control unit obtains one symbol occurrence probability of a context which corresponds to the signal type information on the coding target signal, and it is very difficult to appropriately set a correspondence relationship between the signal type information and the context.

For example, in the case of performing the arithmetic coding on a quantized coefficient resulting from frequency-transform and quantization per block, quantized coefficients at different positions will be treated as mutually different types. With each context, a different context is associated. An increase in the block size also results in association of a context with each type or with each of the predetermined number of types. This means that contexts are classified in detail.

However, in the case where contexts are classified in detail, there is a decreased frequency of updating the symbol occurrence probability, which causes a decrease in accuracy of predicting the symbol occurrence probability. As a result, adaptive coding according to the characteristics of the image data becomes difficult, which deteriorates the coding efficiency.

In order to solve the above problems, an image coding method according to an aspect of the present invention is an image coding method of coding image data, comprising: frequency-transforming the image data to generate a unit of processing in a frequency domain; binarizing a coefficient included in the unit of processing, to generate a binary signal; determining, as a context for the binary signal, one or more contexts common to a plurality of coefficients included in a segment which includes the binarized coefficient, the segment being one of a plurality of segments obtained by dividing the unit of processing; performing binary arithmetic coding on the binary signal according to probability information corresponding to the determined context; and updating, based on the binary signal, the probability information corresponding to the determined context.

With this, one or more contexts common to a plurality of coefficients included in a segment which includes a binarized coefficient can be determined as a context for a binary signal. Accordingly, the frequency of updating the probability information corresponding to the context becomes higher, so that statistical information is more likely to be reflected in the probability information. As a result, the accuracy of predicting the probability information can be increased, which allows improvement in the coding efficiency. Furthermore, the number of contexts can be smaller than that in the case where a different context is determined for each coefficient. Thus, it also becomes possible to reduce the size of a memory for storing the probability information corresponding to each context.

Furthermore, in an image coding method according to another aspect of the present invention, it is preferable that among the segments, a first segment be smaller than a second segment located in a region higher in frequency than the first segment.

With this, the first segment can be smaller than the second segment located in a region higher in frequency than the first segment. Accordingly, the segments are set according to statistical properties depending on frequency components, which allows a reduction in the number of contexts and at the same time, allows improvement in the accuracy of predicting the probability information. As a result, it becomes possible to improve the coding efficiency.

Furthermore, in an image coding method according to another aspect of the present invention, it is preferable that in the binarizing, when the coefficient is a last non-zero coefficient in a predetermined scan order, a signal indicating a position of the coefficient be generated as the binary signal, the coefficient being one of coefficients scanned in the predetermined scan order, and the coefficients being included in the unit of processing.

With this, it is possible to appropriately determine a context for the binary signal indicating the position of the last non-zero coefficient in the scan order, which allows improvement in the coding efficiency.

Furthermore, in an image coding method according to another aspect of the present invention, it is preferable that in the binarizing, when the coefficient is the last non-zero coefficient in the predetermined scan order, a signal indicating the position of the coefficient using two-dimensional coordinate values be generated as the binary signal.

With this, a context can be appropriately determined even for the binary signal indicating, using two-dimensional coordinate values, the position of the last non-zero coefficient in the scan order, which makes it possible to improve the coding efficiency.

Furthermore, in order to solve the above problems, an image coding apparatus according to an aspect of the present invention is an image coding apparatus which codes image data, comprising: a transform unit configured to frequency-transform the image data to generate a unit of processing in a frequency domain; a binarization unit configured to binarize a coefficient included in the unit of processing, to generate a binary signal; a context control unit configured to determine a context for the binary signal; and a binary arithmetic coding unit configured to perform binary arithmetic coding on the binary signal according to probability information corresponding to the determined context, wherein the context control unit is configured to (i) determine, as the context for the binary signal, one or more contexts common to a plurality of coefficients included in a segment which includes the binarized coefficient, the segment being one of a plurality of segments obtained by dividing the unit of processing, and (ii) update, based on the binary signal, the probability information corresponding to the determined context.

With this, the same or like effects as those in the above image coding method can be produced.

Furthermore, in order to solve the above problems, an image decoding method according to an aspect of the present invention is an image decoding method of decoding coded image data, comprising: obtaining, when a decoding target signal included in the coded image data indicates a coefficient included in a unit of processing in a frequency domain, position information indicating a position of the coefficient within the unit of processing; determining, as a context for the decoding target signal, one or more contexts common to a plurality of coefficients included in a segment which includes the position indicated by the position information, the segment being one of a plurality of segments obtained by dividing the unit of processing; performing binary arithmetic decoding on the decoding target signal according to probability information corresponding to the determined context, to generate a binary signal; and converting the binary signal into multi-values; and updating, based on the binary signal, the probability information corresponding to the determined context.

With this, one or more contexts common to a plurality of coefficients included in a segment which includes a position indicated by position information can be determined as a context for the decoding target signal. Accordingly, the frequency of updating the probability information corresponding to the context becomes higher, so that statistical information is more likely to be reflected in the probability information. As a result, the accuracy of predicting the probability information can be increased, which allows improvement in the coding efficiency. It then becomes possible to correctly decode image data coded with such high coding efficiency.

Furthermore, in an image decoding method according to another aspect of the present invention, it is preferable that among the segments, a first segment be smaller than a second segment located in a region higher in frequency than the first segment.

With this, the first segment can be smaller than the second segment located in a region higher in frequency than the first segment. Accordingly, the segments are set according to statistical properties depending on frequency components, which allows a reduction in the number of contexts and at the same time, allows improvement in the accuracy of predicting the probability information. This makes it possible to correctly decode image data coded with higher coding efficiency.

Furthermore, in an image decoding method according to another aspect of the present invention, it is preferable that when the coefficient is a last non-zero coefficient in a predetermined scan order, the decoding target signal be a signal indicating a position of the coefficient, the coefficient being one of coefficients scanned in the predetermined scan order, and the coefficients being included in the unit of processing.

With this, it is possible to appropriately determine a context for the decoding target signal indicating the position of the last non-zero coefficient in the scan order, which allows correct decoding of image data coded with high coding efficiency.

Furthermore, in an image decoding method according to another aspect of the present invention, it is preferable that when the coefficient is the last non-zero coefficient in the predetermined scan order, the decoding target signal be a signal indicating the position of the coefficient using two-dimensional coordinate values.

With this, a context can be appropriately determined even for the decoding target signal indicating, using two-dimensional coordinate values, the position of the last non-zero coefficient in the scan order, with the result that image data coded with high coding efficiency can be correctly decoded.

Furthermore, in order to solve the above problems, an image decoding apparatus according to an aspect of the present invention is an image decoding apparatus which decodes coded image data, comprising: a context control unit configured to determine a context for a decoding target signal included in the coded image data; a binary arithmetic decoding unit configured to perform arithmetic decoding on the decoding target signal according to probability information corresponding to the determined context, to generate a binary signal; and converting the binary signal into multi-values, wherein the context control unit is configured to (i) obtain, when the decoding target signal indicates a coefficient included in a unit of processing in a frequency domain, position information indicating a position of the coefficient within the unit of processing, (ii) determine, as a context for the decoding target signal, one or more contexts common to a plurality of coefficients included in a segment which includes the position indicated by the position information, the segment being one of a plurality of segments obtained by dividing the unit of processing, and (iii) update, based on the binary signal, the probability information corresponding to the determined context.

With this, the same or like effects as those in the above image decoding method can be produced.

Furthermore, in order to solve the above problems, an image coding and decoding apparatus according to an aspect of the present invention is an image coding and decoding apparatus comprising: an image coding apparatus which codes image data to generate the coded image data; and an image decoding apparatus which decodes the coded image data, wherein the image coding apparatus includes: a transform unit configured to frequency-transform the image data to generate a unit of processing in a frequency domain; a binarization unit configured to binarize a coefficient included in the unit of processing, to generate a binary signal; a first context control unit configured to determine a context for the binary signal; and a binary arithmetic coding unit configured to perform binary arithmetic coding on the binary signal according to probability information corresponding to the determined context, the first context control unit is configured to (i) determine, as the context for the binary signal, one or more contexts common to a plurality of coefficients included in a segment which includes the binarized coefficient, the segment being one of a plurality of segments obtained by dividing the unit of processing, and (ii) update, based on the binary signal, the probability information corresponding to the determined context, the image decoding apparatus includes: a second context control unit configured to determine a context for a decoding target signal included in the coded image data; a binary arithmetic decoding unit configured to perform arithmetic decoding on the decoding target signal according to probability information corresponding to the determined context, to generate a binary signal; and converting the binary signal into multi-values, and the second context control unit is configured to (i) obtain, when the decoding target signal indicates a coefficient included in a unit of processing in a frequency domain, position information indicating a position of the coefficient within the unit of processing, (ii) determine, as a context for the decoding target signal, one or more contexts common to a plurality of coefficients included in a segment which includes the position indicated by the position information, the segment being one of a plurality of segments obtained by dividing the unit of processing, and (iii) update, based on the binary signal, the probability information corresponding to the determined context.

With this, the same or like effects as those in the above image coding method and in the above image decoding method can be produced.

Embodiments of the present invention are described below with reference to the drawings. It is to be noted that each of Embodiments described below illustrates one preferable specific example of the present invention. Numeric values, shapes, materials, constituents, positions and topologies of the constituents, steps, an order of the steps, and the like in the following Embodiments are an example of the present invention, and it should therefore not be construed that the present invention is limited to each of these Embodiments. The present invention is specified based on descriptions in the scope of the claims. Thus, out of the constituents in the following Embodiments, the constituents not stated in the independent claims describing the broadest concept of the present invention are not always necessary to achieve the object of the present invention, but are described as constituents in a more preferable embodiment.

Embodiment 1

An outline of an image coding method according to Embodiment 1 of the present invention is described. In the image coding method according to this embodiment, arithmetic coding is performed using a context which is set for each segment obtained by appropriately dividing a unit of processing based on frequency components. With this, in performing arithmetic coding on a coefficient included in each segment, a symbol occurrence probability based on common statistical information can be used to perform the arithmetic coding, which makes it possible to improve the coding efficiency. Furthermore, the use of a context common to the coefficients included in a segment allows the number of contexts to be smaller than in the case of using a different context for each coefficient. Thus, the memory size at the time of implementation can be reduced.

It is to be noted that the unit of processing is a block which is obtained by dividing an image in a spatial domain or in a frequency domain. For each unit of processing, coding-related processing is performed. For example, the unit of processing is a transform unit (TU). Although the following includes a case where the unit of processing is expressed as a macroblock, the unit of processing is not necessarily limited to the macroblock.

The above is a description about the outline of the arithmetic coding method according to this embodiment.

Figure 3:
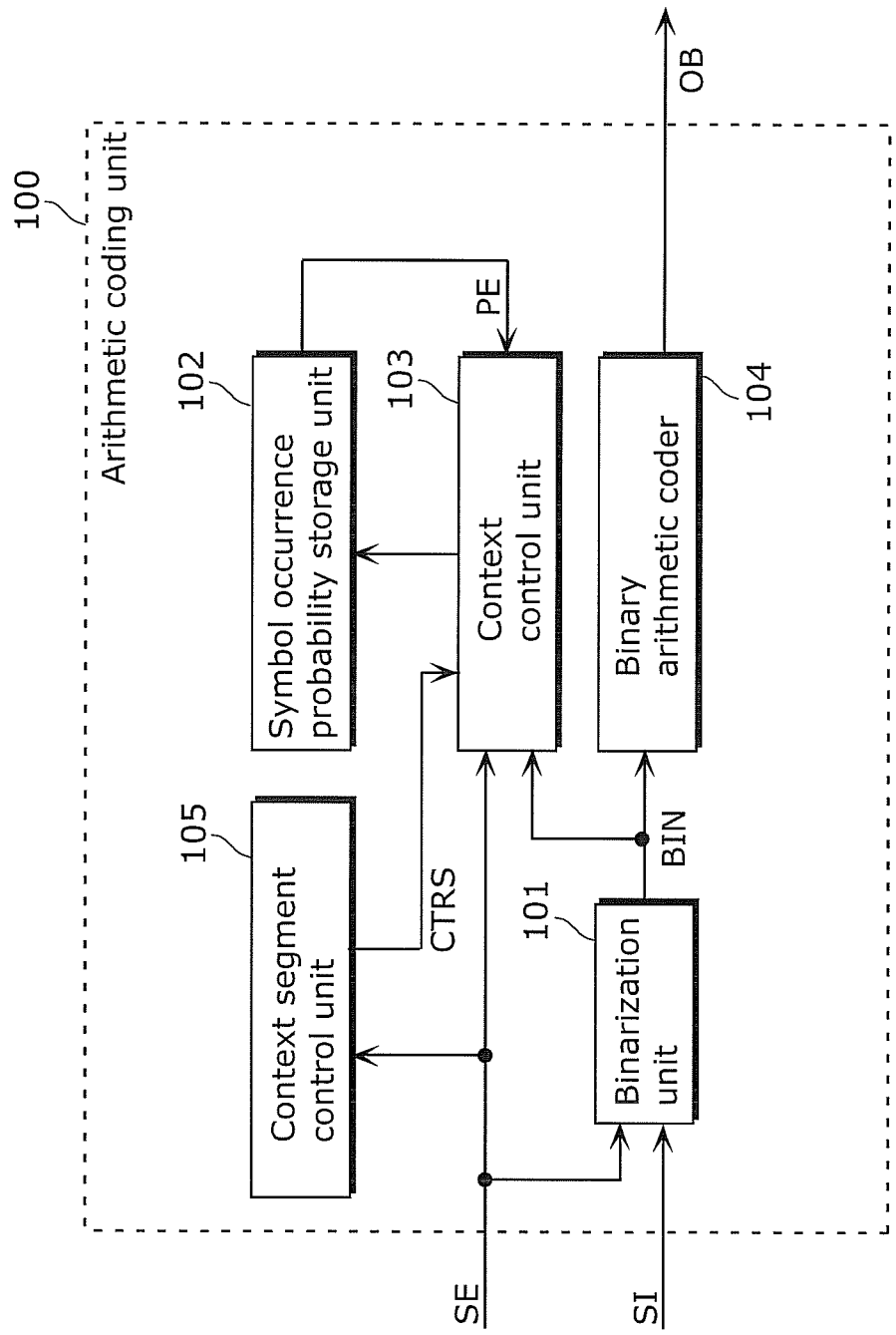
FIG. 3 is a block diagram showing an example of a structure of an arithmetic coding unit according to Embodiment 1 of the present invention.

Next, a structure of an arithmetic coding unit which performs the arithmetic coding method according to this embodiment is described. FIG. 3 is a block diagram showing an example of a structure of an arithmetic coding unit 100 according to Embodiment 1 of the present invention. As will be described below, the arithmetic coding unit 100 according to Embodiment 1 of the present invention corresponds to a part of an image coding apparatus which compresses and codes image data.

As shown in FIG. 3, the arithmetic coding unit 100 includes a binarization unit 101, a symbol occurrence probability storage unit 102, a context control unit 103, a binary arithmetic coder 104, a context segment control unit 105.

The arithmetic coding unit 100 performs arithmetic coding on an input signal SI that is a coding target signal, and outputs an output signal OB. Furthermore, the arithmetic coding unit 100 receives signal type information SE indicating a type of the input signal SI. In the case where the input signal SI is a signal involving a quantized coefficient, the signal type information SE includes information which indicates a coefficient position.

The input signal SI is a coding target signal of image data and, for example, is a signal which indicates a quantized coefficient generated by transforming and quantizing image data. In other words, the input signal SI is a signal which is generated by frequency-transforming image data and indicates a unit of processing in a frequency domain. The input signal SI may be a signal which indicates, instead of the quantized coefficient, information used to generate the quantized coefficient.

The signal type information SE indicates a type of the input signal SI that is the coding target signal. The type of the input signal SI is, for example, information indicating properties or characteristics of the coding target signal. In the case where a prediction method applied to the input signal SI is intra prediction, for example, the signal type information SE may include information indicating a prediction direction of the intra prediction.

Alternatively, in the case where the input signal SI indicates one of a plurality of quantized coefficients included in a macroblock, the signal type information SE may include position information indicating a position (a coefficient position) of the quantized coefficient within the macroblock. Furthermore, in the case where the input signal SI indicates information on one of a plurality of quantized coefficients included in a unit of processing, the signal type information SE may include information indicating whether a quantized coefficient around the one quantized coefficient is zero or non-zero. More specifically, in the case where the input signal SI is one of a plurality of quantized coefficients included in a macroblock, the signal type information SE may include information indicating whether a quantized coefficient of a direct-current component of the macroblock is zero or non-zero.

The following mainly describes the case where the input signal SI is a signal indicating a position of the last non-zero coefficient in a scan order. In this embodiment, the signal indicating a position of the last non-zero coefficient in a scan order is a signal indicating whether a non-zero coefficient is last in a particular scan order when one of a plurality of quantized coefficients scanned in the order is the non-zero coefficient.

The binarization unit 101 binarizes the coding target signal to generate a binary signal. Specifically, the binarization unit 101 performs binarization on the input signal based on the input signal SI and the signal type information SE, to generate a binary signal BIN. More specifically, the binarization unit 101 generates the binary signal by binarizing a coefficient which is included in the unit of processing, indicated by the input signal SI, in a frequency domain.

The symbol occurrence probability storage unit 102 is a memory or the like which holds a plurality of symbol occurrence probabilities. For example, the symbol occurrence probability storage unit 102 holds a symbol occurrence probability table. The symbol occurrence probability table is a table in which contexts and probability information are associated. Details of the symbol occurrence probability table will be described later.

Furthermore, the symbol occurrence probability storage unit 102 holds a context table. The context table is a table in which types of the coding target signal and contexts are associated. Details of the context table will be described later.

The context control unit 103 determines a context based on the type of the coding target signal. Specifically, first, the context control unit 103 obtains the signal type information SE and also obtains a control signal CTRS from the context segment control unit 105. The context control unit 103 then determines a context for the coding target signal by referring to the context table based on the obtained signal type information SE and the obtained control signal CTRS.

At this time, the context control unit 103 determines a context based on the segment designated by the control signal CTRS. Here, in the case where one segment includes a plurality of coefficients, the context control unit 103 determines a context common to these coefficients. Specifically, the context control unit 103 determines, as a context for a binary signal, a context common to a plurality of coefficients included in a segment indicated by the control signal CTRS. The context control unit 103 may hold the context table. An operation of the context segment control unit 105 will be described later.

Furthermore, the context control unit 103 determines the coding probability information which corresponds to the determined context. Specifically, by referring to the symbol occurrence probability table, the context control unit 103 determines which one of the plurality of symbol occurrence probabilities stored in the symbol occurrence probability storage unit 102 is to be used.

The coding probability information is probability information to be used in the arithmetic coding of the binary signal. Specifically, the coding probability information indicates an index indicating a value of the symbol occurrence probability or indicates a value of the symbol occurrence probability, for example. In the following, the coding probability information is also referred to simply as probability information.

The symbol occurrence probability determined by the context control unit 103 as corresponding to the context as above is output from the symbol occurrence probability storage unit 102 to the binary arithmetic coder 104.

The binary arithmetic coder 104 performs arithmetic coding on the binary signal using the coding probability information. Specifically, using the symbol occurrence probability PE outputted by the symbol occurrence probability storage unit 102, the binary arithmetic coder 104 performs the arithmetic coding on the binary signal generated by the binarization unit 101.

The above is a description about the structure of the arithmetic coding unit 100 according to this embodiment.

Here, the symbol occurrence probability table held by the symbol occurrence probability storage unit 102 is described. FIG. 4 shows an example of the symbol occurrence probability table according to Embodiment 1 of the present invention.

The symbol occurrence probability table is a table in which contexts and symbol occurrence probabilities are associated. An index (ctxIdx) in FIG. 4 is an index indicating a context and specifically is an index which is determined according to peripheral information on a macroblock being coded, already-coded information on the block, or a position of a bit to be coded.

An entry indicated by each index includes probability information (pStateIdx) indicating the symbol occurrence probability and a symbol (vaIMPS) indicating a symbol having a high occurrence probability (Most Probable Symbol). These are equivalent to those specified in the H. 264 standard. Specifically, pStateIdx is an index indicating a value of the symbol occurrence probability. The symbol occurrence probability storage unit 102 further holds a table indicating a value of the symbol occurrence probability which corresponds to pStateIdx.

Although the symbol occurrence probability is managed here using a table in which the index (pStateIdx) indicating the symbol occurrence probability is associated with the context (ctxIdx), the symbol occurrence probability may be managed through direct association between the context and a value of the symbol occurrence probability. In this case, the value of the symbol occurrence probability is expressed with, for example, 16-bit accuracy (0-65535), which makes it possible to deal with more detailed values than in the management using the above table. The coding efficiency can therefore be improved. The following describes a method of managing the symbol occurrence probability as a value.

Next, the context table held by the symbol occurrence probability storage unit 102 is described. FIG. 5 shows an example of the context table according to Embodiment 1 of the present invention.

The context table is a table in which a plurality of types, contexts, and segments are associated. In the case where the input signal SI is a signal involving a quantized coefficient and the signal type information SE includes coefficient position information, the context segment control unit 105 selects a context table which is associated with the type of the coding target signal as shown in FIG. 5.

In the context table shown in FIG. 5, a numeral of the signal type information SE corresponds to a scan order. Specifically, the signal type information SE indicates, with the numeral 0, a coefficient of a direct-current (DC) component that is a low-frequency component, and with a larger numeral, a coefficient of a higher frequency component.

Furthermore, a set of coefficients (numerals of the signal type information SE) associated with the same context corresponds to one segment. In other words, the same context is set for all the coefficients included in the same segment in FIG. 5.

For example, FIG. 5 shows in (a) that the numerals 0 to 2 of the signal type information SE indicate coefficients included in the first segment. Furthermore, as a context common to the plurality of coefficients included in the first segment, a context having a context index "0" is set.

In the case where the coefficient position indicated by the signal type information SE is beyond a certain position (that is, included in the highest-frequency component region), all the coefficient positions beyond the certain position are associated with the same context as shown in (b) of FIG. 5.

By referring to the context table as shown in FIG. 5, the context control unit 103 determines, as a context for performing arithmetic coding on a binary signal, a context common to a plurality of coefficients included in a segment which includes a binarized coefficient.

Figure 6:
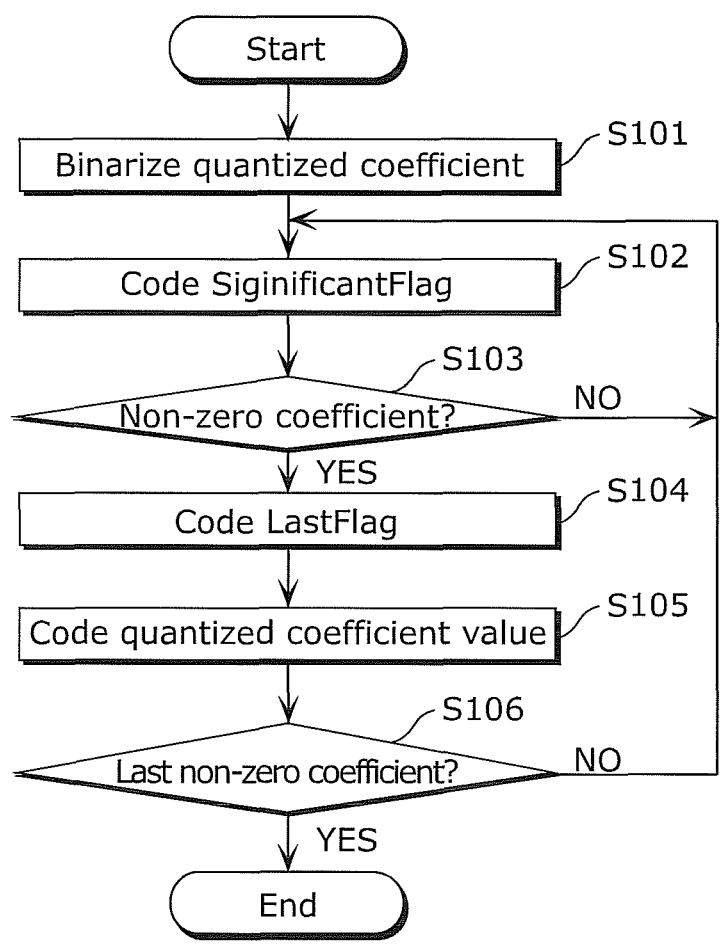
FIG. 6 is a flowchart showing an example of an arithmetic coding method according to Embodiment 1 of the present invention.

Next, with reference to the flowchart shown in FIG. 6, the arithmetic coding method which the arithmetic coding unit 100 shown in FIG. 3 performs is described. FIG. 6 is a flowchart showing an example of the arithmetic coding method according to Embodiment 1 of the present invention. Furthermore, FIG. 6 shows arithmetic coding applied in the case where the coding target signal forms a quantized coefficient group which corresponds to one block, and information on whether a coefficient in the quantized coefficient group corresponding to the one block is zero or non-zero is coded.

As shown in FIG. 6, in the arithmetic coding method according to this embodiment, the binarization unit 101 first performs binarization on the quantized coefficient group equivalent to the input signal SI that is to be coded (S101). Specifically, the binarization unit 101 reads the quantized coefficients in a predetermined scan order. At this time, the binarization unit 101 expresses, as "0" or "1", whether or not the quantized coefficient is a non-zero coefficient (a coefficient that is not 0), to thereby perform the binarization. Specifically, the binarization unit 101 generates, as a binary signal, a signal indicating whether or not the quantized coefficient is a non-zero coefficient. The binary signal generated here is referred to as SignificantFlag.

Here, in the case where the quantized coefficient is a non-zero coefficient, the binarization unit 101 expresses, as "0" or "1", whether or not there is still any non-zero coefficient, following that non-zero coefficient in the above-mentioned scan order, to thereby generate a binary signal. The binary signal generated here is referred to as LastFlag. This LastFlag is information indicating the position of the last non-zero coefficient in the scan order. As a result of generation of the binary signal as above, there is no need to code SignificantFlag of a zero-coefficient which is scanned after the last non-zero coefficient in the scan order, which allows a reduction in the amount of information.

Next, the arithmetic coding unit 100 performs arithmetic coding on SignificantFlag that is one of binary signals (S102). The arithmetic coding may be the same method as that in H. 264, for example. Next, when a coding target coefficient is a zero coefficient (NO in S103), the arithmetic coding unit 100 performs processing on next SignificantFlag. On the other hand, when the coding target coefficient is a non-zero coefficient (YES in S103), the arithmetic coding unit 100 performs arithmetic coding on LastFlag that indicates whether this non-zero coefficient is the last non-zero coefficient in the scan order (S104). Details of the arithmetic coding will be described later. Next, the arithmetic coding unit 100 performs coding on information on a coefficient value (a coefficient level) of the non-zero coefficient (S105). Here, a method for the coding (specifically, binarization and arithmetic coding) on the coefficient level of the non-zero coefficient is, for example, the same method as that in H. 264.

Here, when the coding target coefficient is not the last non-zero coefficient in the scan order (NO in S106), the arithmetic coding unit 100 performs processing on next SignificantFlag. On the other hand, when the coding target coefficient is the last non-zero coefficient in the scan order (YES in S106), the processing on one block ends.

Figure 7:
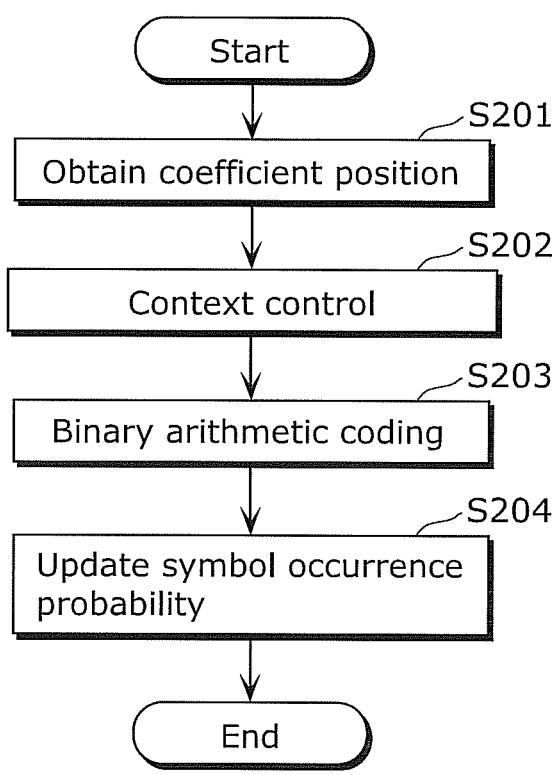
FIG. 7 is a flowchart showing an example of the arithmetic coding method according to Embodiment 1 of the present invention.

FIG. 7 is a flowchart showing an example of the arithmetic coding method according to Embodiment 1 of the present invention. For example, this flowchart corresponds to the arithmetic coding step shown in FIGS. 6 (S102 and S104 in FIG. 6). The context segment control unit 105 first obtains the signal type information SE including position information (S201).

Next, the context segment control unit 105 determines a segment for the coding target signal based on the obtained position information and outputs, to the context control unit 103, the control signal CTRS indicating the determined segment. By referring to the context table associated with the type of the coding target signal, the context control unit 103 determines, as a context which corresponds to the input signal SI, a context which corresponds to the segment that is indicated by the control signal CTRS obtained from the context segment control unit 105 (S202). In other words, the context control unit 103 selects a context for performing arithmetic coding on the input signal SI from among the plurality of contexts stored in the symbol occurrence probability storage unit 102. Details of an operation of the context segment control unit 105 will be described later.

Next, the symbol occurrence probability storage unit 102 reads the symbol occurrence probability determined by the context control unit 103 as corresponding to the context and outputs the symbol occurrence probability to be used for the arithmetic coding.

The binary arithmetic coder 104 performs arithmetic coding on the binary signal using the coding probability information (S203). Specifically, the binary arithmetic coder 104 performs arithmetic coding on the binary signal obtained from the binarization unit 101, in the method specified in the H. 264 standard, using the symbol occurrence probability outputted from the symbol occurrence probability storage unit 102.

The context control unit 103 updates the probability information based on the binary signal generated by the binarization unit 101 (S204). Specifically, the context control unit 103 updates the symbol occurrence probability which is stored in the symbol occurrence probability storage unit 102 and corresponds to the determined context according to the binary signal obtained from the binarization unit 101. The updating is performed in the method specified in the H. 264 standard, for example.

Figure 8:
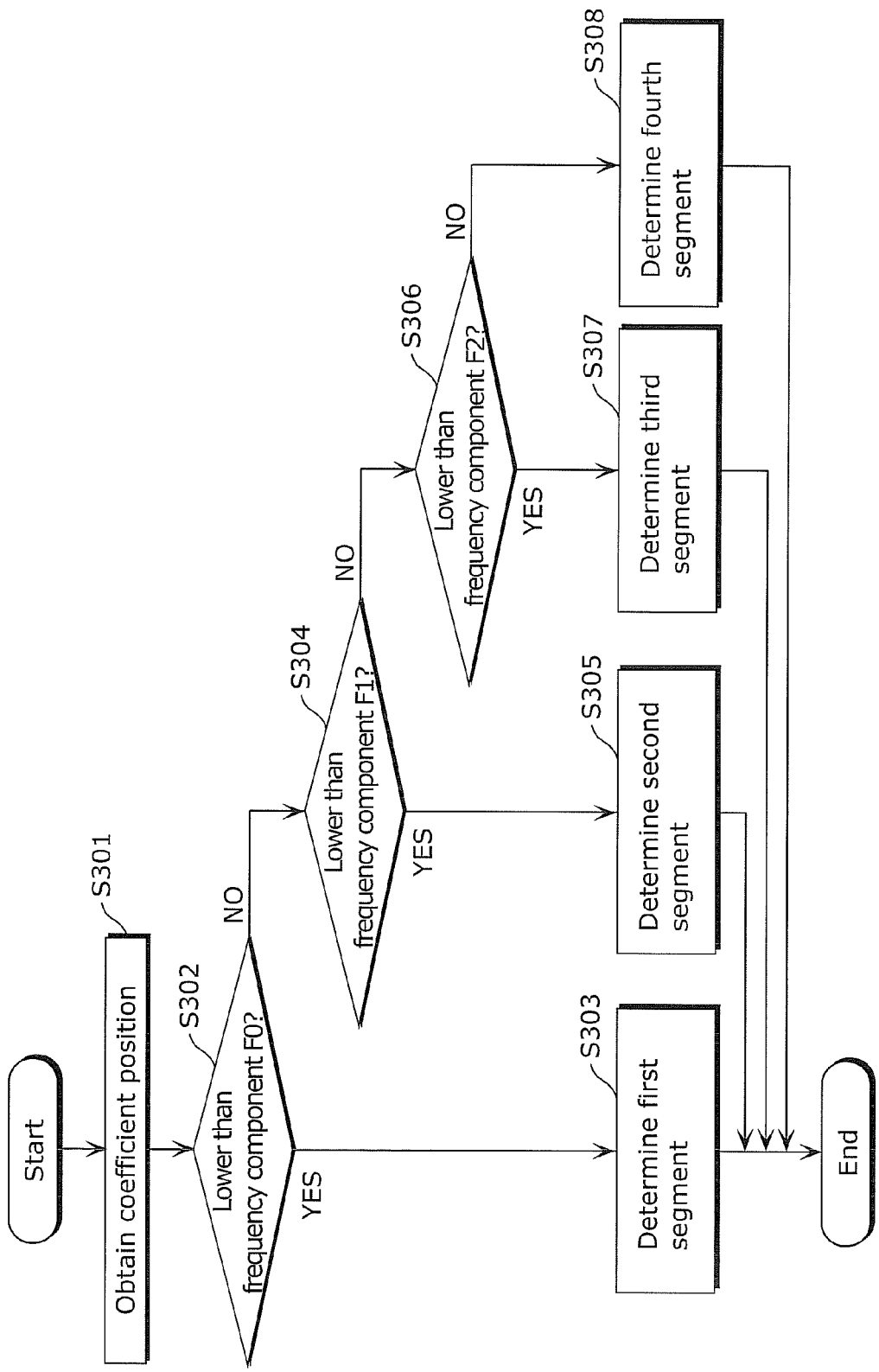
FIG. 8 is a flowchart showing an example of context block segment control according to Embodiment 1 of the present invention.
Figure 9A:
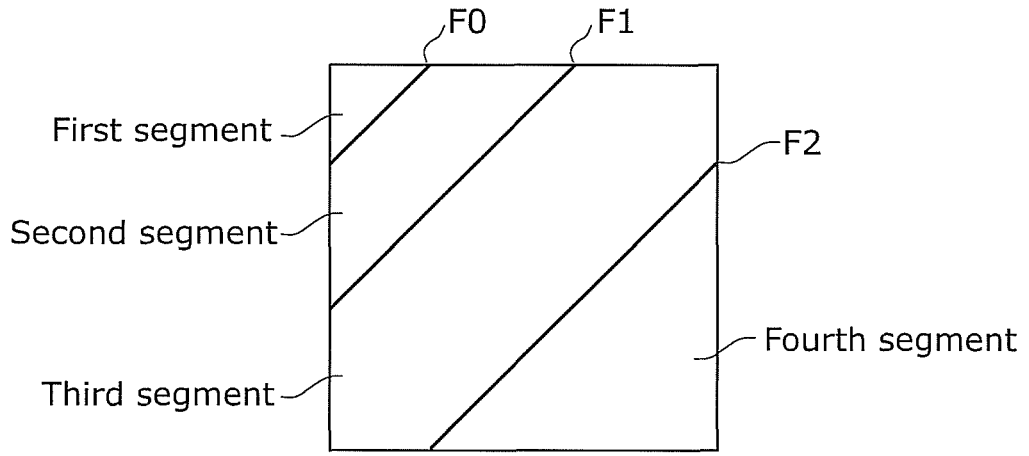
FIG. 9A schematically illustrates an example of context segments according to Embodiment 1 of the present invention.
Figure 9B:
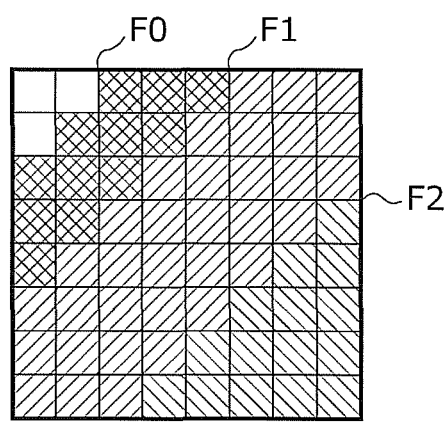
FIG. 9B shows an example of context segments set according to Embodiment 1 of the present invention.
Figure 9C:
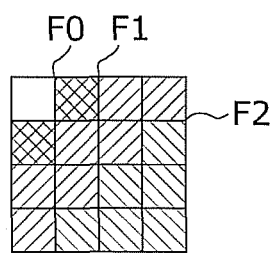
FIG. 9C shows an example of context segments set according to Embodiment 1 of the present invention.

Next, with reference to FIGS. 8 and 9A to 9C, an operation of the context segment control unit 105 (which corresponds to steps S201 to S202 in FIG. 7) is described. FIG. 8 is a flowchart showing an example of the operation of the context segment control unit according to Embodiment 1 of the present invention. FIGS. 9A to 9C each schematically illustrate the operation of the context segment control unit according to Embodiment 1 of the present invention.

The context segment control unit 105 operates as follows in the case where the above-mentioned LastFlag is coded, for example.

The context segment control unit 105 obtains coefficient position information on LastFlag that is to be coded (S301). Next, as indicated in the following Steps S302 to S308, the context segment control unit 105 determines a context based on a frequency component which can be obtained from the coefficient position information on LastFlag.

The quantized coefficient is a signal obtained by frequency-transforming and quantizing an image signal. Thus, the coefficient position corresponds to a frequency component used in the frequency transform. For example, a quantized coefficient corresponding to a low-frequency component is located in the upper-left part while a quantized coefficient corresponding to a high-frequency component is located in the lower-right part.

The plurality of quantized coefficients is read in a particular scan order as described above. Here, the scan order may be a method called zigzag scanning through which the block is read in sequence from the upper-right part toward the lower-left part and at an end of the block, the reading direction changes, as specified in H. 264, for example.

Next, when LastFlag to be coded is included in a region of lower frequency components than a predetermined frequency component F0 (YES in S302), the context segment control unit 105 determines a first segment as a segment of LastFlag to be coded (S303). On the other hand, when LastFlag to be coded is included in a region of higher frequency components than the frequency component F0 (NO in S302), the context segment control unit 105 compares a frequency component corresponding to LastFlag to be coded and a frequency component F1 that is higher in frequency than the frequency component F0 (S304).

Here, when LastFlag to be coded is included in a region of lower frequency components than the frequency component F1 (YES in S304), the context segment control unit 105 determines a second segment as a context of LastFlag to be coded (S305). On the other hand, when LastFlag to be coded is included in a region of higher frequency components than the frequency component F1 (NO in S304), the context segment control unit 105 compares a frequency component corresponding to LastFlag to be coded and a frequency component F2 that is higher in frequency than the frequency component F1 (S306).

Here, when LastFlag to be coded is included in a region of lower frequency components than the frequency component F2 (YES in S306), the context segment control unit 105 determines a third segment as a context of LastFlag to be coded (S307). On the other hand, when LastFlag to be coded is included in a region of higher frequency components than the frequency component F2 (NO in S306), the context segment control unit 105 determines a fourth segment as a context of LastFlag to be coded (S308). Information indicating the segments determined as above is output, as the control signal CTRS, to the context control unit 103.

A low-frequency component including a DC component is a signal that characteristics of an image are most likely to appear. Furthermore, in the low-frequency component including a DC component, SignificantFlag and LastFlag are often present as binary signals. Accordingly, the low-frequency component including a DC component is a frequency component from which statistical information is easily obtained. Thus, setting a smaller segment in the region of low-frequency components than a segment in the region of high-frequency components allows arithmetic coding which uses statistical information more adapted to the characteristics of the image, and thereby allows improvement in the coding efficiency.

With reference to FIGS. 9A to 9C, more details are described. FIG. 9A schematically shows segments set in a block. FIG. 9B shows an example of segments set for coefficients in an 8 by 8 block. FIG. 9C shows an example of segments set for coefficients in a 4 by 4 block. In the figures, F0, F1, and F2 respectively indicate the comparison values in Steps S302, S304, and S306 of FIG. 8.

A square shown in FIG. 9A indicates a block that is a unit of processing. In the block, coefficients are arranged so that their frequency components have frequencies ascending from the upper-left part to the lower-right part. Here, the frequency components F0, F1, and F2 are determined.

The first segment is set for the region of lower frequency components than the frequency component F0. The second segment is set for the region surrounded by the frequency component F0 and the frequency component F1. The third segment is set for the region surrounded by the frequency component F1 and the frequency component F2. The fourth segment for high-frequency components is set for the region of higher frequency components than the frequency component F2.

As above, one certain segment (for example, the first segment) included in a plurality of segments is smaller than a segment (for example, the second, third, or fourth segment) located in a region which is higher in frequency than the one segment. Specifically, the number of coefficients included in the second, third, or fourth segment is larger than the number of coefficients included in the first segment.

At the time of coding LastFlag, the context segment control unit 105 is capable of determining a segment of LastFlag by determining which one of the segments a coefficient corresponding to LastFlag is included.

As shown in FIG. 9A, the block is segmented so that the segment for the low-frequency component is smaller than the segment for the high-frequency component. This is because the quantized coefficient in the low-frequency region is often non-zero, and setting the segments as above allows statistical information to be used with an appropriate balance and thereby allows an increase in the coding efficiency.

FIG. 9B shows an example in which the segments as shown in FIG. 9A are specifically applied to an 8 by 8 block. In this case, the first segment is set for three coefficients in the upper-left part, the second segment is set for coefficients in a region surrounded by F0 and F1, the third segment is set for coefficients in a region surround by F1 and F2, and finally the fourth segment is set for coefficients in a region higher than F2. This also applies to a block of more than 8 by 8.

Meanwhile, FIG. 9C shows an example in which the segments as shown in FIG. 9A are applied to a 4 by 4 block. This case is similar to the case of FIG. 9B except that a coefficient included in the first segment is only a coefficient corresponding to a direct-current (DC) component.

It is to be noted that the segments shown here are an example, and the number of segments and the positions of the segments are not limited to those in the above example as long as a segment located in the low-frequency region is small while a segment located in the high-frequency region is large. For example, a segment located in a region of the lowest frequency may be a segment which includes one coefficient only. Furthermore, for example, the number of segments may be two.

It is to be noted that this segment information (for example, the frequency components F0, F1, and F2, or information indicating the number of segments) may be recorded at the beginning of a bit stream (the stream header). Such recording of the segment information in the stream header allows the segments to be changed according to characteristics of an image, with the result that further improvement of the coding efficiency can be expected.

In addition, the segment information may be recorded in units corresponding to slices or pictures instead of streams. In this case, a more detailed control is available as compared to the case of recording in units of streams, with the result that further improvement of the coding efficiency can be expected.

Figure 10:
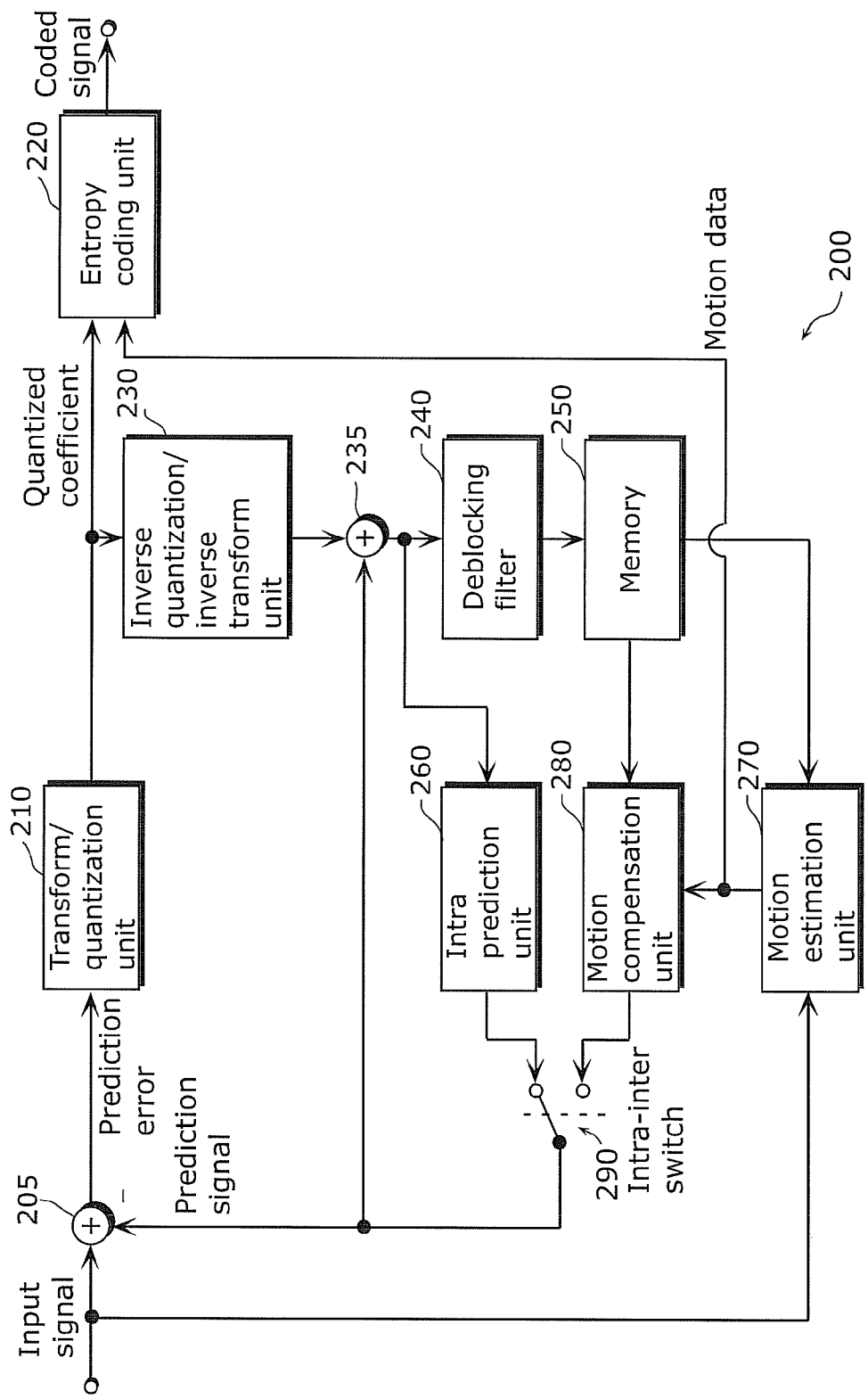
FIG. 10 is a block diagram showing an example of a structure of an image coding apparatus according to Embodiment 1 of the present invention.

The arithmetic coding unit 100 according to Embodiment 1 of the present invention is included in an image coding apparatus which compresses and codes image data. FIG. 10 is a block diagram showing an example of a structure of an image coding apparatus 200 according to Embodiment 1 of the present invention.

The image coding apparatus 200 compresses and codes image data. For example, the image coding apparatus 200 receives, for each block, the image data as an input signal. The image coding apparatus 200 performs transform, quantization, and variable-length coding on the received input signal, to generate a coded signal.

As shown in FIG. 10, the image coding apparatus 200 includes a subtractor 205, a transform/quantization unit 210, an entropy coding unit 220, an inverse quantization/inverse transform unit 230, an adder 235, a deblocking filter 240, a memory 250, an intra prediction unit 260, a motion estimation unit 270, a motion compensation unit 280, and an intra-inter switch 290.

The subtractor 205 calculates a difference between an input signal and a prediction signal, that is, a prediction error.

The transform/quantization unit 210 transforms a prediction error in the spatial domain to generate a transform coefficient in the frequency domain. For example, the transform/quantization unit 210 generates a transform coefficient by performing a discrete cosine transform (DCT) on the prediction error. Furthermore, the transform/quantization unit 210 generates a quantized coefficient by quantizing the transform coefficient. In other words, the transform/quantization unit 210 generates a unit of processing in the frequency domain by frequency-transforming image data. In this unit of processing, a plurality of coefficients is arranged according to their frequency components.

The entropy coding unit 220 generates a coded signal by performing variable-length coding on the quantized coefficient. Furthermore, the entropy coding unit 220 codes motion data (for example, a motion vector) estimated by the motion estimation unit 270 and includes the coded motion data in the coded signal, thereafter outputting the resultant coded signal.

The inverse quantization/inverse transform unit 230 reconstructs the transform coefficient by inverse-quantizing the quantized coefficient. Furthermore, the inverse quantization/inverse transform unit 230 reconstructs the prediction error by inverse-transforming the reconstructed transform coefficient. Because of information loss due to the quantization, the reconstructed prediction error is not identical to the prediction error generated by the subtractor 205. In other words, the reconstructed prediction error includes a quantization error.

The adder 235 generates a local decoded image by adding the reconstructed prediction error and the prediction signal.

The deblocking filter 240 performs deblocking filter process on the generated local decoded image.

The memory 250 is a memory for storing a reference image to be used for motion compensation. Specifically, the memory 250 stores the local decoded image on which the deblocking filter process has been performed.

The intra prediction unit 260 generates a prediction signal (an intra prediction signal) by performing intra prediction. Specifically, the intra prediction unit 260 performs the intra prediction with reference to images around a coding target block (the input signal) in the local decoded image generated by the adder 235, to thereby generate the intra prediction signal.

The motion estimation unit 270 estimates motion data (for example, a motion vector) between the input signal and the reference image stored in the memory 250.

The motion compensation unit 280 generates a prediction signal (an inter prediction signal) by performing motion compensation based on the estimated motion data.

The intra-inter switch 290 selects one of the intra prediction signal and the inter prediction signal and outputs the selected signal as the prediction signal to the subtractor 205 and the adder 235.

With the above structure, the image coding apparatus 200 according to Embodiment 1 of the present invention compresses and codes the image data.

It is to be noted that, in FIG. 10, the arithmetic coding unit 100 according to Embodiment 1 of the present invention is included in the entropy coding unit 220. This means that the arithmetic coding unit 100 performs binarization and arithmetic coding on the quantized coefficient as the input signal SI. The signal type information SE is information which indicates the coefficient position of the quantized coefficient, the motion data shown in FIG. 10, the direction of intra prediction used by the intra prediction unit 260, or the like.

As above, in the image coding apparatus and the image coding method according to Embodiment 1 of the present invention, one or more contexts common to a plurality of coefficients included in a segment which includes a binarized coefficient can be determined as a context for a binary signal. Accordingly, the frequency of updating the probability information corresponding to the context becomes higher, so that statistical information is more likely to be reflected in the probability information. As a result, the accuracy of predicting the probability information can be increased, which allows improvement in the coding efficiency. Furthermore, the number of contexts can be smaller than that in the case where a different context is determined for each coefficient. Thus, it also becomes possible to reduce the size of a memory for storing the probability information corresponding to each context.

Furthermore, in the image coding apparatus and the image coding method according to Embodiment 1 of the present invention, the first segment can be smaller than the second segment located in a region higher in frequency than the first segment. Accordingly, the segments are set according to statistical properties depending on frequency components, which allows a reduction in the number of contexts and at the same time, allows improvement in the accuracy of predicting the probability information. As a result, it becomes possible to improve the coding efficiency.

Although this embodiment describes, as an example, the arithmetic coding on the unit of processing which is 8 by 8 or 4 by 4 in size, the arithmetic coding can be performed in the same or like manner as above also in the case where the unit of processing has another size (for example, 16 by 16 or 32 by 32). As the size of the unit of processing increases, the use of a context common to a plurality of coefficients included in a segment produces a higher effect of reducing the number of contexts.

Furthermore, although LastFlag is coded along with SignificantFlag for each coefficient position at which a non-zero coefficient is present, the coding is not necessarily as above. For example, LastFlag at all the coefficient positions from the coefficient position which is the first in the scan order to the coefficient position of the last non-zero coefficient in the scan order may be collectively coded. For example, in the case where the coefficient which is the fifth in the scan order is the last non-zero coefficient, the binarization unit 101 may generate a binary symbol sequence "00001" as one binary signal. In such a case, a bit position in the binary symbol sequence corresponds to the coefficient position. In other words, the first binary symbol corresponds to a coefficient of the DC component, for example.

(Variation of Embodiment 1)

Next, a variation of Embodiment 1 is described. Embodiment 1 has mainly described the arithmetic coding of the binary signal indicating the position of the last non-zero coefficient in the scan order. However, it is clear that the image coding method according to the present invention is applicable also to arithmetic coding of a binary signal other than LastFlag.

Therefore, for confirmation, this variation describes the case where the present invention is applied to arithmetic coding of a binary signal which indicates, in a way different from LastFlag, the position of the last non-zero coefficient in the scan order. Specifically, this variation describes the arithmetic coding of the binary signal which indicates, using two-dimensional coordinate values, the position of the last non-zero coefficient in the scan order.

The structure and the like of the arithmetic coding unit 100 according to this variation are the same or like as those in Embodiment 1 and therefore are not shown or described as appropriate.

In the case where a binarized coefficient is a last non-zero coefficient in the scan order, the binarization unit 101 according to this variation generates, as a binary signal, a signal indicating the position of that coefficient using two-dimensional coordinate values. Specifically, in this variation, the position of the last non-zero coefficient in the scan order is expressed as two-dimensional coordinate values (x, y).

For example, in the case where the last non-zero coefficient in the scan order is a coefficient of a DC component (a coefficient in the upper-left part), the position of the last non-zero coefficient in scan order is expressed as (0, 0). Each coordinate value of such x and y is, for example, binarized as shown in FIG. 11A.

FIG. 11A shows an example of binarization according to the variation of Embodiment 1 of the present invention. FIG. 11A shows a binary signal corresponding to the x-coordinate value or y-coordinate value (the magnitude of a component) at the position of the last non-zero coefficient in the scan order (the last position). In this variation, truncated unary is treated as a binary signal on which the arithmetic coding is to be performed using a context.

In FIG. 11A, the binarization unit 101 binarizes, for example, a coordinate value "0", thereby generating a binary signal "0". Furthermore, the binarization unit 101 binarizes, for example, a coordinate value "5", thereby generating a binary signal "11110".

It is to be noted that, in FIG. 11A, a binary symbol in brackets indicates a binary symbol which does not always need to be included in the binary signal. Specifically, in the case where the unit of processing has an 8 by 8 size, the binary signal "11111" indicates that the coordinate value is "6" or "7".

Next, a method of determining a context for the binary signal generated as above is described.

The context control unit 103 according to this variation determines, as a context for a binary signal, at least one context common to a plurality of coefficients included in a segment which includes a binarized coefficient, in the same or like manner as in the above Embodiment 1.

Here, a specific example of the context determination method is described with reference to FIGS. 11B and 11C.

FIG. 11B shows an example of a correspondence relationship between a bit position (binIdx) of a binary symbol included in a binary signal and a context index (cntIdx). In FIG. 11B, for example, a context index "0" (cntIdx=0) is determined as a context for a binary symbol at the first bit position (binIdx=0).

It is to be noted that, as mentioned above, the binary symbol at the fifth bit position (binIdx=0) is not required to be included in the binary signal in the case of the unit of processing having the 8 by 8 size. In such a case, the number of bit positions (binIdx=2, 3) corresponding to a context index "2" (cntIdx=2) is larger than the number of bit positions (binIdx=4) corresponding to a context index "3" (cntIdx=3).

Figures 11C, 12:
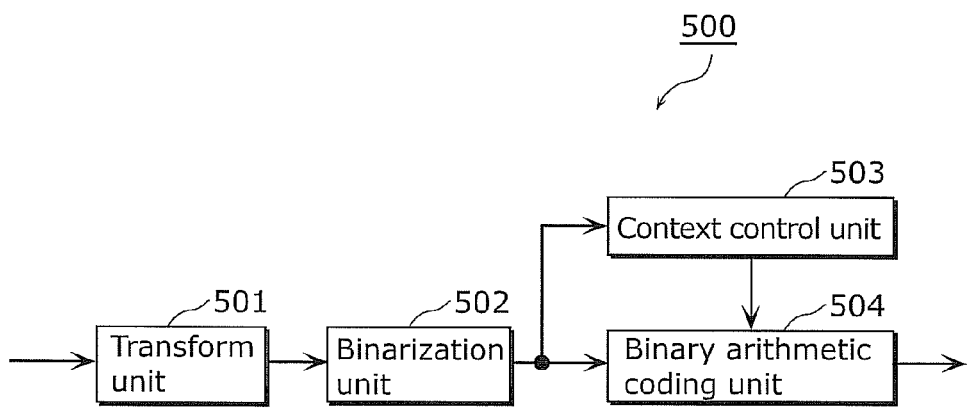
FIG. 11C illustrates an example of a method of determining a context according to the variation of Embodiment 1 of the present invention.
FIG. 12 is a block diagram showing an example of a structure of an image coding apparatus according to an implementation of the present invention.

FIG. 11C illustrates an example of a method of determining a context in the unit of processing having the 8 by 8 size. Specifically, FIG. 11C schematically shows a context determined according to FIGS. 11A and 11B.

In FIG. 11C, a region enclosed by solid lines indicates a segment. Numerals in each segment indicate a context index for a binary signal indicating an x-coordinate value (in the upper level) and a context index for a binary signal indicating a y-coordinate value (in the lower level).

For example, as a context for a binary signal indicating a coefficient position (5, 2), a combination of contexts indicated by context indices "0", "1", "2", and "3" and a combination of contexts indicated by context indices "0", "1", and "2" are determined. Here, a method of determining a context for coding an x-coordinate value "5" is described more specifically. With reference to FIG. 11A, the binary signal indicating the x-coordinate value is "11110". According to FIG. 11B, contexts indicated by context indices "0", "1", and "2" are determined for "1" in the first to the third bits of the binary signal. Furthermore, a context indicated by a context index "3" is determined for "10" in the fourth and the fifth bits of the binary signal. In other words, as shown in FIG. 11C, a combination of the contexts indicated by the context indices "0", "1", "2", and "3" is determined as a context for coding the x-coordinate value "5".

As above, also in this variation, one certain segment (for example, a segment located in a region of the lowest frequency) included in a plurality of segments is smaller than a segment (for example, a segment located in a region of the highest frequency) located in a region which is higher in frequency than the one segment.

As above, the present invention is applicable also to the binary signal indicating, using two-dimensional coordinate values, the position of the last non-zero coefficient in the scan order. Also in the case where the arithmetic coding is performed on the binary signal indicating, using two-dimensional coordinate values, the position of the last non-zero coefficient in the scan order, the same or like effects as those in the above Embodiment 1 can be produced.

It is to be noted that a binary symbol located at a bit position with a large value (binIdx) may be coded without using contexts. For example, a binary symbol having binIdx larger than a predetermined value may be coded in bypass mode using a fixed symbol occurrence probability (for example, 50%).

Although this variation has described the case where the binary signal on which the arithmetic coding is to be performed using a context is truncated unary, the binary signal is not limited to the truncated unary. For example, even in the case where a predetermined binary symbol sequence is prepared for a coordinate value, it is possible to produce the same or like effects as those described above, by determining, in the same or like manner as above, a correspondence relationship of that binary symbol sequence between a bit position (binIdx) and a context index (cntIdx).

Although the image coding apparatus and the image coding method according to an implementation of the present invention have been described based on an embodiment and a variation thereof, the present invention is not limited to these embodiment and variation. Without departing from the scope of the present invention, the present invention includes an embodiment with some modifications on this embodiment that are conceived by a person skilled in the art.

For example, although the arithmetic coding unit 100 includes the context segment control unit 105 in the above Embodiment 1 and a variation thereof, the context segment control unit 105 is not necessarily required. In such a case, for example, the context control unit 103 may directly determine a context from the position information on a coefficient. Specifically, the context control unit 103 may directly determine a context from a coefficient position with reference to such a context table as shown in FIG. 5.

More specifically, the image coding apparatus may be configured as shown in FIG. 12. FIG. 12 is a block diagram showing an example of a structure of an image decoding apparatus 500 according to an implementation of the present invention. As shown in FIG. 12, the image coding apparatus 500 includes a transform unit 501, a binarization unit 502, a context control unit 503, and a binary arithmetic coding unit 504.

Figure 13:
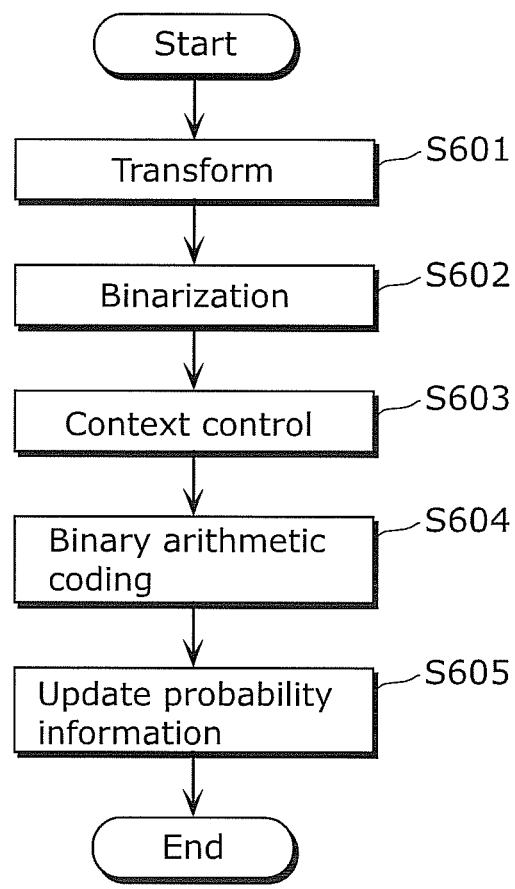
FIG. 13 is a flowchart showing an example of an image coding method according to the implementation of the present invention.

This image coding apparatus 500 performs a coding process as shown in FIG. 13, for example. FIG. 13 is a flowchart showing an example of an image coding method according to the implementation of the present invention.

In FIG. 13, the transform unit 501 corresponds to the transform/quantization unit 210. The transform unit 501 frequency-transforms image data to generate a unit of processing in a frequency domain (S601). The binarization unit 502 binarizes a coefficient included in the unit of processing, to generate a binary signal (S602). The context control unit 503 determines, as a context for the binary signal, one or more contexts common to a plurality of coefficients included in a segment which is one of a plurality of segments obtained by dividing the unit of processing and includes a binarized coefficient (S603). The binary arithmetic coding unit 504 corresponds to the binary arithmetic coder 104. The binary arithmetic coding unit 504 performs the arithmetic coding on the binary signal according to the probability information which corresponds to the determined context (S604). The context control unit 503 updates, based on the binary signal, the probability information which corresponds to the determined context (S605).

Even in the case where the coding process is performed as above, the image coding apparatus 500 is capable of determining, as a context for a binary signal, a context common to a plurality of coefficients included in a segment which includes a binarized coefficient. Thus, with the image coding apparatus 500, the accuracy of predicting the probability information can be increased, which allows improvement in the coding efficiency.

Embodiment 2

Next, an outline of an arithmetic decoding method according to Embodiment 2 of the present invention is described. In the image decoding method according to this embodiment, image data coded by the image coding method according to Embodiment 1 is decoded. Specifically, coded image data resulting from arithmetic coding using a symbol occurrence probability which is set for each segment obtained by appropriately dividing a unit of processing based on its frequency components is decoded. With this, in performing arithmetic coding on a coefficient included in each segment, the symbol occurrence probability based on common statistical information can be used to perform the arithmetic coding, which allows improvement in the coding efficiency. Thus, the image decoding method according to this embodiment makes it possible to decode a signal coded with improved coding efficiency.

The above is a description about the outline of the arithmetic decoding method according to this embodiment.

Figure 14:
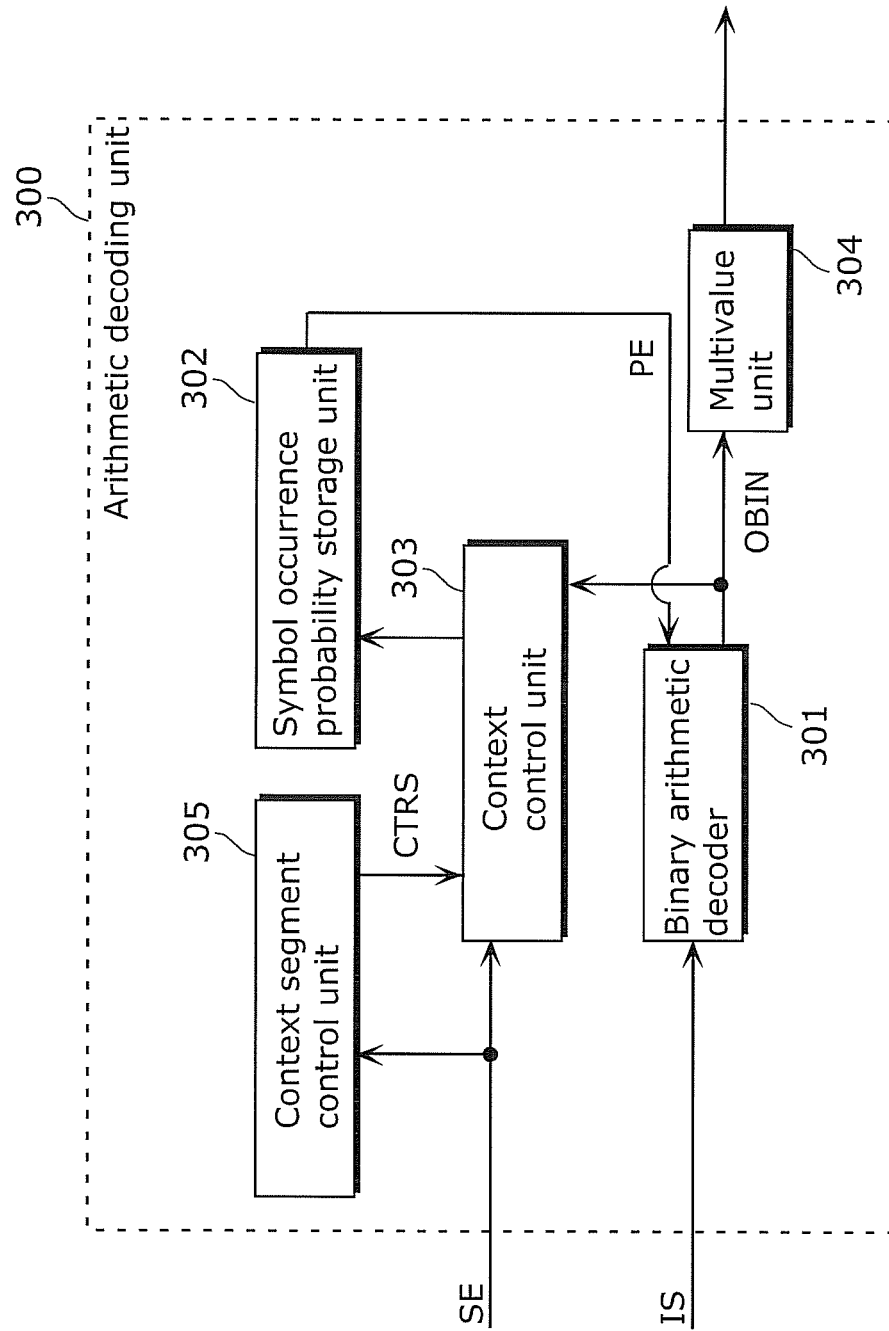
FIG. 14 is a block diagram showing an example of a structure of an arithmetic decoding unit according to Embodiment 2 of the present invention.

Next, a structure of an arithmetic decoding unit which performs the arithmetic decoding method according to this embodiment is described. FIG. 14 is a block diagram showing an example of a structure of an arithmetic decoding unit 300 according to Embodiment 2 of the present invention. As will be described below, the arithmetic decoding unit 300 according to Embodiment 2 of the present invention corresponds to a part of an image decoding apparatus which decodes compressed and coded image data.

As shown in FIG. 14, the arithmetic decoding unit 300 includes a binary arithmetic decoder 301, a symbol occurrence probability storage unit 302, a context control unit 303, a multivalue unit 304, and a context segment control unit 305. The arithmetic decoding unit 300 performs arithmetic decoding on an input stream IS that is a decoding target signal, and outputs reconstructed image data. Furthermore, the arithmetic decoding unit 300 receives signal type information SE indicating a type of the input stream IS.

The input stream IS is a decoding target signal of coded image data and, for example, is a signal which indicates a quantized coefficient generated by compressing and coding image data. Specifically, the input stream IS corresponds to a signal generated by performing the arithmetic coding on the input signal SI according to Embodiment 1.

The signal type information SE is an example of type information on the decoding target signal of the coded image data. Specifically, the signal type information SE is information indicating a type of the input stream IS. More specifically, the signal type information SE is information similar to the signal type information SE according to Embodiment 1. In other words, in the case where the input stream IS is a signal involving a transform coefficient (for example, a quantized coefficient), the signal type information SE includes position information indicating a position of the transform coefficient (a coefficient position) within the unit of processing.

The binary arithmetic decoder 301 generates a binary signal by performing arithmetic decoding on the decoding target signal using decoding probability information. Specifically, the binary arithmetic decoder 301 generates an output binary signal OBIN by performing the arithmetic decoding on the input stream IS using the symbol occurrence probability PE outputted by the symbol occurrence probability storage unit 302.

The symbol occurrence probability storage unit 302 is a memory or the like which holds a plurality of symbol occurrence probabilities. For example, the symbol occurrence probability storage unit 302 holds a symbol occurrence probability table. The symbol occurrence probability table is a table in which contexts and probability information are associated. The symbol occurrence probability table is, for example, the table shown in FIG. 4. The details of the symbol occurrence probability table are similar to those in Embodiment 1.

Furthermore, the symbol occurrence probability storage unit 302 holds a context table. The context table is a table in which types of the decoding target signal and contexts are associated, and is, for example, the table shown in FIG. 5. The details of the context table are similar to those in Embodiment 1.

The context control unit 303 determines a context based on the type of the decoding target signal. Specifically, first, the context control unit 303 obtains the signal type information SE and also obtains a control signal CTRS from the context segment control unit 305. The context control unit 303 then determines a context for the decoding target signal by referring to the context table based on the obtained control signal CTRS and the obtained signal type information SE indicating the type of the input stream IS.

At this time, the context control unit 303 determines a context based on the segment designated by the control signal CTRS. Here, in the case where one segment includes a plurality of coefficients, the context control unit 303 determines a context common to these coefficients. Specifically, the context control unit 303 determines, as a context for the decoding target signal, a context common to a plurality of coefficients included in a segment which is one of a plurality of segments obtained by dividing the unit of processing and includes the position indicated by the position information. The context control unit 303 may hold the context table. An operation of the context segment control unit 305 will be described later.

Furthermore, the context control unit 303 determines the decoding probability information which corresponds to the determined context. Specifically, by referring to the symbol occurrence probability table, the context control unit 303 determines which one of the plurality of symbol occurrence probabilities stored in the symbol occurrence probability storage unit 302 is to be used. The decoding probability information is probability information to be used in the arithmetic decoding of the binary signal obtained by the arithmetic coding. Specifically, the decoding probability information indicates an index indicating a value of the symbol occurrence probability or indicates a value of the symbol occurrence probability, for example. In the following, the decoding probability information is also referred to simply as probability information.

The symbol occurrence probability determined by the context control unit 303 as corresponding to the context as above is output from the symbol occurrence probability storage unit 302 to the binary arithmetic decoder 301. A specific operation of the context control unit 303 is similar to that of the context control unit 103 according to Embodiment 1.

The mutlivalue unit 304 reconstructs the image data by converting, into multi-values, the output binary signal OBIN generated by the binary arithmetic decoder 301. A method of conversion into multi-values is determined based on the signal type information SE.

The above is a description about the structure of the arithmetic decoding unit 300 according to this embodiment.

Figure 15:
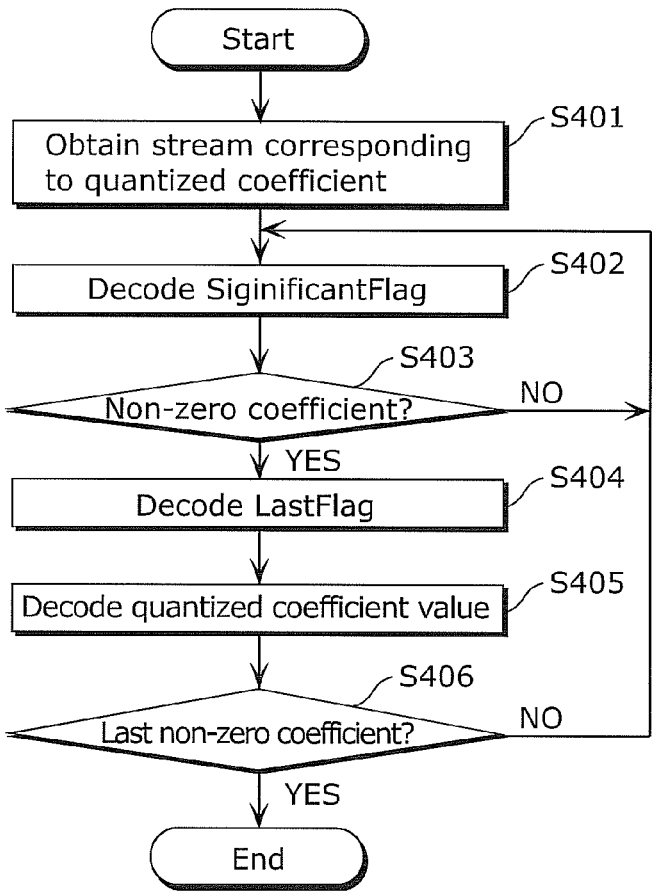
FIG. 15 is a flowchart showing an example of an arithmetic decoding method according to Embodiment 2 of the present invention.

Next, the arithmetic decoding method which the arithmetic decoding unit 300 shown in FIG. 14 performs is described with reference to the flowcharts shown in FIGS. 15 and 16. FIG. 15 is a flowchart showing an example of the arithmetic decoding method according to Embodiment 2 of the present invention. Furthermore, FIG. 15 shows arithmetic decoding applied in the case where the decoding target signal forms a quantized coefficient group which corresponds to one block, and information on whether a coefficient in the quantized coefficient group corresponding to the one block is zero or non-zero is decoded.

As shown in FIG. 15, in the arithmetic decoding method according to this embodiment, the arithmetic decoding unit 300 first obtains the input stream IS that is to be decoded (S401). Specifically, the input stream IS includes coded quantized coefficients scanned in a predetermined scan order. In such a case, the input stream IS includes a coded binary signal which expresses, as "0" or "1", whether or not the quantized coefficient is a non-zero coefficient (a coefficient which is not zero). A signal indicating whether this quantized coefficient is a non-zero coefficient is referred to as SignificantFlag.

Here, in the case where the quantized coefficient is a non-zero coefficient, the coded binary signal expresses, as "0" or "1", whether or not there is still any coefficient which is a non-zero coefficient, following the non-zero coefficient in the above-mentioned scan order. Here, this binary signal is referred to as LastFlag. This LastFlag is information indicating the position of the last non-zero coefficient in the scan order. A case of decoding the signal coded in the method as above is described.

Next, the arithmetic decoding unit 300 performs arithmetic decoding on SignificantFlag (S402). The arithmetic decoding may be the same method as that in H. 264, for example. Next, when the decoded signal indicates a zero coefficient (NO in S403), the arithmetic decoding unit 300 performs processing on next SignificantFlag. On the other hand, when the decoded signal indicates that the decoding target coefficient is a non-zero coefficient (YES in S403), the arithmetic decoding unit 300 performs arithmetic decoding on LastFlag that indicates whether this non-zero coefficient is the last non-zero coefficient in the scan order (S404). Details of the arithmetic decoding will be described later. Next, the arithmetic decoding unit 300 performs decoding on information on a coefficient value (a coefficient level) of the non-zero coefficient (S405). Here, a method for the decoding on the coefficient level of the non-zero coefficient is the same method as that in H. 264, for example.

Here, when the decoded signal indicates that the decoding target coefficient is not the last non-zero coefficient in the scan order (NO in S406), the arithmetic decoding unit 300 performs processing on next SignificantFlag. On the other hand, when the decoded signal indicates that the decoding target coefficient is the last non-zero coefficient in the scan order (YES in S406), the processing on one block ends.

Figure 16:
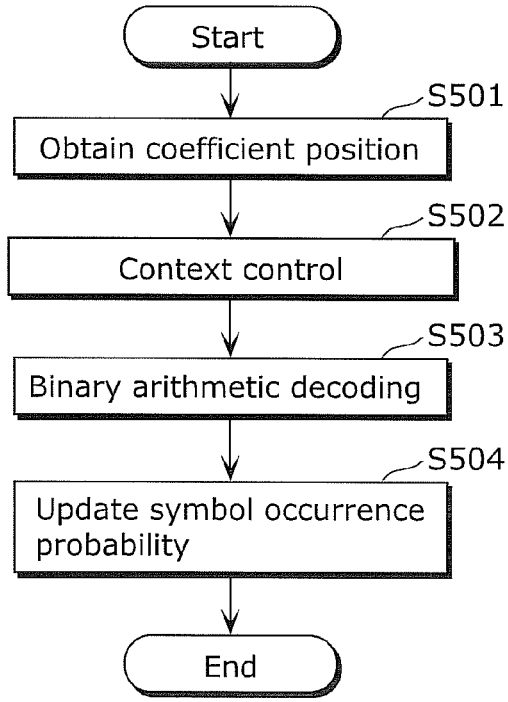
FIG. 16 is a flowchart showing an example of the arithmetic decoding method according to Embodiment 2 of the present invention.

Furthermore, FIG. 16 shows arithmetic decoding of one decoding target signal. For example, one decoding target signal shows one value of the above-mentioned LastFlag.

As shown in FIG. 16, in the arithmetic decoding method according to this embodiment, the context segment control unit 305 first obtains the signal type information SE including the position information (S501).

Next, the context segment control unit 305 determines in which one of segments the coefficient is included, based on the obtained position information, and thereafter outputs the control signal CTRS indicating the determined segment. The context control unit 303 determines, as a context which corresponds to the decoding target signal, a context which corresponds to a segment indicated by the control signal CTRS obtained from the context segment control unit 305 (S502). In other words, the context control unit 303 selects a context for performing arithmetic decoding on the decoding target signal from among the plurality of contexts stored in the symbol occurrence probability unit 302.

Next, the symbol occurrence probability storage unit 302 reads the symbol occurrence probability determined by the context control unit 303 as corresponding to the context and outputs the symbol occurrence probability to be used for the arithmetic decoding.

The binary arithmetic decoder 301 generates an output binary signal OBIN by performing the arithmetic decoding on the decoding target signal using the decoding probability information (S503). Specifically, the binary arithmetic decoder 301 performs the arithmetic decoding on the decoding target signal by the method specified in the H. 264 standard, using the symbol occurrence probability outputted from the symbol occurrence probability storage unit 302.

Details of the operations of the context segment control unit 305 and the context control unit 303 are similar to the context control performed in the coding according to Embodiment 1.

The context control unit 303 updates the probability information based on the output binary signal OBIN (S504). Specifically, according to the output binary signal OBIN generated by the binary arithmetic decoder 301, the context control unit 303 updates the symbol occurrence probability which is stored in the symbol occurrence probability storage unit 302 and corresponds to the determined context. An updating method is similar to the method applied in Embodiment 1.

The multivalue unit 304 reconstructs the image data by converting, into multi-values, the output binary signal OBIN.

By adopting the above method, it becomes possible to decode the signal coded with the improved coding efficiency.

Figure 17:
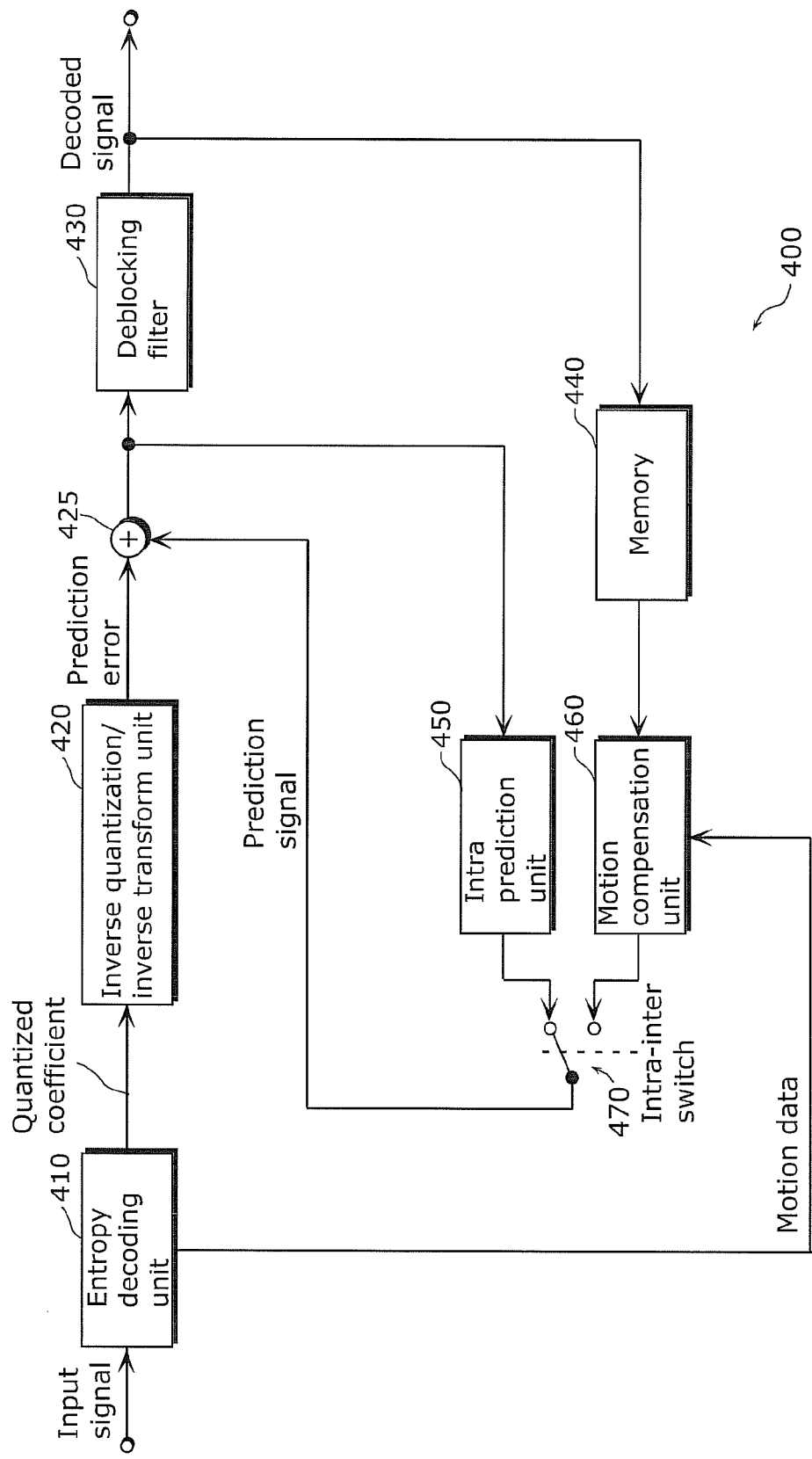
FIG. 17 is a block diagram showing an example of a structure of an image decoding apparatus according to Embodiment 2 of the present invention.

The arithmetic decoding unit 300 according to Embodiment 2 of the present invention is included in an image decoding apparatus which decodes compressed and coded image data. FIG. 17 is a block diagram showing an example of a structure of an image decoding apparatus 400 according to Embodiment 2 of the present invention.

The image decoding apparatus 400 decodes compressed and coded image data. For example, the image decoding apparatus 400 receives, for each block, the coded image data as the decoding target signal. The image decoding apparatus 400 performs variable-length decoding, inverse quantization, and inverse transform on the received decoding target signal, to reconstruct the image data.

As shown in FIG. 17, the image decoding apparatus 400 includes an entropy decoding unit 410, an inverse quantization/inverse transform unit 420, an adder 425, a deblocking filter 430, a memory 440, an intra prediction unit 450, a motion compensation unit 460, and an intra-inter switch 470.

The entropy decoding unit 410 performs the variable-length decoding on the input signal (the input stream) to reconstruct the quantized coefficient. Here, the input signal (the input stream) is the decoding target signal and corresponds to data of each block of the coded image data. Furthermore, the entropy decoding unit 410 obtains motion data from the input signal and outputs the obtained motion data to the motion compensation unit 460.

The inverse quantization/inverse transform unit 420 reconstructs the transform coefficient by inverse-quantizing the quantized coefficient reconstructed by the entropy decoding unit 410. Furthermore, the inverse quantization/inverse transform unit 420 reconstructs the prediction error by inverse-transforming the reconstructed transform coefficient.

The adder 425 generates a decoded image by adding the reconstructed prediction error and the prediction signal.

The deblocking filter 430 performs deblocking filter process on the generated decoded image. The decoded image on which the deblocking filter process has been performed is output as a decoded signal.

The memory 440 is a memory for storing a reference image to be used for motion compensation. Specifically, the memory 440 stores the decoded image on which the deblocking filter process has been performed.

The intra prediction unit 450 generates a prediction signal (an intra prediction signal) by performing intra prediction. Specifically, the intra prediction unit 450 performs the intra prediction with reference to images around a decoding target block (the input signal) in the decoded image generated by the adder 425, to thereby generate the intra prediction signal.

The motion compensation unit 460 generates a prediction signal (an inter prediction signal) by performing motion compensation based on the motion data outputted from the entropy decoding unit 410.

The intra-inter switch 470 selects one of the intra prediction signal and the inter prediction signal and outputs the selected signal as the prediction signal to the adder 425.

With the above structure, the image decoding apparatus 400 according to Embodiment 2 of the present invention decodes compressed and coded image data.

It is to be noted that, in FIG. 17, the arithmetic coding unit 300 according to Embodiment 2 of the present invention is included in the entropy decoding unit 410. This means that the arithmetic decoding unit 300 performs the arithmetic decoding and multivalue conversion on the coded image data, in form of the input stream IS, on which the prediction coding has been executed. The signal type information SE is information which indicates the position of the quantized coefficient, the motion data, the direction of intra prediction used by the intra prediction unit 450, or the like.

It is to be noted that, in the case where segment information (the information indicating frequency components F0, F1, and F2, or the number of segments) has been recorded at the beginning of a bit stream (the stream header), it may be possible that the context segment control unit 105 or the context control unit 103 sets segments according to that recorded segment information. This allows the image decoding apparatus 400 to decode a stream coded with further improved coding efficiency.

In addition, even when the segment information has been recorded in units corresponding to slices or pictures instead of streams, the image decoding apparatus 400 is capable of performing the decoding in the same or like manner as above.

As above, in the image decoding apparatus and the image decoding method according to Embodiment 2 of the present invention, one or more contexts common to a plurality of coefficients included in a segment which includes a position indicated by position information can be determined as a context for the decoding target signal. Accordingly, the frequency of updating the probability information corresponding to the context becomes higher, so that statistical information is more likely to be reflected in the probability information. As a result, the accuracy of predicting the probability information can be increased, which allows improvement in the coding efficiency. This makes it possible to correctly decode a signal coded with improved coding efficiency.

Specifically, in the image decoding apparatus and the image decoding method according to Embodiment 2 of the present invention, a context can be determined based on segments which have a statistically good balance of symbol occurrence probabilities according to frequency components as indicated in Embodiment 1. This allows a reduction in the number of contexts and at the same time, allows the use of the probability information which reflects appropriate statistical information, with the result that the coding efficiency of coded image data can be increased. Thus, in the image decoding apparatus and the image decoding method according to Embodiment 2 of the present invention, image data coded with improved coding efficiency can be correctly decoded.

Although the image decoding apparatus and the image decoding method according to an implementation of the present invention have been described based on an embodiment and a variation thereof, the present invention is not limited to these embodiment and variation. Without departing from the scope of the present invention, the present invention includes an embodiment with some modifications on this embodiment that are conceived by a person skilled in the art.

For example, as in the case of the variation of Embodiment 1, it is clear that the image decoding method according to the present invention is applicable also to decoding of a coded stream which includes a signal obtained by arithmetic coding on a binary signal other than LastFlag. Specifically, in this embodiment, when one of the coefficients included in a unit of processing and scanned in a predetermined scan order is the last non-zero coefficient in the scan order, the decoding target signal may be a signal which indicates the position of that one coefficient using a coordinate value.

In such a case, it is sufficient that a context is determined in a manner similar to that in the variation of Embodiment 1. Specifically, it is sufficient that a context is determined as shown in FIGS. 11A to 11C, for example. It is to be noted that, in such a case, a signal obtained by coding a binary symbol located at a bit position with a large value (binIdx) may be decoded without using contexts. For example, a signal obtained by coding a binary symbol having a value at the bit position larger than a predetermined value may be decoded in bypass mode using a fixed symbol occurrence probability (for example, 50%).

Although this variation has described the case where the signal on which the arithmetic decoding is to be performed using a context is a signal obtained by performing the arithmetic coding on truncated unary, the signal on which the arithmetic decoding is to be performed is not limited to the above signal. For example, even in the case where arithmetic decoding is performed on a signal obtained by performing the arithmetic coding on a predetermined binary symbol sequence, it is possible to produce the same or like effects as those described above, by determining, in the same or like manner as above, a correspondence relationship of that binary symbol sequence between a bit position (binIdx) and a context index (cntIdx).

Furthermore, although the arithmetic decoding unit 300 includes the context segment control unit 305 in this embodiment, the context segment control unit 305 is not necessarily required. In such a case, for example, the context control unit 303 may directly determine a context from the position information on a coefficient. Specifically, the context control unit 303 may directly determine a context from a coefficient position with reference to such a context table as shown in FIG. 5.

Figure 18:
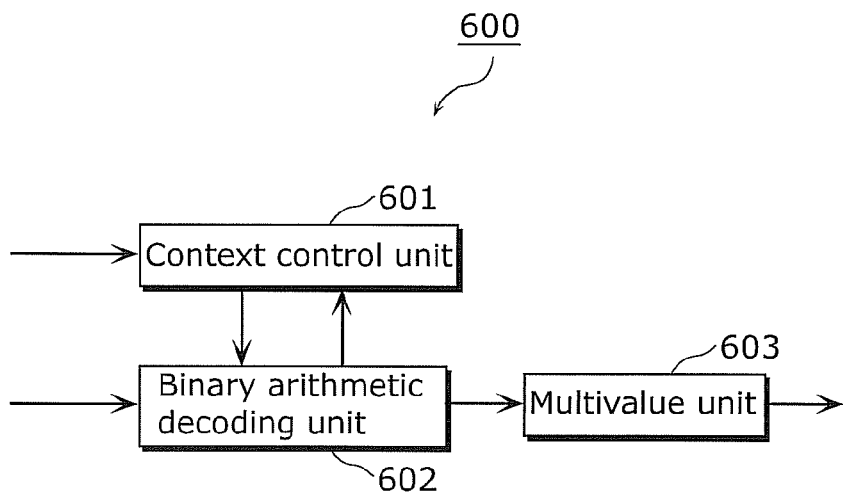
FIG. 18 is a block diagram showing an example of a structure of an image decoding apparatus 600 according to an implementation of the present invention.

More specifically, the image decoding apparatus may be configured as shown in FIG. 18. FIG. 18 is a block diagram showing an example of a structure of an image decoding apparatus 600 according to an implementation of the present invention. As shown in FIG. 18, the image decoding apparatus 600 includes a context control unit 601, a binary arithmetic decoding unit 602, and a multivalue unit 603.

Figure 19:
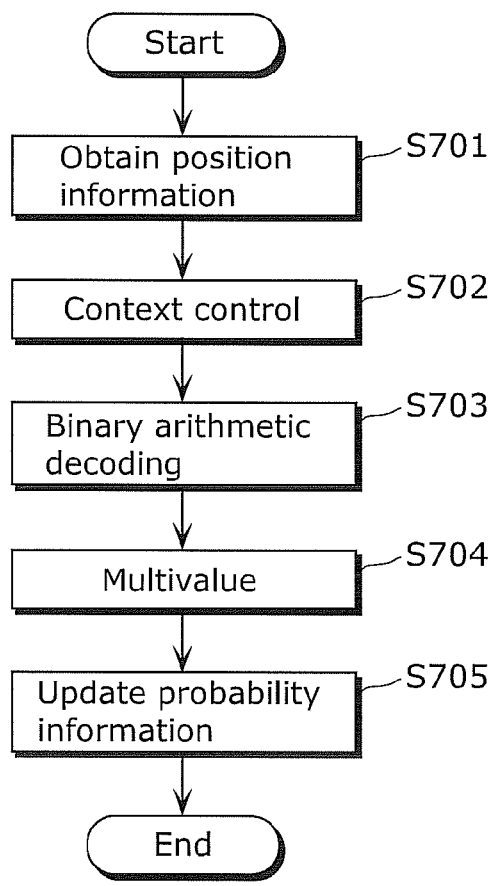
FIG. 19 is a flowchart showing an example of an image decoding method according to the implementation of the present invention.

This image decoding apparatus 600 performs a decoding process as shown in FIG. 19, for example. FIG. 19 is a flowchart showing an example of an image decoding method according to the implementation of the present invention.

In FIG. 19, when the decoding target signal included in coded image indicates a coefficient included in a unit of processing in the frequency domain, the context control unit 601 obtains position information indicating the position of that coefficient within the unit of processing (S701). The context control unit 601 determines, as a context for the decoding target signal, one or more contexts common to a plurality of coefficients included in a segment which is one of a plurality of segments obtained by dividing the unit of processing and includes the position indicated by the position information (S702). The binary arithmetic decoding unit 602 corresponds to the binary arithmetic decoder 301. The binary arithmetic decoding unit 602 generates a binary signal by performing arithmetic decoding on the decoding target signal according to the probability information which corresponds to the determined context (S703). The mutlivalue unit 603 converts the binary signal into multi-values (S704). The context control unit 601 updates, based on the binary signal, the probability information which corresponds to the determined context (S705).

Even in the case where the decoding process is performed as above, the image decoding apparatus 600 is capable of determining, as a context for the decoding target signal, one or more contexts common to a plurality of coefficients included in a segment which includes a position indicated by position information. As a result, with the image decoding apparatus 600, the accuracy of predicting the probability information can be increased, which makes it possible to decode image data coded with improved coding efficiency.

In addition, although the first segment is smaller than the second segment located in a region higher in frequency than the first segment in Embodiment 1, a variation thereof, and Embodiment 2 described above, the first segment is not necessarily required to be smaller than the second segment. For example, the first segment may have the same size as the second segment. Furthermore, for example, the first segment may be larger than the second segment. Even in such a case, coding is performed using a context common to a plurality of coefficients included in each segment, with the result that the accuracy of predicting the probability information can be increased, which allows a reduction in the memory size.

Embodiment 3

The processing described in each of Embodiments can be simply implemented in an independent computer system, by recording, in a recording medium, a program for implementing the configurations of the moving picture coding method (the image coding method) and the moving picture decoding method (the image decoding method) described in Embodiments. The recording media may be any recording media as long as the program can be recorded, such as a magnetic disk, an optical disk, a magnetic optical disk, an IC card, and a semiconductor memory.

Hereinafter, the applications to the moving picture coding method (the image coding method) and the moving picture decoding method (the image decoding method) described in Embodiments and systems using them will be described. This system is characterized by including a image coding and decoding apparatus composed of the image coding apparatus using the image coding method and the image decoding apparatus using the image decoding method. The other structure of the system can be appropriately changed depending on situations.

Figure 20:
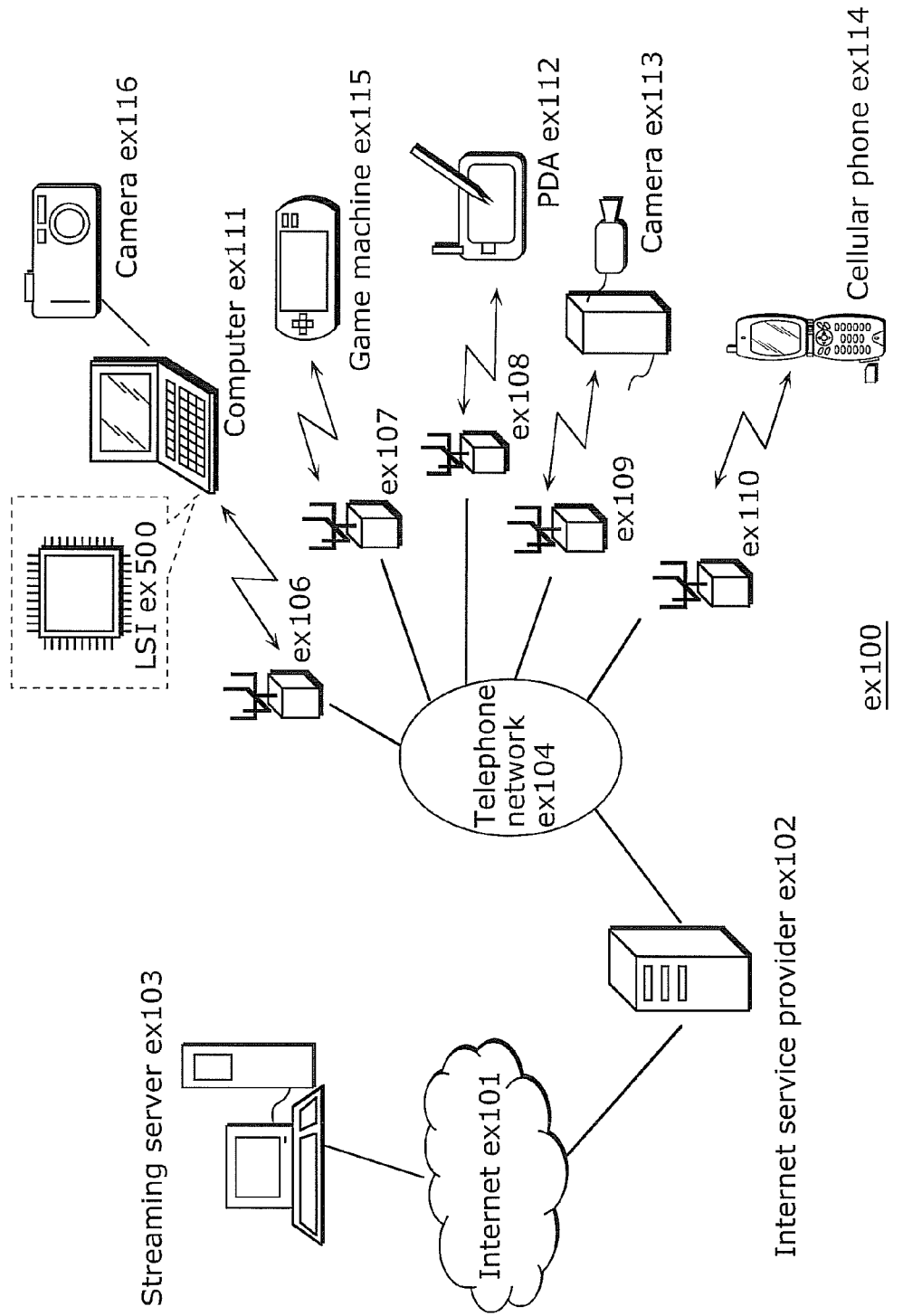
FIG. 20 illustrates an overall configuration of a content providing system for implementing content distribution services.

FIG. 20 illustrates an overall configuration of a content providing system ex100 for implementing content distribution services. The area for providing communication services is divided into cells of desired size, and base stations ex107, ex108, ex109, and ex110 which are fixed wireless stations are placed in each of the cells.

The content providing system ex100 is connected to devices, such as a computer ex111, a personal digital assistant (PDA) ex112, a camera ex113, a cellular phone ex114 and a game machine ex115, via the Internet ex101, an Internet service provider ex102, a telephone network ex104, as well as the base stations ex106 to ex110, respectively.

However, the configuration of the content providing system ex100 is not limited to the configuration shown in FIG. 20, and a combination in which any of the elements are connected is acceptable. In addition, each device may be directly connected to the telephone network ex104, rather than via the base stations ex106 to ex110 which are the fixed wireless stations. Furthermore, the devices may be interconnected to each other via a short distance wireless communication and others.

The camera ex113, such as a digital video camera, is capable of capturing video. A camera ex116, such as a digital video camera, is capable of capturing both still images and video. Furthermore, the cellular phone ex114 may be the one that meets any of the standards such as Global System for Mobile Communications (GSM) (registered trademark), Code Division Multiple Access (CDMA), Wideband-Code Division Multiple Access (W-CDMA), Long Term Evolution (LTE), and High Speed Packet Access (HSPA). Alternatively, the cellular phone ex114 may be a Personal Handyphone System (PHS).

In the content providing system ex100, a streaming server ex103 is connected to the camera ex113 and others via the telephone network ex104 and the base station ex109, which enables distribution of images of a live show and others. In such a distribution, a content (for example, video of a music live show) captured by the user using the camera ex113 is coded as described above in Embodiments (that is, the system functions as the image coding apparatus according to an implementation of the present invention), and the coded content is transmitted to the streaming server ex103. On the other hand, the streaming server ex103 carries out stream distribution of the transmitted content data to the clients upon their requests. The clients include the computer ex111, the PDA ex112, the camera ex113, the cellular phone ex114, and the game machine ex115 that are capable of decoding the above-mentioned coded data. Each of the devices that have received the distributed data decodes and reproduces the received data (that is, the system functions as the image decoding apparatus according to the implementation of the present invention).

The captured data may be coded by the camera ex113 or the streaming server ex103 that transmits the data, or the coding processes may be shared between the camera ex113 and the streaming server ex103. Similarly, the distributed data may be decoded by the clients or the streaming server ex103, or the decoding processes may be shared between the clients and the streaming server ex103. Furthermore, the data of the still images and video captured by not only the camera ex113 but also the camera ex116 may be transmitted to the streaming server ex103 through the computer ex111. The coding processes may be performed by the camera ex116, the computer ex111, or the streaming server ex103, or shared among them.

Furthermore, the coding and decoding processes may be performed by an LSI ex500 generally included in each of the computer ex111 and the devices. The LSI ex500 may be configured of a single chip or a plurality of chips. Software for coding and decoding video may be synthesized into some type of a recording medium (such as a CD-ROM, a flexible disk, and a hard disk) that is readable by the computer ex111 and others, and the coding and decoding processes may be performed using the software. Furthermore, when the cellular phone ex114 is equipped with a camera, the image data obtained by the camera may be transmitted. The video data is data coded by the LSI ex500 included in the cellular phone ex114.

Furthermore, the streaming server ex103 may be composed of servers and computers, and may decentralize data and process the decentralized data, record, or distribute data.

As described above, the clients may receive and reproduce the coded data in the content providing system ex100. In other words, the clients can receive and decode information transmitted by the user, and reproduce the decoded data in real time in the content providing system ex100, so that the user who does not have any particular right and equipment can implement personal broadcasting.

Figure 21:
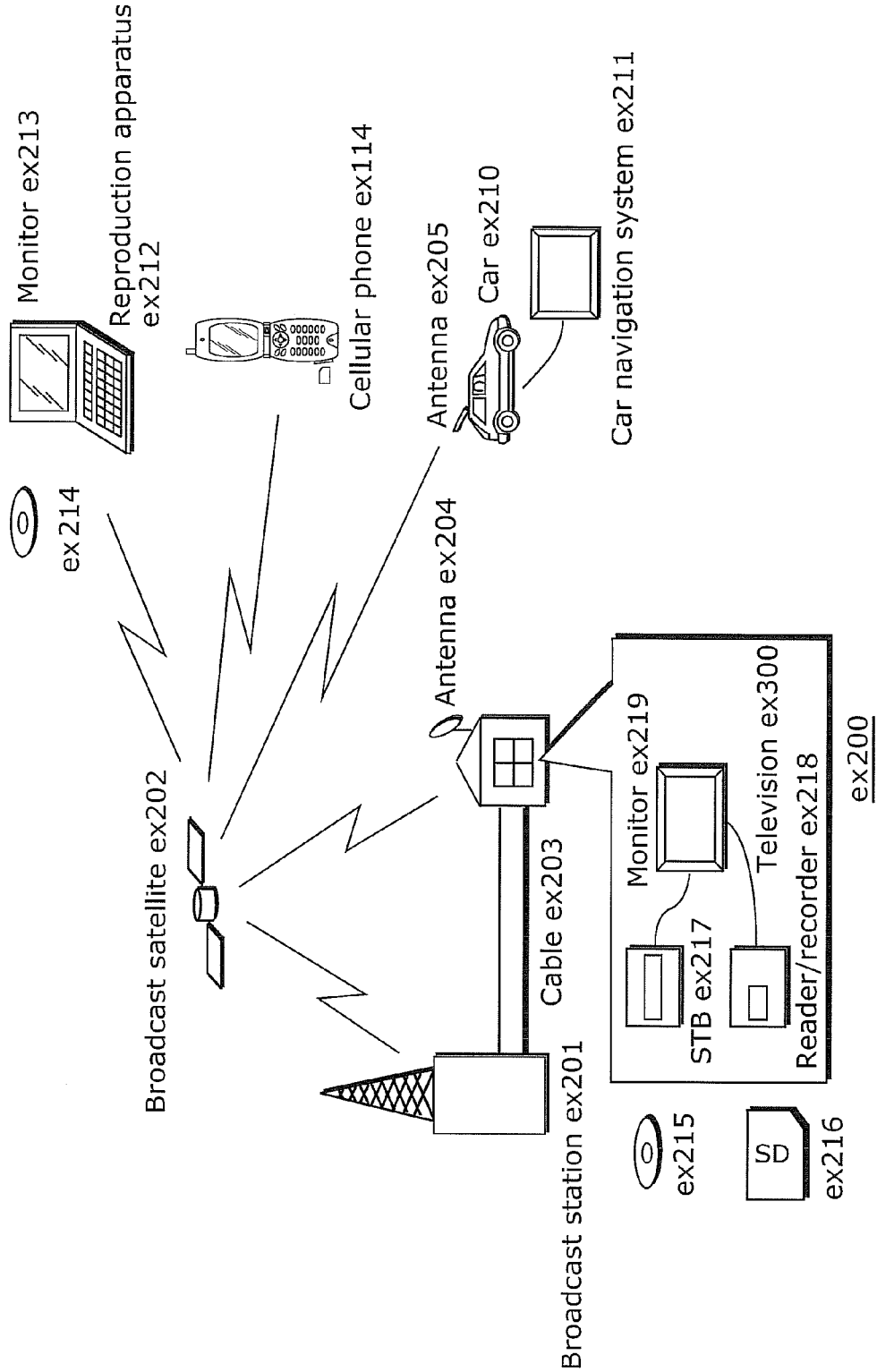
FIG. 21 illustrates an overall configuration of a digital broadcasting system.

Aside from the example of the content providing system ex100, at least one of the moving picture coding apparatus (the image coding apparatus) and the moving picture decoding apparatus (the image decoding apparatus) described in each of Embodiments may be implemented in a digital broadcasting system ex200 illustrated in FIG. 21. More specifically, a broadcast station ex201 communicates or transmits, via radio waves to a broadcast satellite ex202, multiplexed data obtained by multiplexing audio data and others onto video data. The video data is data coded by the moving picture coding method described in each of Embodiments (that is, the video data is data coded by the image coding apparatus according to an implementation of the present invention). Upon receipt of the multiplexed data, the broadcast satellite ex202 transmits radio waves for broadcasting. Then, a home-use antenna ex204 with a satellite broadcast reception function receives the radio waves. Next, a device such as a television (receiver) ex300 and a set top box (STB) ex217 decodes the received multiplexed data, and reproduces the decoded data (that is, the system functions as the image decoding apparatus according to an implementation of the present invention).

Furthermore, a reader/recorder ex218 (i) reads and decodes the multiplexed data recorded on a recording media ex215, such as a DVD and a BD, or (ii) codes video signals in the recording medium ex215, and in some cases, writes data obtained by multiplexing an audio signal on the coded data. The reader/recorder ex218 can include the moving picture decoding apparatus or the moving picture coding apparatus as shown in each of Embodiments. In this case, the reproduced video signals are displayed on the monitor ex219, and can be reproduced by another device or system using the recording medium ex215 on which the multiplexed data is recorded. It is also possible to implement the moving picture decoding apparatus in the set top box ex217 connected to the cable ex203 for a cable television or to the antenna ex204 for satellite and/or terrestrial broadcasting, so as to display the video signals on the monitor ex219 of the television ex300. The moving picture decoding apparatus may be implemented not in the set top box but in the television ex300.

FIG. 22 illustrates the television (receiver) ex300 that uses the moving picture coding method and the moving picture decoding method described in each of Embodiments. The television ex300 includes: a tuner ex301 that obtains or provides multiplexed data obtained by multiplexing audio data onto video data, through the antenna ex204 or the cable ex203, etc. that receives a broadcast; a modulation/demodulation unit ex302 that demodulates the received multiplexed data or modulates data into multiplexed data to be supplied outside; and a multiplexing/demultiplexing unit ex303 that demultiplexes the modulated multiplexed data into video data and audio data, or multiplexes video data and audio data coded by a signal processing unit ex306 into data.

Furthermore, the television ex300 further includes: a signal processing unit ex306 including an audio signal processing unit ex304 and a video signal processing unit ex305 (functioning as the image coding apparatus or the image decoding apparatus according to an implementation of the present invention) that decode audio data and video data and code audio data and video data, respectively; and an output unit ex309 including a speaker ex307 that provides the decoded audio signal, and a display unit ex308 that displays the decoded video signal, such as a display. Furthermore, the television ex300 includes an interface unit ex317 including an operation input unit ex312 that receives an input of a user operation. Furthermore, the television ex300 includes a control unit ex310 that controls overall each constituent element of the television ex300, and a power supply circuit unit ex311 that supplies power to each of the elements. Other than the operation input unit ex312, the interface unit ex317 may include: a bridge ex313 that is connected to an external device, such as the reader/recorder ex218; a slot unit ex314 for enabling attachment of the recording medium ex216, such as an SD card; a driver ex315 to be connected to an external recording medium, such as a hard disk; and a modem ex316 to be connected to a telephone network. Here, the recording medium ex216 can electrically record information using a non-volatile/volatile semiconductor memory element for storage. The constituent elements of the television ex300 are connected to each other through a synchronous bus.

First, the configuration in which the television ex300 decodes multiplexed data obtained from outside through the antenna ex204 and others and reproduces the decoded data will be described. In the television ex300, upon a user operation through a remote controller ex220 and others, the multiplexing/demultiplexing unit ex303 demultiplexes the multiplexed data demodulated by the modulation/demodulation unit ex302, under control of the control unit ex310 including a CPU. Furthermore, the audio signal processing unit ex304 decodes the demultiplexed audio data, and the video signal processing unit ex305 decodes the demultiplexed video data, using the decoding method described in each of Embodiments, in the television ex300. The output unit ex309 provides the decoded video signal and audio signal outside, respectively. When the output unit ex309 provides the video signal and the audio signal, the signals may be temporarily stored in buffers ex318 and ex319, and others so that the signals are reproduced in synchronization with each other. Furthermore, the television ex300 may read multiplexed data not through a broadcast and others but from the recording media ex215 and ex216, such as a magnetic disk, an optical disk, and a SD card. Next, a configuration in which the television ex300 codes an audio signal and a video signal, and transmits the data outside or writes the data on a recording medium will be described. In the television ex300, upon a user operation through the remote controller ex220 and others, the audio signal processing unit ex304 codes an audio signal, and the video signal processing unit ex305 codes a video signal, under control of the control unit ex310 using the coding method described in each of Embodiments. The multiplexing/demultiplexing unit ex303 multiplexes the coded video signal and audio signal, and provides the resulting signal outside. When the multiplexing/demultiplexing unit ex303 multiplexes the video signal and the audio signal, the signals may be temporarily stored in the buffers ex320 and ex321, and others so that the signals are reproduced in synchronization with each other. Here, the buffers ex318, ex319, ex320, and ex321 may be plural as illustrated, or at least one buffer may be shared in the television ex300. Furthermore, although not illustrate, data may be stored in a buffer so that the system overflow and underflow may be avoided between the modulation/demodulation unit ex302 and the multiplexing/demultiplexing unit ex303, for example.

Furthermore, the television ex300 may include a configuration for receiving an AV input from a microphone or a camera other than the configuration for obtaining audio and video data from a broadcast or a recording medium, and may code the obtained data. Although the television ex300 can code, multiplex, and provide outside data in the description, it may be capable of only receiving, decoding, and providing outside data but not the coding, multiplexing, and providing outside data.

Furthermore, when the reader/recorder ex218 reads or writes multiplexed data from or on a recording medium, one of the television ex300 and the reader/recorder ex218 may decode or code the multiplexed data, and the television ex300 and the reader/recorder ex218 may share the decoding or coding.

Figure 23:
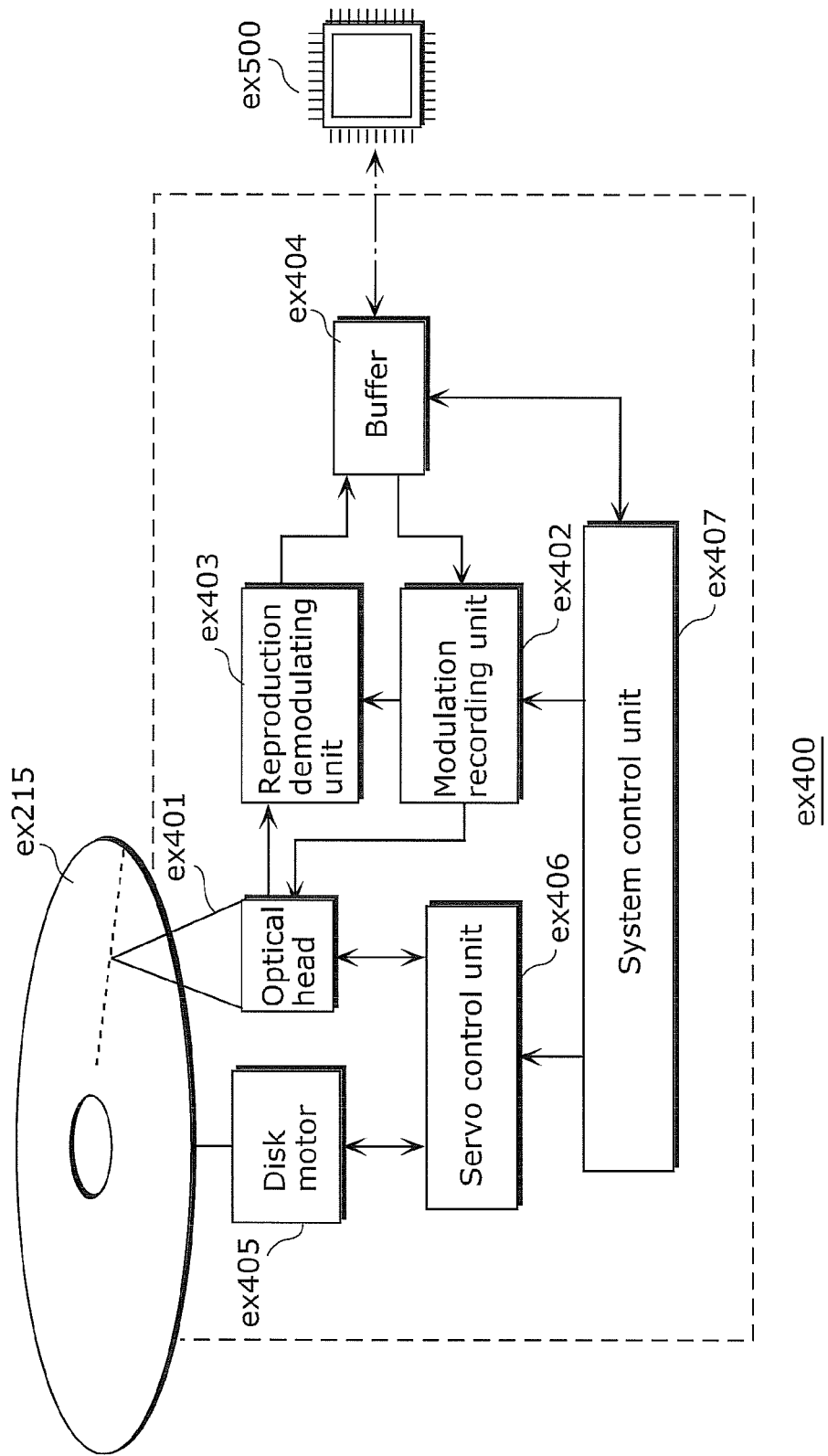
FIG. 23 is a block diagram illustrating an example of a configuration of an information reproducing/recording unit that reads and writes information from or on a recording medium that is an optical disk.

As an example, FIG. 23 illustrates a configuration of an information reproducing/recording unit ex400 when data is read or written from or on an optical disk. The information reproducing/recording unit ex400 includes constituent elements ex401, ex402, ex403, ex404, ex405, ex406, and ex407 to be described hereinafter. The optical head ex401 irradiates a laser spot in a recording surface of the recording medium ex215 that is an optical disk to write information, and detects reflected light from the recording surface of the recording medium ex215 to read the information. The modulation recording unit ex402 electrically drives a semiconductor laser included in the optical head ex401, and modulates the laser light according to recorded data. The reproduction demodulating unit ex403 amplifies a reproduction signal obtained by electrically detecting the reflected light from the recording surface using a photo detector included in the optical head ex401, and demodulates the reproduction signal by separating a signal component recorded on the recording medium ex215 to reproduce the necessary information. The buffer ex404 temporarily holds the information to be recorded on the recording medium ex215 and the information reproduced from the recording medium ex215. The disk motor ex405 rotates the recording medium ex215. The servo control unit ex406 moves the optical head ex401 to a predetermined information track while controlling the rotation drive of the disk motor ex405 so as to follow the laser spot. The system control unit ex407 controls overall the information reproducing/recording unit ex400. The reading and writing processes can be implemented by the system control unit ex407 using various information stored in the buffer ex404 and generating and adding new information as necessary, and by the modulation recording unit ex402, the reproduction demodulating unit ex403, and the servo control unit ex406 that record and reproduce information through the optical head ex401 while being operated in a coordinated manner. The system control unit ex407 includes, for example, a microprocessor, and executes processing by causing a computer to execute a program for read and write.

Although the optical head ex401 irradiates a laser spot in the description, it may perform high-density recording using near field light.

Figure 24:
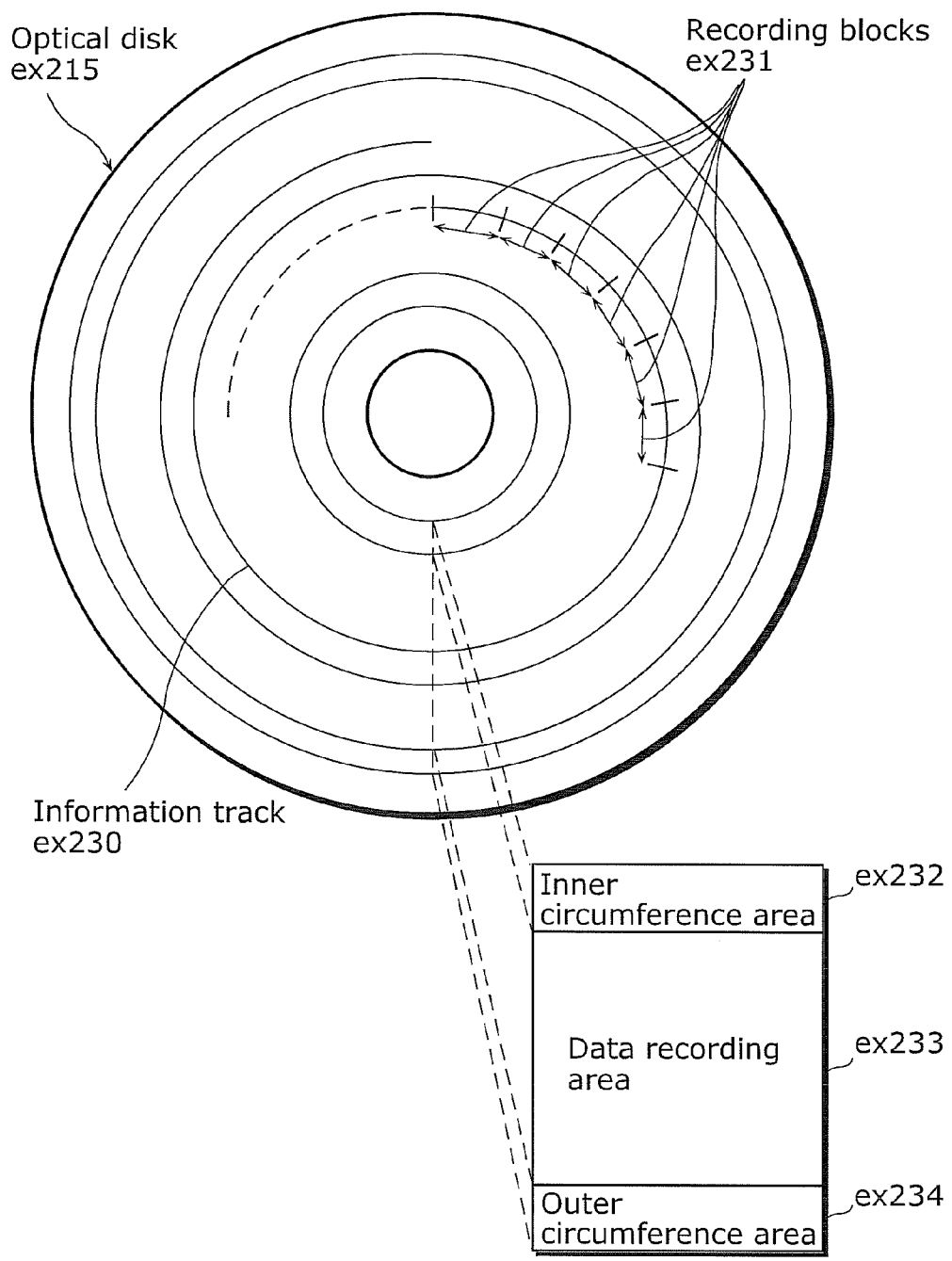
FIG. 24 shows an example of a configuration of a recording medium that is an optical disk.

FIG. 24 schematically illustrates the recording medium ex215 that is the optical disk. On the recording surface of the recording medium ex215, guide grooves are spirally formed, and an information track ex230 records, in advance, address information indicating an absolute position on the disk according to change in a shape of the guide grooves. The address information includes information for determining positions of recording blocks ex231 that are a unit for recording data. Reproducing the information track ex230 and reading the address information in an apparatus that records and reproduces data can lead to determination of the positions of the recording blocks. Furthermore, the recording medium ex215 includes a data recording area ex233, an inner circumference area ex232, and an outer circumference area ex234. The data recording area ex233 is an area for use in recording the user data. The inner circumference area ex232 and the outer circumference area ex234 that are inside and outside of the data recording area ex233, respectively are for specific use except for recording the user data. The information reproducing/recording unit 400 reads and writes coded audio, coded video data, or multiplexed data obtained by multiplexing the coded audio and video data, from and on the data recording area ex233 of the recording medium ex215.

Although an optical disk having a layer, such as a DVD and a BD is described as an example in the description, the optical disk is not limited to such, and may be an optical disk having a multilayer structure and capable of being recorded on a part other than the surface. Furthermore, the optical disk may have a structure for multidimensional recording/reproduction, such as recording of information using light of colors with different wavelengths in the same portion of the optical disk and for recording information having different layers from various angles.

Furthermore, a car ex210 having an antenna ex205 can receive data from the satellite ex202 and others, and reproduce video on a display device such as a car navigation system ex211 set in the car ex210, in the digital broadcasting system ex200. Here, a configuration of the car navigation system ex211 will be a configuration, for example, including a GPS receiving unit from the configuration illustrated in FIG. 22. The same will be true for the configuration of the computer ex111, the cellular phone ex114, and others.

Figure 25A:
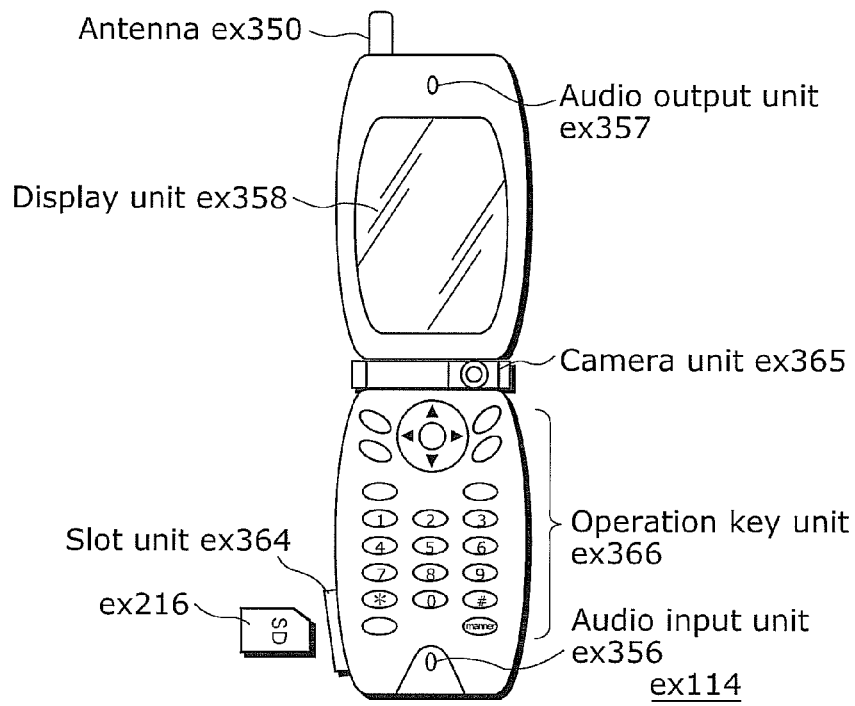
FIG. 25A shows an example of a cellular phone.

FIG. 25A illustrates the cellular phone ex114 that uses the moving picture coding method and the moving picture decoding method described in Embodiments. The cellular phone ex114 includes: an antenna ex350 for transmitting and receiving radio waves through the base station ex110; a camera unit ex365 capable of capturing moving and still images; and a display unit ex358 such as a liquid crystal display for displaying the data such as decoded video captured by the camera unit ex365 or received by the antenna ex350. The cellular phone ex114 further includes: a main body unit including an operation key unit ex366; an audio output unit ex357 such as a speaker for output of audio; an audio input unit ex356 such as a microphone for input of audio; a memory unit ex367 for storing captured video or still pictures, recorded audio, coded or decoded data of the received video, the still pictures, e-mails, or others; and a slot unit ex364 that is an interface unit for a recording medium that stores data in the same manner as the memory unit ex367.

Figure 25B:
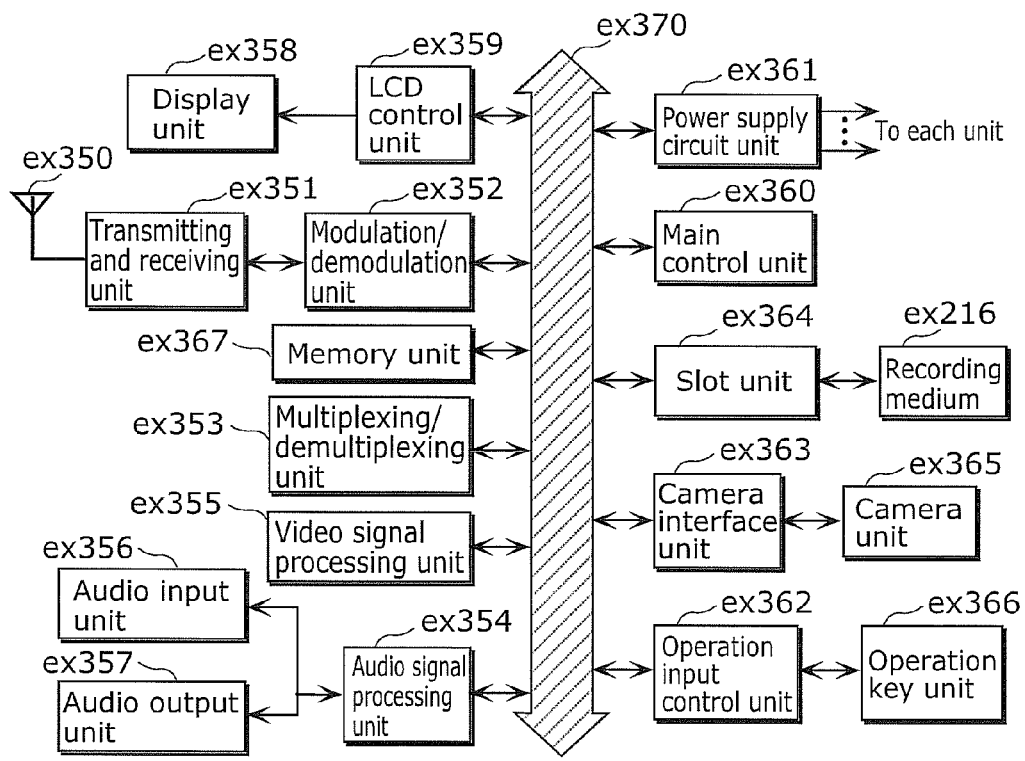
FIG. 25B is a block diagram showing an example of a configuration of the cellular phone.

Next, an example of a configuration of the cellular phone ex114 will be described with reference to FIG. 25B. In the cellular phone ex114, a main control unit ex360 designed to control overall each unit of the main body including the display unit ex358 as well as the operation key unit ex366 is connected mutually, via a synchronous bus ex370, to a power supply circuit unit ex361, an operation input control unit ex362, a video signal processing unit ex355, a camera interface unit ex363, a liquid crystal display (LCD) control unit ex359, a modulation/demodulation unit ex352, a multiplexing/demultiplexing unit ex353, an audio signal processing unit ex354, the slot unit ex364, and the memory unit ex367.

When a call-end key or a power key is turned ON by a user's operation, the power supply circuit unit ex361 supplies the respective units with power from a battery pack so as to activate the cell phone ex114.

In the cellular phone ex114, the audio signal processing unit ex354 converts the audio signals collected by the audio input unit ex356 in voice conversation mode into digital audio signals under the control of the main control unit ex360 including a CPU, ROM, and RAM. Then, the modulation/demodulation unit ex352 performs spread spectrum processing on the digital audio signals, and the transmitting and receiving unit ex351 performs digital-to-analog conversion and frequency conversion on the data, so as to transmit the resulting data via the antenna ex350. Also, in the cellular phone ex114, the transmitting and receiving unit ex351 amplifies the data received by the antenna ex350 in voice conversation mode and performs frequency conversion and the analog-to-digital conversion on the data. Then, the modulation/demodulation unit ex352 performs inverse spread spectrum processing on the data, and the audio signal processing unit ex354 converts it into analog audio signals, so as to output them via the audio output unit ex357.

Furthermore, when an e-mail in data communication mode is transmitted, text data of the e-mail inputted by operating the operation key unit ex366 and others of the main body is sent out to the main control unit ex360 via the operation input control unit ex362. The main control unit ex360 causes the modulation/demodulation unit ex352 to perform spread spectrum processing on the text data, and the transmitting and receiving unit ex351 performs the digital-to-analog conversion and the frequency conversion on the resulting data to transmit the data to the base station ex110 via the antenna ex350. When an e-mail is received, processing that is approximately inverse to the processing for transmitting an e-mail is performed on the received data, and the resulting data is provided to the display unit ex358.

When video, still images, or video and audio in data communication mode is or are transmitted, the video signal processing unit ex355 compresses and codes video signals supplied from the camera unit ex365 using the moving picture coding method shown in each of Embodiments (that is, the video signal processing unit ex355 functions as the image coding apparatus according to an implementation of the present invention), and transmits the coded video data to the multiplexing/demultiplexing unit ex353. In contrast, during when the camera unit ex365 captures video, still images, and others, the audio signal processing unit ex354 codes audio signals collected by the audio input unit ex356, and transmits the coded audio data to the multiplexing/demultiplexing unit ex353.

The multiplexing/demultiplexing unit ex353 multiplexes the coded video data supplied from the video signal processing unit ex355 and the coded audio data supplied from the audio signal processing unit ex354, using a predetermined method. Then, the modulation/demodulation circuit unit (the modulation/demodulation circuit unit) ex352 performs spread spectrum processing on the multiplexed data, and the transmitting and receiving unit ex351 performs digital-to-analog conversion and frequency conversion on the data so as to transmit the resulting data via the antenna ex350.

When receiving data of a video file which is linked to a Web page and others in data communication mode or when receiving an e-mail with video and/or audio attached, in order to decode the multiplexed data received via the antenna ex350, the multiplexing/demultiplexing unit ex353 demultiplexes the multiplexed data into a video data bit stream and an audio data bit stream, and supplies the video signal processing unit ex355 with the coded video data and the audio signal processing unit ex354 with the coded audio data, through the synchronous bus ex370. The video signal processing unit ex355 decodes the video signal using a moving picture decoding method corresponding to the moving picture coding method shown in each of Embodiments (that is, the video signal processing unit ex355 functions as the image decoding apparatus according to an implementation of the present invention), and then the display unit ex358 displays, for instance, the video and still images included in the video file linked to the Web page via the LCD control unit ex359. Furthermore, the audio signal processing unit ex354 decodes the audio signal, and the audio output unit ex357 provides the audio.

Furthermore, similarly to the television ex300, a terminal such as the cellular phone ex114 probably has 3 types of implementation configurations including not only (i) a transmitting and receiving terminal including both a coding apparatus and a decoding apparatus, but also (ii) a transmitting terminal including only a coding apparatus and (iii) a receiving terminal including only a decoding apparatus.

Although the digital broadcasting system ex200 receives and transmits the multiplexed data obtained by multiplexing audio data onto video data in the description, the multiplexed data may be data obtained by multiplexing not audio data but character data related to video onto video data, and may be not multiplexed data but video data itself.

As such, the moving picture coding method and the moving picture decoding method in each of Embodiments can be used in any of the devices and systems described. Thus, the advantages described in each of Embodiments can be obtained.

Furthermore, the present invention is not limited to Embodiments, and various modifications and revisions are possible without departing from the scope of the present invention.

Embodiment 4

Video data can be generated by switching, as necessary, between (i) the moving picture coding method or the moving picture coding apparatus shown in each of Embodiments and (ii) a moving picture coding method or a moving picture coding apparatus in conformity with a different standard, such as MPEG-2, MPEG4-AVC, and VC-1.

Here, when a plurality of video data that conforms to the different standards is generated and is then decoded, the decoding methods need to be selected to conform to the different standards. However, since to which standard each of the plurality of the video data to be decoded conforms cannot be detected, there is a problem that an appropriate decoding method cannot be selected.

In order to solve the problem, multiplexed data obtained by multiplexing audio data and others onto video data has a structure including identification information indicating to which standard the video data conforms. The specific structure of the multiplexed data including the video data generated in the moving picture coding method and by the moving picture coding apparatus shown in each of Embodiments will be hereinafter described. The multiplexed data is a digital stream in the MPEG2-Transport Stream format.

FIG. 26 illustrates a structure of the multiplexed data. As illustrated in FIG. 26, the multiplexed data can be obtained by multiplexing at least one of a video stream, an audio stream, a presentation graphics stream (PG), and an interactive graphics stream. The video stream represents primary video and secondary video of a movie, the audio stream (IG) represents a primary audio part and a secondary audio part to be mixed with the primary audio part, and the presentation graphics stream represents subtitles of the movie. Here, the primary video is normal video to be displayed on a screen, and the secondary video is video to be displayed on a smaller window in the primary video. Furthermore, the interactive graphics stream represents an interactive screen to be generated by arranging the GUI components on a screen. The video stream is coded in the moving picture coding method or by the moving picture coding apparatus shown in each of Embodiments, or in a moving picture coding method or by a moving picture coding apparatus in conformity with a conventional standard, such as MPEG-2, MPEG4-AVC, and VC-1. The audio stream is coded in accordance with a standard, such as Dolby-AC-3, Dolby Digital Plus, MLP, DTS, DTS-HD, and linear PCM.

Each stream included in the multiplexed data is identified by PID. For example, 0x1011 is allocated to the video stream to be used for video of a movie, 0x1100 to 0x111F are allocated to the audio streams, 0x1200 to 0x121F are allocated to the presentation graphics streams, 0x1400 to 0x141F are allocated to the interactive graphics streams, 0x1B00 to 0x1B1F are allocated to the video streams to be used for secondary video of the movie, and 0x1A00 to 0x1A1F are allocated to the audio streams to be used for the secondary video to be mixed with the primary audio.

Figure 27:
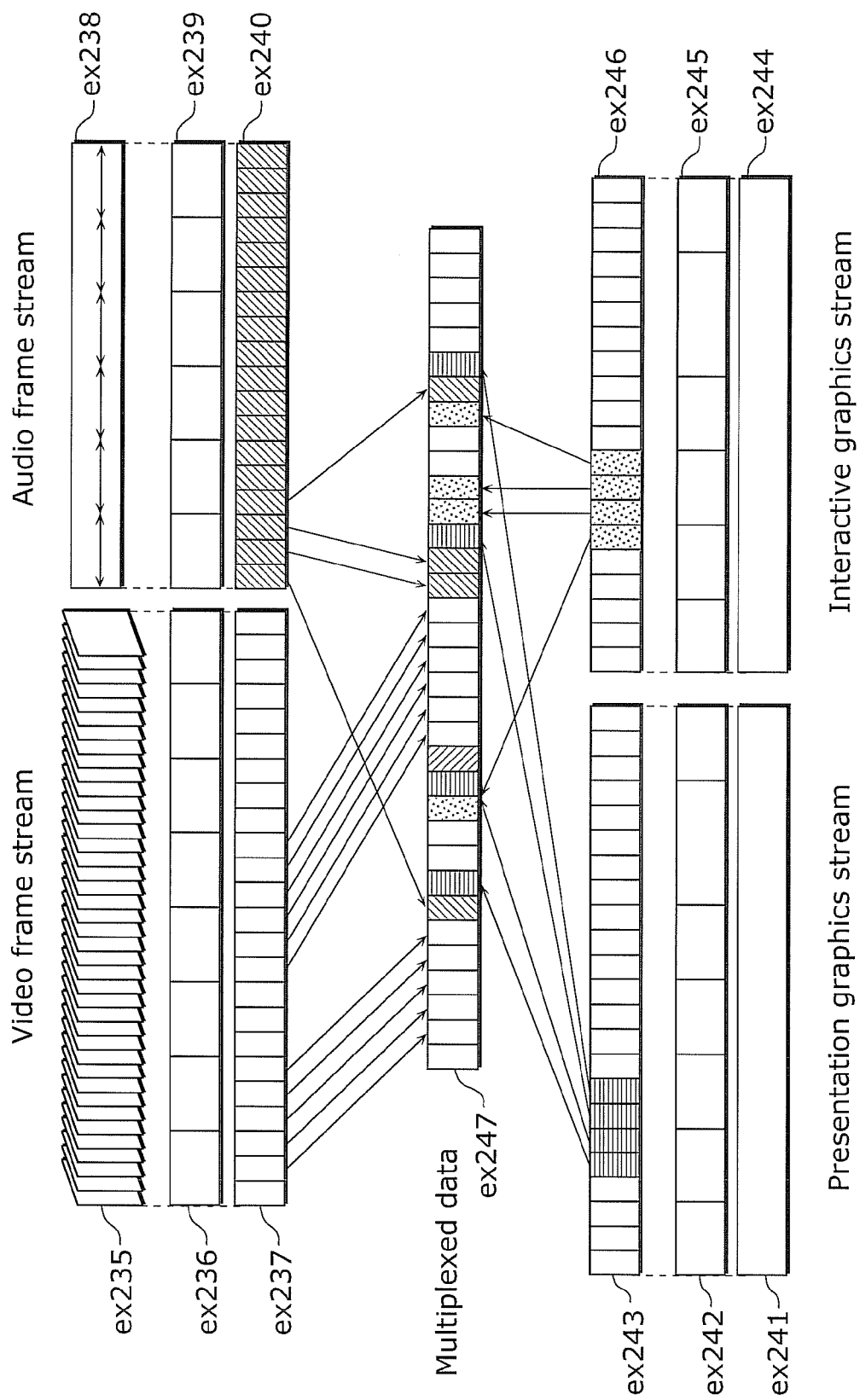
FIG. 27 schematically illustrates how each of streams is multiplexed in multiplexed data.

FIG. 27 schematically illustrates how data is multiplexed. First, a video stream ex235 composed of video frames and an audio stream ex238 composed of audio frames are transformed into a stream of PES packets ex236 and a stream of PES packets ex239, and further into TS packets ex237 and TS packets ex240, respectively. Similarly, data of a presentation graphics stream ex241 and data of an interactive graphics stream ex244 are transformed into a stream of PES packets ex242 and a stream of PES packets e245, and further into TS packets ex243 and TS packets ex246, respectively. These TS packets are multiplexed into a stream to obtain multiplexed data ex247.

Figure 28:
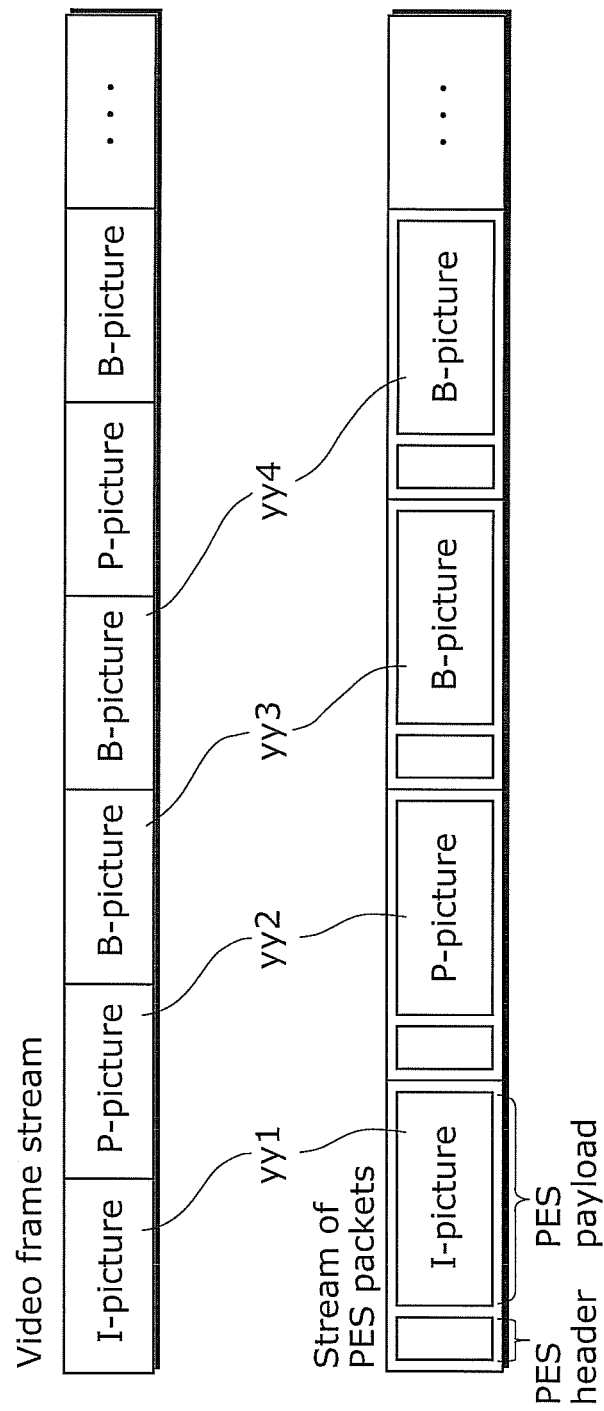
FIG. 28 illustrates how a video stream is stored in a stream of PES packets in more detail.

FIG. 28 illustrates how a video stream is stored in a stream of PES packets in more detail. The first bar in FIG. 118 shows a video frame stream in a video stream. The second bar shows the stream of PES packets. As indicated by arrows denoted as yy1, yy2, yy3, and yy4 in FIG. 28, the video stream is divided into pictures as I-pictures, B-pictures, and P-pictures each of which is a video presentation unit, and the pictures are stored in a payload of each of the PES packets. Each of the PES packets has a PES header, and the PES header stores a Presentation Time-Stamp (PTS) indicating a display time of the picture, and a Decoding Time-Stamp (DTS) indicating a decoding time of the picture.

Figure 29:
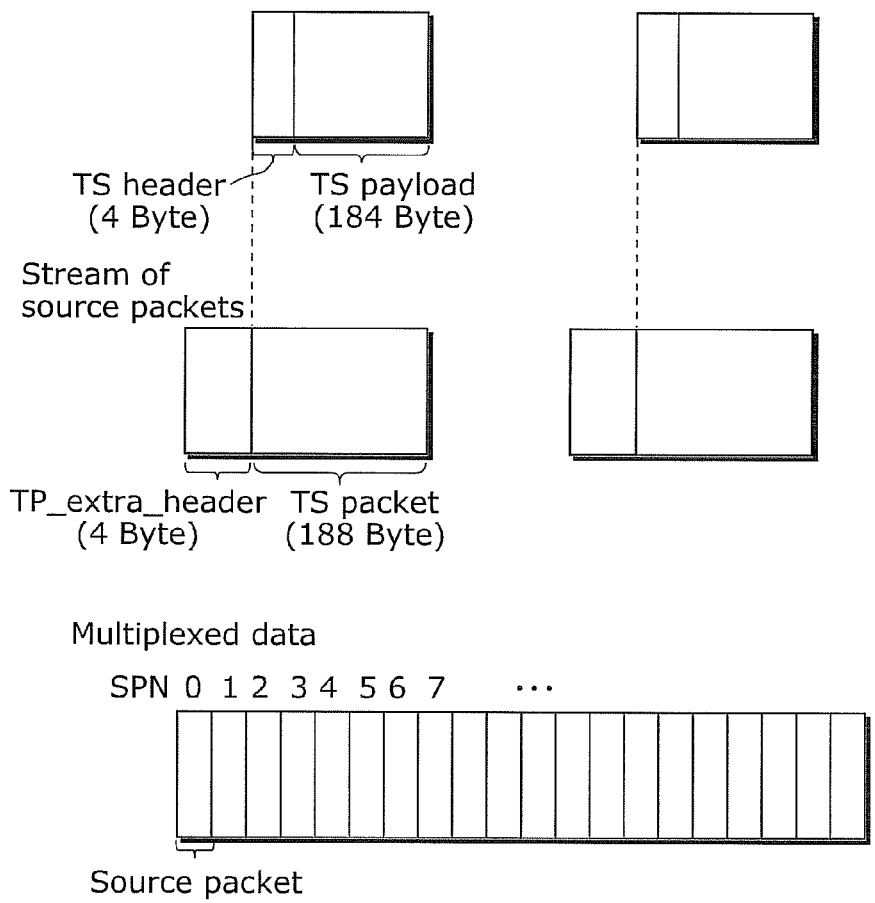
FIG. 29 shows a structure of TS packets and source packets in the multiplexed data.

FIG. 29 illustrates a format of TS packets to be finally written on the multiplexed data. Each of the TS packets is a 188-byte fixed length packet including a 4-byte TS header having information, such as a PID for identifying a stream and a 184-byte TS payload for storing data. The PES packets are divided, and stored in the TS payloads, respectively. When a BD ROM is used, each of the TS packets is given a 4-byte TP_Extra_Header, thus resulting in 192-byte source packets. The source packets are written on the multiplexed data. The TP_Extra_Header stores information such as an Arrival_Time_Stamp (ATS). The ATS shows a transfer start time at which each of the TS packets is to be transferred to a PID filter. The source packets are arranged in the multiplexed data as shown at the bottom of FIG. 29. The numbers incrementing from the head of the multiplexed data are called source packet numbers (SPNs).

Each of the TS packets included in the multiplexed data includes not only streams of audio, video, subtitles and others, but also a Program Association Table (PAT), a Program Map Table (PMT), and a Program Clock Reference (PCR). The PAT shows what a PID in a PMT used in the multiplexed data indicates, and a PID of the PAT itself is registered as zero. The PMT stores PIDs of the streams of video, audio, subtitles and others included in the multiplexed data, and attribute information on the streams corresponding to the PIDs. The PMT also has various descriptors relating to the multiplexed data. The descriptors have information such as copy control information showing whether copying of the multiplexed data is permitted or not. The PCR stores STC time information corresponding to an ATS showing when the PCR packet is transferred to a decoder, in order to achieve synchronization between an Arrival Time Clock (ATC) that is a time axis of ATSs, and an System Time Clock (STC) that is a time axis of PTSs and DTSs.

Figure 30:
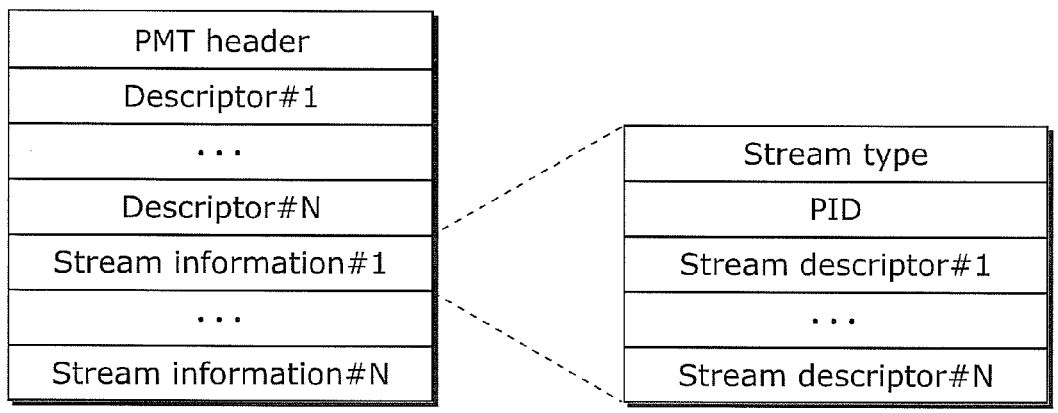
FIG. 30 shows a data structure of a PMT.

FIG. 30 illustrates the data structure of the PMT in detail. A PMT header is disposed at the top of the PMT. The PMT header describes the length of data included in the PMT and others. A plurality of descriptors relating to the multiplexed data is disposed after the PMT header. Information such as the copy control information is described in the descriptors. After the descriptors, a plurality of pieces of stream information relating to the streams included in the multiplexed data is disposed. Each piece of stream information includes stream descriptors each describing information, such as a stream type for identifying a compression codec of a stream, a stream PID, and stream attribute information (such as a frame rate or an aspect ratio). The stream descriptors are equal in number to the number of streams in the multiplexed data.

When the multiplexed data is recorded on a recording medium and others, it is recorded together with multiplexed data information files.

Figure 31:
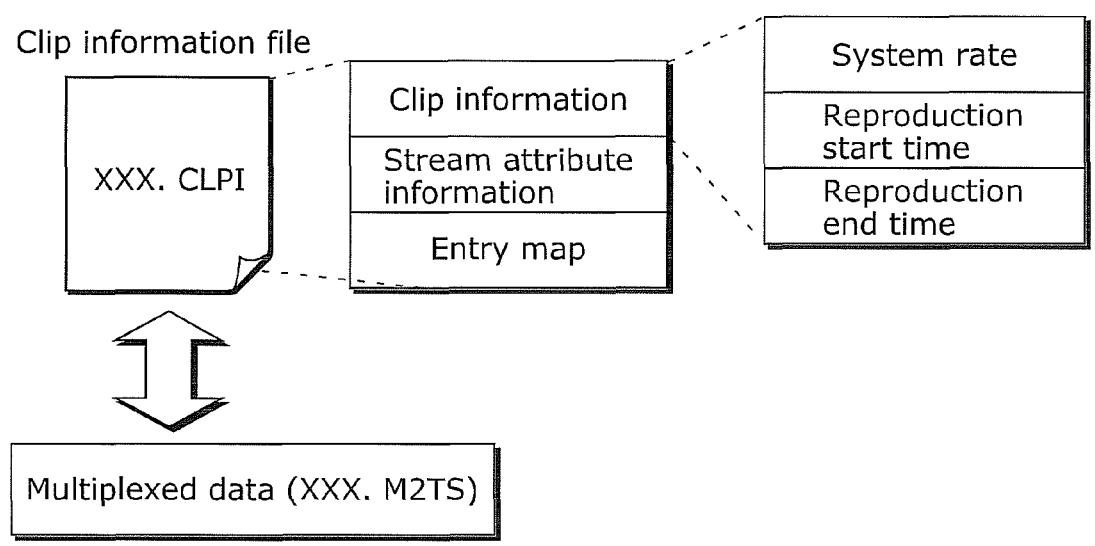
FIG. 31 shows an internal structure of multiplexed data information.

Each of the multiplexed data information files is management information on the multiplexed data as shown in FIG. 31. The multiplexed data information files are in one to one correspondence with the multiplexed data, and each of the files includes multiplexed data information, stream attribute information, and an entry map.

As illustrated in FIG. 31, the multiplexed data information includes a system rate, a reproduction start time, and a reproduction end time. The system rate indicates the maximum transfer rate at which a system target decoder to be described later transfers the multiplexed data to a PID filter. The intervals of the ATSs included in the multiplexed data are set to not higher than a system rate. The reproduction start time indicates a PTS in a video frame at the head of the multiplexed data. An interval of one frame is added to a PTS in a video frame at the end of the multiplexed data, and the PTS is set to the reproduction end time.

Figure 32:
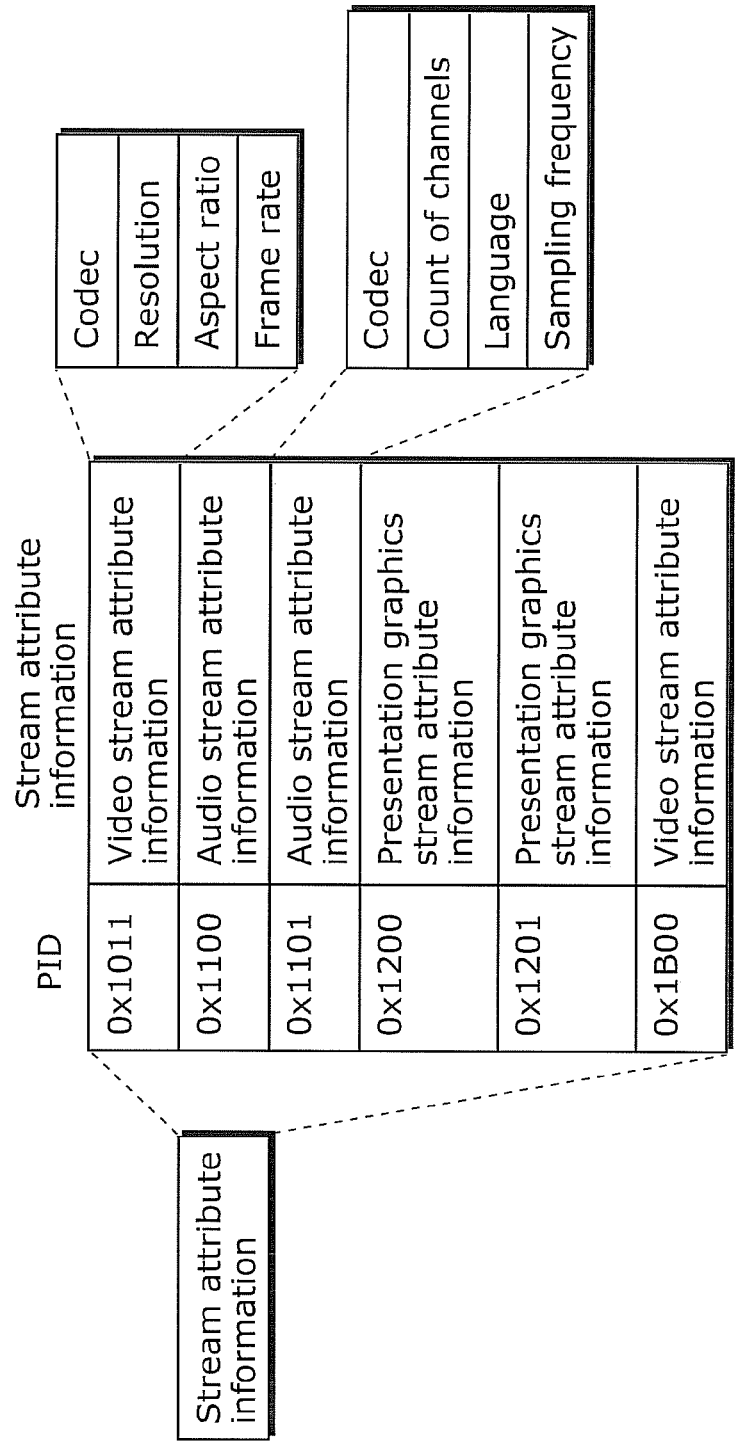
FIG. 32 shows an internal structure of stream attribute information.

As shown in FIG. 32, a piece of attribute information is registered in the stream attribute information, for each PID of each stream included in the multiplexed data. Each piece of attribute information has different information depending on whether the corresponding stream is a video stream, an audio stream, a presentation graphics stream, or an interactive graphics stream. Each piece of video stream attribute information carries information including what kind of compression codec is used for compressing the video stream, and the resolution, aspect ratio and frame rate of the pieces of picture data that is included in the video stream. Each piece of audio stream attribute information carries information including what kind of compression codec is used for compressing the audio stream, how many channels are included in the audio stream, which language the audio stream supports, and how high the sampling frequency is. The video stream attribute information and the audio stream attribute information are used for initialization of a decoder before the player plays back the information.

In this embodiment, the multiplexed data to be used is of a stream type included in the PMT. Furthermore, when the multiplexed data is recorded on a recording medium, the video stream attribute information included in the multiplexed data information is used. More specifically, the moving picture coding method or the moving picture coding apparatus described in each of Embodiments includes a step or a unit for allocating unique information indicating video data generated by the moving picture coding method or the moving picture coding apparatus in each of Embodiments, to the stream type included in the PMT or the video stream attribute information. With the configuration, the video data generated by the moving picture coding method or the moving picture coding apparatus described in each of Embodiments can be distinguished from video data that conforms to another standard.

Figure 33:
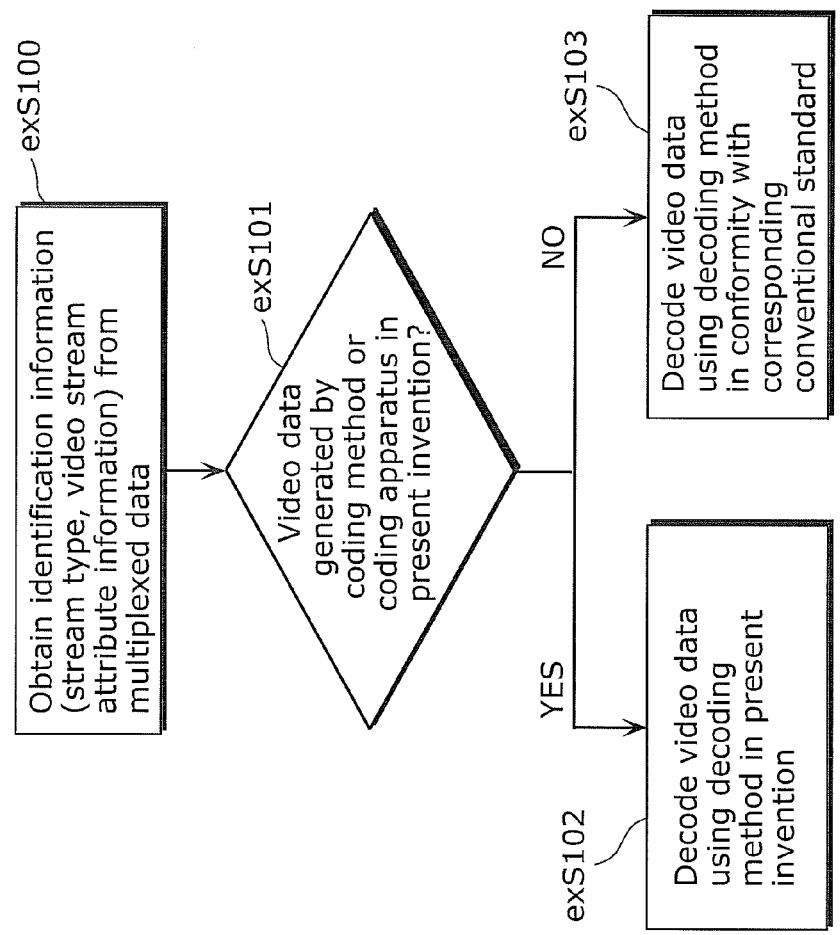
FIG. 33 shows steps for identifying video data.

Furthermore, FIG. 33 illustrates steps of the moving picture decoding method according to this embodiment. In Step exS100, the stream type included in the PMT or the video stream attribute information is obtained from the multiplexed data. Next, in Step exS101, it is determined whether or not the stream type or the video stream attribute information indicates that the multiplexed data is generated by the moving picture coding method or the moving picture coding apparatus in each of Embodiments. When it is determined that the stream type or the video stream attribute information indicates that the multiplexed data is generated by the moving picture coding method or the moving picture coding apparatus in each of Embodiments, in Step exS102, decoding is performed by the moving picture decoding method in each of Embodiments. Furthermore, when the stream type or the video stream attribute information indicates conformance to the conventional standards, such as MPEG-2, MPEG4-AVC, and VC-1, in Step exS103, decoding is performed by a moving picture decoding method in conformity with the conventional standards.

As such, allocating a new unique value to the stream type or the video stream attribute information enables determination whether or not the moving picture decoding method or the moving picture decoding apparatus that is described in each of Embodiments can perform decoding. Even when multiplexed data that conforms to a different standard, an appropriate decoding method or apparatus can be selected. Thus, it becomes possible to decode information without any error. Furthermore, the moving picture coding method or apparatus, or the moving picture decoding method or apparatus in this embodiment can be used in the devices and systems described above.

Embodiment 5

Figure 34:
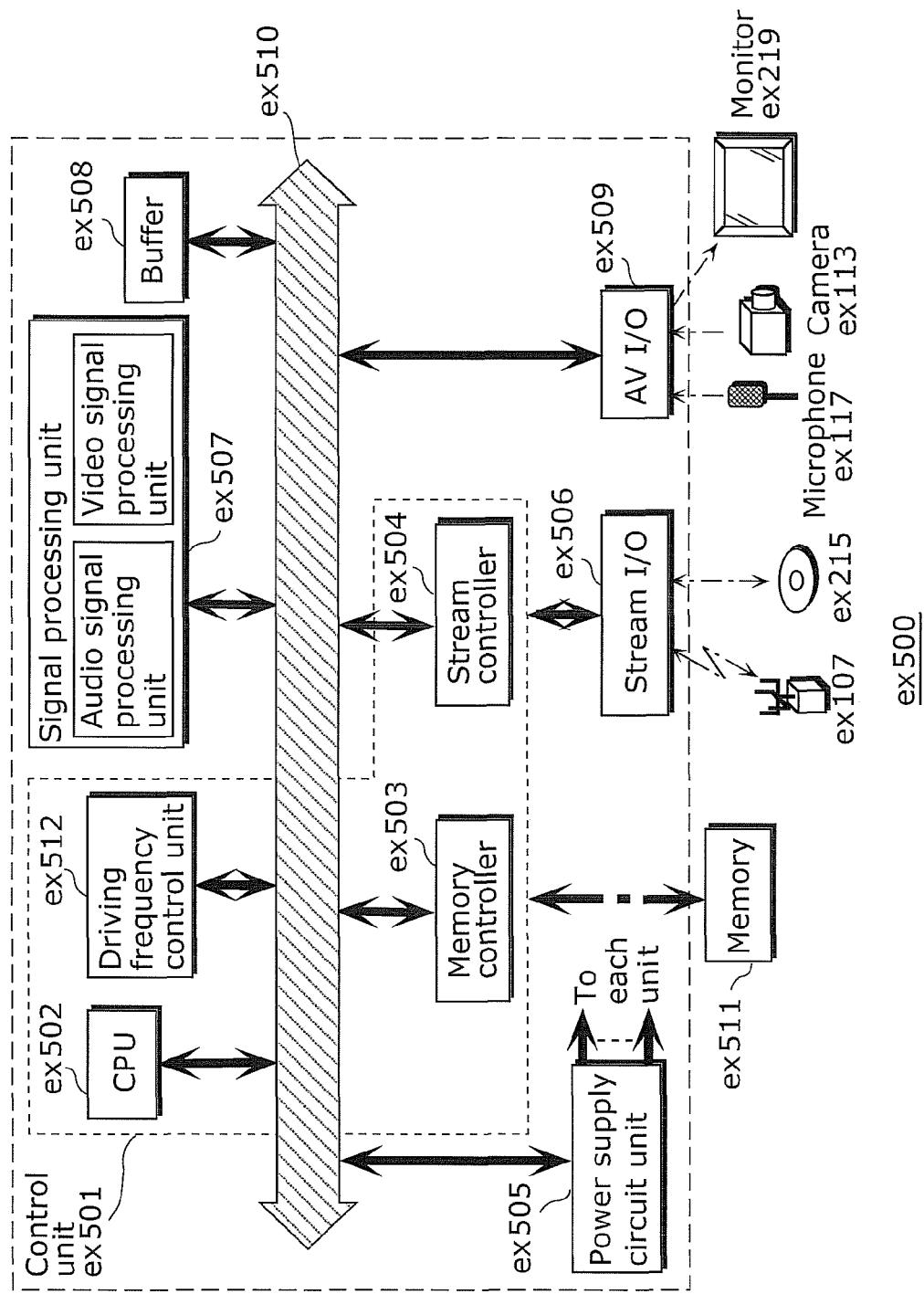
FIG. 34 is a block diagram illustrating an example of a configuration of an integrated circuit for implementing the moving picture coding method and the moving picture decoding method according to each of Embodiments.

Each of the moving picture coding method, the moving picture coding apparatus, the moving picture decoding method, and the moving picture decoding apparatus in each of Embodiments is typically achieved in the form of an integrated circuit or a Large Scale Integrated (LSI) circuit. As an example, FIG. 34 illustrates a configuration of an LSI ex500 that is made into one chip. The LSI ex500 includes elements ex501, ex502, ex503, ex504, ex505, ex506, ex507, ex508, and ex509 to be described below, and the elements are connected to each other through a bus ex510. The power supply circuit unit ex505 is activated by supplying each of the elements with power when the power supply circuit unit ex505 is turned on.

For example, when coding is performed, the LSI ex500 receives an AV signal from a microphone ex117, a camera ex113, and others through an AV JO ex509 under control of a control unit ex501 including a CPU ex502, a memory controller ex503, a stream controller ex504, and a driving frequency control unit ex512. The received AV signal is temporarily stored in an external memory ex511, such as an SDRAM. Under control of the control unit ex501, the stored data is segmented into data portions according to the processing amount and speed to be transmitted to a signal processing unit ex507. Then, the signal processing unit ex507 codes an audio signal and/or a video signal. Here, the coding of the video signal is the coding described in each of Embodiments. Furthermore, the signal processing unit ex507 sometimes multiplexes the coded audio data and the coded video data, and a stream IO ex506 provides the multiplexed data outside. The provided multiplexed data is transmitted to the base station ex107, or written on the recording media ex215. When data sets are multiplexed, the data should be temporarily stored in the buffer ex508 so that the data sets are synchronized with each other.

Although the memory ex511 is an element outside the LSI ex500, it may be included in the LSI ex500. The buffer ex508 is not limited to one buffer, but may be composed of buffers. Furthermore, the LSI ex500 may be made into one chip or a plurality of chips.

Furthermore, although the control unit ex501 includes the CPU ex502, the memory controller ex503, the stream controller ex504, and the driving frequency control unit ex512, the configuration of the control unit ex501 is not limited to such. For example, the signal processing unit ex507 may further include a CPU. Inclusion of another CPU in the signal processing unit ex507 can improve the processing speed. Furthermore, as another example, the CPU ex502 may serve as or be a part of the signal processing unit ex507, and, for example, may include an audio signal processing unit. In such a case, the control unit ex501 includes the signal processing unit ex507 or the CPU ex502 including a part of the signal processing unit ex507.

The name used here is LSI, but it may also be called IC, system LSI, super LSI, or ultra LSI depending on the degree of integration.

Moreover, ways to achieve integration are not limited to the LSI, and a special circuit or a general purpose processor and so forth can also achieve the integration. Field Programmable Gate Array (FPGA) that can be programmed after manufacturing LSIs or a reconfigurable processor that allows re-configuration of the connection or configuration of an LSI can be used for the same purpose.

In the future, with advancement in semiconductor technology, a brand-new technology may replace LSI. The functional blocks can be integrated using such a technology. The possibility is that the present invention is applied to biotechnology.

Embodiment 6

When video data generated in the moving picture coding method or by the moving picture coding apparatus described in each of Embodiments is decoded, compared to when video data that conforms to a conventional standard, such as MPEG-2, MPEG4-AVC, and VC-1 is decoded, the processing amount probably increases. Thus, the LSI ex500 needs to be set to a driving frequency higher than that of the CPU ex502 to be used when video data in conformity with the conventional standard is decoded. However, when the driving frequency is set higher, there is a problem that the power consumption increases.

Figure 35:
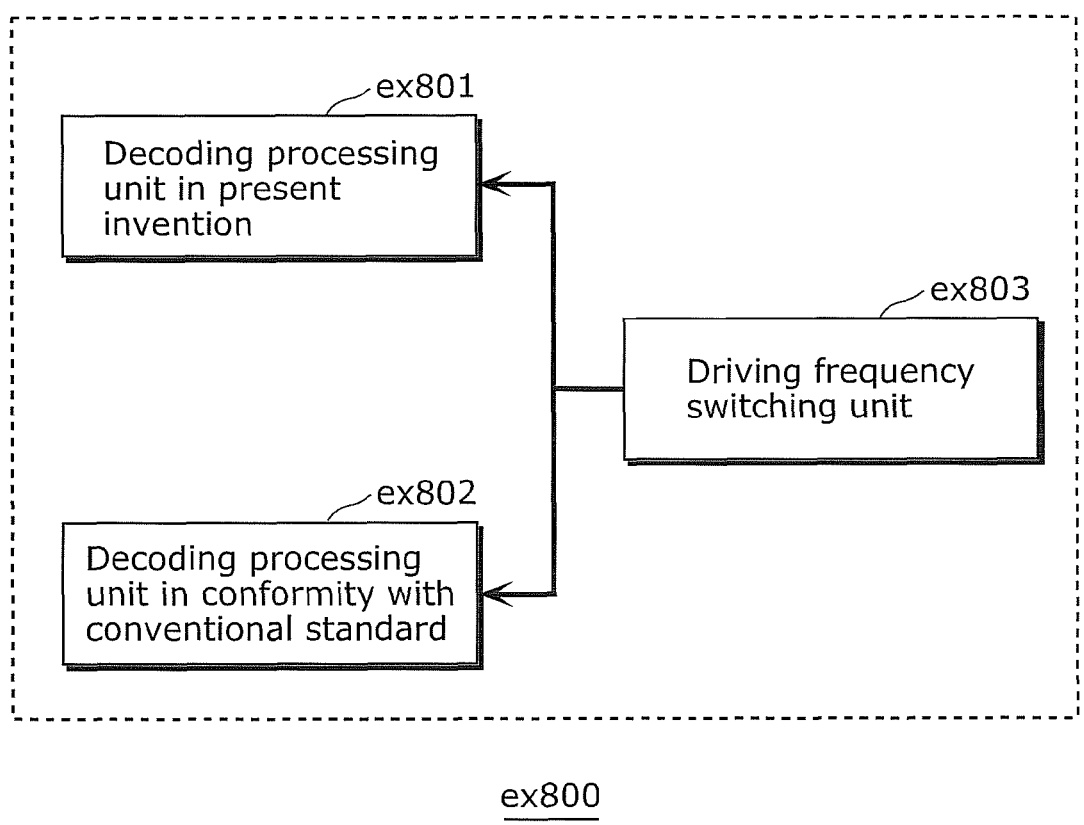
FIG. 35 shows a configuration for switching between driving frequencies.

In order to solve the problem, the moving picture decoding apparatus, such as the television ex300 and the LSI ex500 is configured to determine to which standard the video data conforms, and switch between the driving frequencies according to the determined standard. FIG. 35 illustrates a configuration ex800 in this embodiment. A driving frequency switching unit ex803 sets a driving frequency to a higher driving frequency when video data is generated by the moving picture coding method or the moving picture coding apparatus described in each of Embodiments. Then, the driving frequency switching unit ex803 instructs a decoding processing unit ex801 that executes the moving picture decoding method described in each of Embodiments to decode the video data. When the video data conforms to the conventional standard, the driving frequency switching unit ex803 sets a driving frequency to a lower driving frequency than that of the video data generated by the moving picture coding method or the moving picture coding apparatus described in each of Embodiments. Then, the driving frequency switching unit ex803 instructs the decoding processing unit ex802 that conforms to the conventional standard to decode the video data.

More specifically, the driving frequency switching unit ex803 includes the CPU ex502 and the driving frequency control unit ex512 in FIG. 34. Here, each of the decoding processing unit ex801 that executes the moving picture decoding method described in each of Embodiments and the decoding processing unit ex802 that conforms to the conventional standard corresponds to the signal processing unit ex507 in FIG. 34. The CPU ex502 determines to which standard the video data conforms. Then, the driving frequency control unit ex512 determines a driving frequency based on a signal from the CPU ex502. Furthermore, the signal processing unit ex507 decodes the video data based on the signal from the CPU ex502. For example, the identification information described in Embodiment 4 is probably used for identifying the video data. The identification information is not limited to the one described in Embodiment 4 but may be any information as long as the information indicates to which standard the video data conforms. For example, when which standard video data conforms to can be determined based on an external signal for determining that the video data is used for a television or a disk, etc., the determination may be made based on such an external signal. Furthermore, the CPU ex502 selects a driving frequency based on, for example, a look-up table in which the standards of the video data are associated with the driving frequencies as shown in FIG. 37. The driving frequency can be selected by storing the look-up table in the buffer ex508 or in an internal memory of an LSI, and referring to the look-up table by the CPU ex502.

Figure 36:
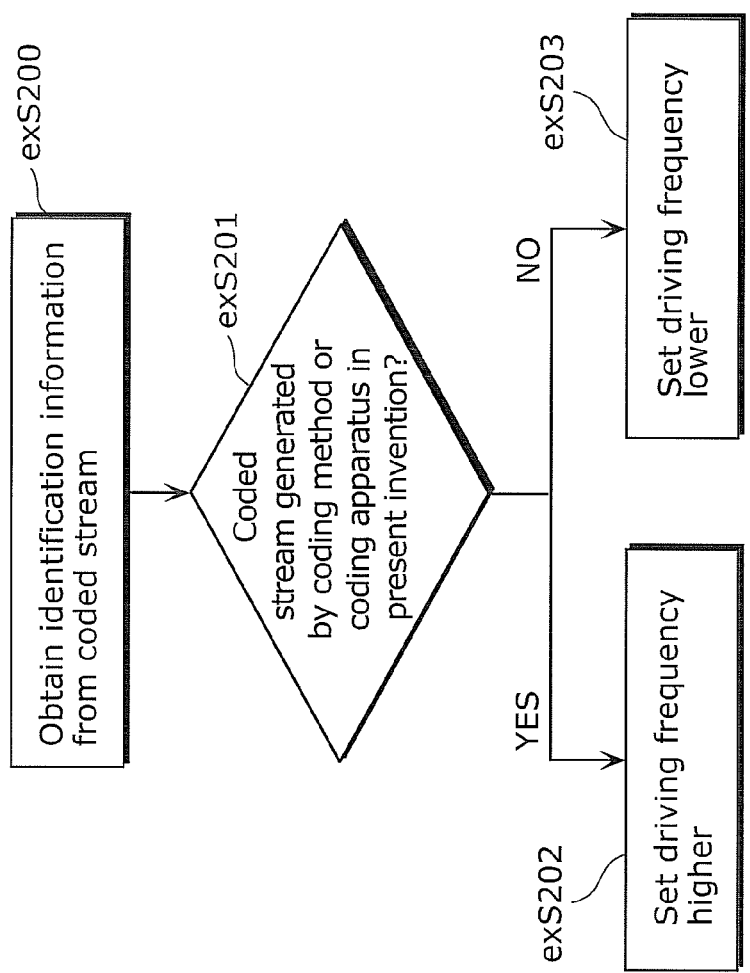
FIG. 36 shows steps for identifying video data and switching between driving frequencies.

FIG. 36 illustrates steps for executing a method in this embodiment. First, in Step exS200, the signal processing unit ex507 obtains identification information from the multiplexed data. Next, in Step exS201, the CPU ex502 determines whether or not the video data is generated by the coding method and the coding apparatus described in each of Embodiments, based on the identification information. When the video data is generated by the coding method and the coding apparatus described in each of Embodiments, in Step exS202, the CPU ex502 transmits a signal for setting the driving frequency to a higher driving frequency to the driving frequency control unit ex512. Then, the driving frequency control unit ex512 sets the driving frequency to the higher driving frequency. On the other hand, when the identification information indicates that the video data conforms to the conventional standard, such as MPEG-2, MPEG4-AVC, and VC-1, in Step exS203, the CPU ex502 transmits a signal for setting the driving frequency to a lower driving frequency to the driving frequency control unit ex512. Then, the driving frequency control unit ex512 sets the driving frequency to the lower driving frequency than that in the case where the video data is generated by the moving picture coding method and the moving picture coding apparatus described in each of Embodiment.

Furthermore, along with the switching of the driving frequencies, the power conservation effect can be improved by changing the voltage to be applied to the LSI ex500 or an apparatus including the LSI ex500. For example, when the driving frequency is set lower, the voltage to be applied to the LSI ex500 or the apparatus including the LSI ex500 is probably set to a voltage lower than that in the case where the driving frequency is set higher.

Furthermore, when the processing amount for decoding is larger, the driving frequency may be set higher, and when the processing amount for decoding is smaller, the driving frequency may be set lower as the method for setting the driving frequency. Thus, the setting method is not limited to the ones described above. For example, when the processing amount for decoding video data in conformity with MPEG4-AVC is larger than the processing amount for decoding video data generated by the moving picture coding method and the moving picture coding apparatus described in each of Embodiments, the driving frequency is probably set in reverse order to the setting described above.

Furthermore, the method for setting the driving frequency is not limited to the method for setting the driving frequency lower. For example, when the identification information indicates that the video data is generated by the moving picture coding method and the moving picture coding apparatus described in each of Embodiments, the voltage to be applied to the LSI ex500 or the apparatus including the LSI ex500 is probably set higher. When the identification information indicates that the video data conforms to the conventional standard, such as MPEG-2, MPEG4-AVC, and VC-1, the voltage to be applied to the LSI ex500 or the apparatus including the LSI ex500 is probably set lower. As another example, when the identification information indicates that the video data is generated by the moving picture coding method and the moving picture coding apparatus described in each of Embodiments, the driving of the CPU ex502 does not probably have to be suspended. When the identification information indicates that the video data conforms to the conventional standard, such as MPEG-2, MPEG4-AVC, and VC-1, the driving of the CPU ex502 is probably suspended at a given time because the CPU ex502 has extra processing capacity. Even when the identification information indicates that the video data is generated by the moving picture coding method and the moving picture coding apparatus described in each of Embodiments, in the case where the CPU ex502 has extra processing capacity, the driving of the CPU ex502 is probably suspended at a given time. In such a case, the suspending time is probably set shorter than that in the case where when the identification information indicates that the video data conforms to the conventional standard, such as MPEG-2, MPEG4-AVC, and VC-1.

Accordingly, the power conservation effect can be improved by switching between the driving frequencies in accordance with the standard to which the video data conforms. Furthermore, when the LSI ex500 or the apparatus including the LSI ex500 is driven using a battery, the battery life can be extended with the power conservation effect.

Embodiment 7

There are cases where a plurality of video data that conforms to different standards, is provided to the devices and systems, such as a television and a mobile phone. In order to enable decoding the plurality of video data that conforms to the different standards, the signal processing unit ex507 of the LSI ex500 needs to conform to the different standards. However, the problems of increase in the scale of the circuit of the LSI ex500 and increase in the cost arise with the individual use of the signal processing units ex507 that conform to the respective standards.

In order to solve the problem, what is conceived is a configuration in which the decoding processing unit for implementing the moving picture decoding method described in each of Embodiments and the decoding processing unit that conforms to the conventional standard, such as MPEG-2, MPEG4-AVC, and VC-1 are partly shared. An example of the configuration is shown as ex900 in FIG. 38A. For example, the moving picture decoding method described in each of Embodiments and the moving picture decoding method that conforms to MPEG4-AVC have, partly in common, the details of processing, such as entropy coding, inverse quantization, deblocking filtering, and motion compensated prediction. The details of processing to be shared probably include use of a decoding processing unit ex902 that conforms to MPEG4-AVC. In contrast, a dedicated decoding processing unit ex901 is probably used for other processing that does not conform to MPEG4-AVC and is unique to the present invention. Since the present invention is characterized by entropy decoding in particular, for example, the dedicated decoding processing unit ex901 is used for entropy decoding. Otherwise, the decoding processing unit is probably shared for one of the inverse quantization, deblocking filtering, and motion compensation, or all of the processing. The decoding processing unit for implementing the moving picture decoding method described in each of Embodiments may be shared for the processing to be shared, and a dedicated decoding processing unit may be used for processing unique to that of MPEG4-AVC.

Furthermore, ex1000 in FIG. 38B shows another example in that processing is partly shared. This example uses a configuration including a dedicated decoding processing unit ex1001 that supports the processing unique to the present invention, a dedicated decoding processing unit ex1002 that supports the processing unique to another conventional standard, and a decoding processing unit ex1003 that supports processing to be shared between the moving picture decoding method in the present invention and the conventional moving picture decoding method. Here, the dedicated decoding processing units ex1001 and ex1002 are not necessarily specialized for the processing of the present invention and the processing of the conventional standard, respectively, and may be the ones capable of implementing general processing. Furthermore, the configuration of this embodiment can be implemented by the LSI ex500.

As such, reducing the scale of the circuit of an LSI and reducing the cost are possible by sharing the decoding processing unit for the processing to be shared between the moving picture decoding method in the present invention and the moving picture decoding method in conformity with the conventional standard.

INDUSTRIAL APPLICABILITY

The image coding method and the image decoding method according to the present invention can be used in various applications such as information display devices and imaging devices with high resolution which include televisions, digital video recorders, car navigation systems, cellular phones, digital cameras, and digital video cameras.

What is claimed is:
1. An image coding method of coding image data, comprising:
frequency-transforming the image data to generate a unit of processing in a frequency domain;
binarizing a coefficient included in the unit of processing, to generate a binary signal;
determining, as a context for the binary signal, one or more contexts common to a plurality of coefficients included in a segment which includes the binarized coefficient, the segment being one of a plurality of segments obtained by dividing the unit of processing;
performing binary arithmetic coding on the binary signal according to probability information corresponding to the determined context; and
updating, based on the binary signal, the probability information corresponding to the determined context,
wherein among the segments, a first segment is smaller than a second segment located in a region higher in frequency than the first segment.

2. The image coding method according to claim 1,
wherein in said binarizing, when the coefficient is a last non-zero coefficient in a predetermined scan order, a signal indicating a position of the coefficient is generated as the binary signal, the coefficient being one of coefficients scanned in the predetermined scan order, and the coefficients being included in the unit of processing.

3. The image coding method according to claim 2,
wherein in said binarizing, when the coefficient is the last non-zero coefficient in the predetermined scan order, a signal indicating the position of the coefficient using two-dimensional coordinate values is generated as the binary signal.

4. An image coding apparatus which codes image data, comprising:
a transform unit configured to frequency-transform the image data to generate a unit of processing in a frequency domain;
a binarization unit configured to binarize a coefficient included in the unit of processing, to generate a binary signal;
a context control unit configured to determine a context for the binary signal; and
a binary arithmetic coding unit configured to perform binary arithmetic coding on the binary signal according to probability information corresponding to the determined context,
wherein said context control unit is configured to
(i) determine, as the context for the binary signal, one or more contexts common to a plurality of coefficients included in a segment which includes the binarized coefficient, the segment being one of a plurality of segments obtained by dividing the unit of processing, and
(ii) update, based on the binary signal, the probability information corresponding to the determined context, and
wherein among the segments, a first segment is smaller than a second segment located in a region higher in frequency than the first segment.

5. An image decoding method of decoding coded image data, comprising:
obtaining, when a decoding target signal included in the coded image data indicates a coefficient included in a unit of processing in a frequency domain, position information indicating a position of the coefficient within the unit of processing;
determining, as a context for the decoding target signal, one or more contexts common to a plurality of coefficients included in a segment which includes the position indicated by the position information, the segment being one of a plurality of segments obtained by dividing the unit of processing;
performing binary arithmetic decoding on the decoding target signal according to probability information corresponding to the determined context, to generate a binary signal; and
converting the binary signal into multi-values; and
updating, based on the binary signal, the probability information corresponding to the determined context,
wherein among the segments, a first segment is smaller than a second segment located in a region higher in frequency than the first segment.

6. The image decoding method according to claim 5,
wherein when the coefficient is a last non-zero coefficient in a predetermined scan order, the decoding target signal is a signal indicating a position of the coefficient, the coefficient being one of coefficients scanned in the predetermined scan order, and the coefficients being included in the unit of processing.

7. The image decoding method according to claim 6, wherein when the coefficient is the last non-zero coefficient in the predetermined scan order, the decoding target signal is a signal indicating the position of the coefficient using two-dimensional coordinate values.

8. An image decoding apparatus which decodes coded image data, comprising:
  a context control unit configured to determine a context for a decoding target signal included in the coded image data;
  a binary arithmetic decoding unit configured to perform arithmetic decoding on the decoding target signal according to probability information corresponding to the determined context, to generate a binary signal; and
  a multivalue unit configured to convert the binary signal into multi-values,
  wherein said context control unit is configured to
  (i) obtain, when the decoding target signal indicates a coefficient included in a unit of processing in a frequency domain, position information indicating a position of the coefficient within the unit of processing,
  (ii) determine, as a context for the decoding target signal, one or more contexts common to a plurality of coefficients included in a segment which includes the position indicated by the position information, the segment being one of a plurality of segments obtained by dividing the unit of processing, and
  (iii) update, based on the binary signal, the probability information corresponding to the determined context, and
  wherein among the segments, a first segment is smaller than a second segment located in a region higher in frequency than the first segment.

9. An image coding and decoding apparatus comprising:
  an image coding apparatus which codes image data to generate the coded image data; and
  an image decoding apparatus which decodes the coded image data,
  wherein said image coding apparatus includes:
  a transform unit configured to frequency-transform the image data to generate a unit of processing in a frequency domain;
  a binarization unit configured to binarize a coefficient included in the unit of processing, to generate a binary signal;
  a first context control unit configured to determine a context for the binary signal; and
  a binary arithmetic coding unit configured to perform binary arithmetic coding on the binary signal according to probability information corresponding to the determined context,
  said first context control unit is configured to
  (i) determine, as the context for the binary signal, one or more contexts common to a plurality of coefficients included in a segment which includes the binarized coefficient, the segment being one of a plurality of segments obtained by dividing the unit of processing, and
  (ii) update, based on the binary signal, the probability information corresponding to the determined context,
  said image decoding apparatus includes:
  a second context control unit configured to determine a context for a decoding target signal included in the coded image data;
  a binary arithmetic decoding unit configured to perform arithmetic decoding on the decoding target signal according to probability information corresponding to the determined context, to generate a binary signal; and
  a multivalue unit configured to convert the binary signal into multi-values,
  said second context control unit is configured to
  (i) obtain, when the decoding target signal indicates a coefficient included in a unit of processing in a frequency domain, position information indicating a position of the coefficient within the unit of processing,
  (ii) determine, as a context for the decoding target signal, one or more contexts common to a plurality of coefficients included in a segment which includes the position indicated by the position information, the segment being one of a plurality of segments obtained by dividing the unit of processing, and
  (iii) update, based on the binary signal, the probability information corresponding to the determined context, and
  among the segments, a first segment is smaller than a second segment located in a region higher in frequency than the first segment.

* * * * *